(12) United States Patent
Jang et al.

(10) Patent No.: US 12,170,528 B2
(45) Date of Patent: Dec. 17, 2024

(54) METHOD AND APPARATUS FOR DATA DECODING IN COMMUNICATION OR BROADCASTING SYSTEM

(71) Applicant: Samsung Electronics Co., Ltd., Suwon-si (KR)

(72) Inventors: Min Jang, Suwon-si (KR); Seho Myung, Suwon-si (KR); Hongsil Jeong, Suwon-si (KR); Yangsoo Kwon, Suwon-si (KR); Jeongho Yeo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/299,250

(22) Filed: Apr. 12, 2023

(65) Prior Publication Data

US 2023/0253984 A1 Aug. 10, 2023

Related U.S. Application Data

(63) Continuation of application No. PCT/KR2021/014415, filed on Oct. 15, 2021.

(30) Foreign Application Priority Data

Oct. 15, 2020 (KR) .................. 10-2020-0133520

(51) Int. Cl.
*H03M 13/11* (2006.01)
(52) U.S. Cl.
CPC ...... *H03M 13/1111* (2013.01); *H03M 13/118* (2013.01)

(58) Field of Classification Search
CPC ............ H03M 13/1111; H03M 13/118; H03M 13/114; H03M 13/616; H03M 13/6393;
(Continued)

(56) References Cited

U.S. PATENT DOCUMENTS 7,979,777 B2 7/2011 Uchikawa et al.
8,504,887 B1 * 8/2013 Varnica ................ H03M 13/114
714/790
(Continued)

FOREIGN PATENT DOCUMENTS

KR 10-2008-0084178 A 9/2008
KR 10-0874958 B1 12/2008
(Continued)

OTHER PUBLICATIONS

SAMSUNG; Flexibility of LDPC—Length, Rate and IR-HARQ; 3GPP TSG RAN WG1 #85; R1-164007; May 23-27, 2016; May 14, 2016; Nanjing, China.
(Continued)

*Primary Examiner* — Thien Nguyen
(74) *Attorney, Agent, or Firm* — Jefferson IP Law, LLP

(57) ABSTRACT

An apparatus and method for efficiently decoding a low-density parity-check (LDPC) code in a communication or broadcasting system are provided. The disclosure relates to performing decoding of an LDPC code by using layered scheduling or a method equivalent thereto, and provides an LDPC decoding apparatus and method for improving decoding performance without increasing decoding complexity by applying appropriate decoding scheduling according to structural or algebraic characteristics of an LDPC code.

11 Claims, 21 Drawing Sheets

(58) Field of Classification Search
CPC ... H03M 13/6516; H03M 13/116; H04L 1/00; H04L 1/0046; H04L 1/0052; H04L 1/0057; H04L 27/206; H04L 27/34
See application file for complete search history.

(56) References Cited

U.S. PATENT DOCUMENTS

| | | |
|---|---|---|
| 2009/0158115 A1 | 6/2009 | Bae |
| 2010/0037121 A1 | 2/2010 | Jin et al. |
| 2010/0100789 A1* | 4/2010 | Yu .................. H04L 1/0625 714/752 |
| 2011/0283158 A1 | 11/2011 | Yang et al. |
| 2011/0307760 A1 | 12/2011 | Pisek et al. |
| 2012/0192039 A1* | 7/2012 | Hannuksela .......... H04L 1/0041 714/E11.131 |
| 2013/0283117 A1 | 10/2013 | Yang et al. |
| 2018/0131391 A1 | 5/2018 | Kudekar et al. |
| 2019/0222229 A1 | 7/2019 | Montorsi et al. |
| 2020/0136648 A1 | 4/2020 | Li et al. |
| 2021/0075442 A1* | 3/2021 | Myung .............. H03M 13/1102 |
| 2021/0167800 A1 | 6/2021 | Shin et al. |

FOREIGN PATENT DOCUMENTS

| | | |
|---|---|---|
| KR | 10-2009-0063922 A | 6/2009 |
| KR | 10-2011-0124659 A | 11/2011 |
| KR | 10-1276845 B1 | 6/2013 |
| KR | 10-2018-0104759 A | 9/2018 |
| WO | 2018/234054 A1 | 12/2018 |
| WO | 2019/191398 A1 | 10/2019 |
| WO | 2020/146990 A1 | 7/2020 |
| WO | 2021/049888 A1 | 3/2021 |

OTHER PUBLICATIONS

International Search Report with English translation dated Feb. 7, 2022; International Appln. No. PCT/KR2021/014415.

* cited by examiner

METHOD AND APPARATUS FOR DATA DECODING IN COMMUNICATION OR BROADCASTING SYSTEM

CROSS-REFERENCE TO RELATED APPLICATION(S)

This application is a continuation application, claiming priority under § 365(c), of an International application No. PCT/KR2021/014415, filed on Oct. 15, 2021, which is based on and claims the benefit of a Korean patent application number 10-2020-0133520, filed on Oct. 15, 2020, in the Korean Intellectual Property Office, the disclosure of which is incorporated by reference herein in its entirety.

BACKGROUND

1. Field

The disclosure relates to a communication or broadcasting system. More particularly, the disclosure relates to a data decoding method and apparatus in a communication or broadcasting system.

2. Description of Related Art

To meet the demand for wireless data traffic having increased since deployment of fourth generation (4G) communication systems, efforts have been made to develop an improved fifth generation (5G) or pre-5G communication system. Therefore, the 5G or pre-5G communication system is also called a "beyond 4G network" communication system or a "post long term evolution (LTE)" system.

The 5G communication system is considered to be implemented in ultrahigh frequency (mmWave) bands (e.g., 60 giga hertz (GHz) bands) so as to accomplish higher data rates. To decrease propagation loss of the radio waves and increase the transmission distance in the ultrahigh frequency bands, beamforming, massive multiple-input multiple-output (massive MIMO), full dimensional MIMO (FD-MIMO), array antenna, analog beam forming, large scale antenna techniques are discussed in 5G communication systems.

In addition, in 5G communication systems, development for system network improvement is under way based on advanced small cells, cloud radio access networks (cloud RANs), ultra-dense networks, device-to-device (D2D) communication, wireless backhaul, moving network, cooperative communication, coordinated multi-points (CoMP), reception-end interference cancellation and the like.

In the 5G system, hybrid FSK and QAM modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have also been developed.

The Internet, which is a human centered connectivity network where humans generate and consume information, is now evolving to the Internet of things (IoT) where distributed entities, such as things, exchange and process information without human intervention. The Internet of everything (IoE), which is a combination of the IoT technology and the big data processing technology through connection with a cloud server, has emerged. As technology elements, such as "sensing technology", "wired/wireless communication and network infrastructure", "service interface technology", and "security technology" have been demanded for IoT implementation, a sensor network, a machine-to-machine (M2M) communication, machine type communication (MTC), and so forth have been recently researched. Such an IoT environment may provide intelligent Internet technology (IT) services that create a new value to human life by collecting and analyzing data generated among connected things. IoT may be applied to a variety of fields including smart home, smart building, smart city, smart car or connected cars, smart grid, health care, smart appliances and advanced medical services through convergence and combination between existing information technology (IT) and various industrial applications.

In line with this, various attempts have been made to apply 5G communication systems to IoT networks. For example, technologies, such as a sensor network, machine type communication (MTC), and machine-to-machine (M2M) communication may be implemented by beamforming, MIMO, and array antennas. Application of a cloud radio access network (cloud RAN) as the above-described big data processing technology may also be considered an example of convergence of the 5G technology with the IoT technology.

In a communication or broadcasting system, the performance of a link may be noticeably degraded by various channel noises, a fading phenomenon, and inter-symbol interference (ISI). Accordingly, in order to implement high-speed digital communication or broadcasting systems requiring a high data throughput and a high level of reliability, such as next-generation mobile communication, digital broadcasting, and mobile Internet, it is required to develop a technology for overcoming the noise, fading, and ISI. As a part of research for overcoming noise, or the like, there has recently been active research on an error-correcting code, as a method for improving the reliability of communication by efficiently restoring distortion of information.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an apparatus and method for efficiently decoding a low-density parity check (LDPC) code in a communication or broadcasting system.

Another aspect of the disclosure relates to performing of decoding of an LDPC code by using layered scheduling or a method equivalent thereto, and is to provide an LDPC decoding apparatus and method for improving decoding performance without increasing decoding complexity, by applying appropriate decoding scheduling according to structural or algebraic characteristics of an LDPC code.

Additional aspects will be set forth in part in the description which follows and, in part, will be apparent from the description, or may be learned by practice of the presented embodiments.

In accordance with an aspect of the disclosure, a method for performing low-density parity-check (LDPC) decoding by a receiver in a communication system is provided. The method includes receiving a signal corresponding to a transport block and a code block, and performing LDPC decoding using the signal and a parity check matrix in order to decode the code block, wherein the performing of the LDPC decoding includes performing decoding using at least a partial area of the parity check matrix according to a predetermined decoding scheduling rule.

In accordance with another aspect of the disclosure, a communication system is provided. The communication system includes a transceiver, and at least one processor configured to receive a signal corresponding to a transport block and a code block, and perform low-density parity check (LDPC) decoding using the signal and a parity check matrix in order to decode the code block, wherein the performing of the LDPC decoding includes performing decoding using at least a partial area of the parity check matrix according to a predetermined decoding scheduling rule.

A receiver for receiving and processing a signal corresponding to a transport block and a code block in a communication system of the disclosure for addressing the above issue performs decoding using at least a part of a parity check matrix of an LDPC code by determining values corresponding to LDPC information word bits, first parity bits, and second parity bits from the received signals, wherein the parity check matrix of the LDPC code includes a first part and a second part, the first part including a first submatrix corresponding to the LDPC information word bits and a second submatrix which corresponds to the first parity bits and includes degree-2 columns and degree-3 columns, and the second part including a third submatrix corresponding to the LDPC information word bits, a fourth submatrix corresponding to the first parity bits, and a fifth submatrix which is an identity matrix and corresponds to the second parity bits.

A decoding method of a receiver of the disclosure for addressing the above issue includes receiving a signal corresponding to an input bit transmitted from a transmitter, identifying the number of input bits based on the signal, identifying a size of a code block based on the number of the input bits, and performing layered decoding based on a parity check matrix corresponding to the size of the code block.

A receiver of the disclosure for addressing the above issue includes a transceiver, and at least one processor configured to receive a signal corresponding to an input bit transmitted from a transmitter, identify the number of input bits based on the signal, identify a size of a code block based on the number of the input bits, and perform layered decoding based on a parity check matrix corresponding to the size of the code block.

A decoding method of a receiver of the disclosure for addressing the above issue includes receiving a signal corresponding to an input bit transmitted from a receiver, identifying the number of input bits, based on the signal, identifying a size of a code block, based on the number of the input bits, and performing layered decoding based on a parity check matrix corresponding to the size of the code block, wherein the layered decoding is performed based on decoding patterns described below.
Pattern-1
[42, 40, 26, 34, 37, 45, 30, 32, 22, 28, 38, 44, 41, 20, 27, 25, 31, 36, 39, 13, 33, 35, 24, 29, 43, 17, 23, 18, 21, 14, 6, 10, 16, 1, 4, 19, 7, 12, 15, 9, 5, 11, 8, 0, 2, 3]
Pattern-2
[22, 37, 40, 31, 24, 29, 20, 12, 27, 25, 28, 35, 38, 41, 32, 23, 34, 39, 17, 16, 36, 21, 33, 18, 15, 9, 14, 30, 11, 19, 6, 7, 8, 26, 10, 13, 1, 4, 5, 0, 2, 3].

A receiver of the disclosure for addressing the above issue includes a transceiver, and at least one processor configured to receive a signal corresponding to an input bit transmitted from a transmitter, identify the number of input bits based on the signal, identify a size of a code block based on the number of the input bits, and perform layered decoding based on a parity check matrix corresponding to the size of the code block.
Pattern-1
[42, 40, 26, 34, 37, 45, 30, 32, 22, 28, 38, 44, 41, 20, 27, 25, 31, 36, 39, 13, 33, 35, 24, 29, 43, 17, 23, 18, 21, 14, 6, 10, 16, 1, 4, 19, 7, 12, 15, 9, 5, 11, 8, 0, 2, 3]
Pattern-2
[22, 37, 40, 31, 24, 29, 20, 12, 27, 25, 28, 35, 38, 41, 32, 23, 34, 39, 17, 16, 36, 21, 33, 18, 15, 9, 14, 30, 11, 19, 6, 7, 8, 26, 10, 13, 1, 4, 5, 0, 2, 3].

In accordance with another aspect of the disclosure, a decoding method in a communication system is provided. The method includes receiving a signal, identifying a size of a code block, based on the number of input bits of the signal, and performing layered decoding based on a parity check matrix corresponding to the size of the code block, wherein the layered decoding is configured so that a higher priority layer is decoded preferentially over a layer other than the higher priority layer.

In accordance with another aspect of the disclosure, an apparatus for decoding in a communication system is provided. The apparatus includes at least one transceiver, and at least one processor coupled with the at least one transceiver, wherein the at least one processor is configured to receive a signal, identify a size of a code block based on the number of input bits of the signal, and perform layered decoding based on a parity check matrix corresponding to the size of the code block, wherein the layered decoding is configured so that a higher priority layer is decoded preferentially over a layer other than the higher priority layer.

In accordance with another aspect of the disclosure, a decoding method of a receiver in a communication system is provided. The method includes receiving a signal corresponding to an input bit transmitted from a receiver, identifying the number of input bits, based on the signal, identifying a size of a code block, based on the number of input bits, and performing layered decoding based on a parity check matrix corresponding to the size of the code block, wherein the layered decoding is performed based on the following decoding order, and respective entries refer to numbers of row blocks of the parity check matrix, [22, 37, 40, 31, 24, 29, 20, 12, 27, 25, 28, 35, 38, 41, 32, 23, 34, 39, 17, 16, 36, 21, 33, 18, 15, 9, 14, 30, 11, 19, 6, 7, 8, 26, 10, 13, 1, 4, 5, 0, 2, 3].

In accordance with another aspect of the disclosure, a receiver in a communication system is provided. The receiver includes a transceiver, and at least one processor configured to receive a signal corresponding to an input bit transmitted from a transmitter, identify the number of input bits based on the signal, identify a size of a code block based on the number of input bits, and perform layered decoding based on a parity check matrix corresponding to the size of the code block, wherein the layered decoding is performed based on the following decoding order, and respective entries refer to numbers of row blocks of the parity check matrix, [22, 37, 40, 31, 24, 29, 20, 12, 27, 25, 28, 35, 38, 41, 32, 23, 34, 39, 17, 16, 36, 21, 33, 18, 15, 9, 14, 30, 11, 19, 6, 7, 8, 26, 10, 13, 1, 4, 5, 0, 2, 3].

In accordance with another aspect of the disclosure, a decoding method of a receiver in a communication system is provided. The method includes receiving a signal corresponding to an input bit transmitted from a receiver, identifying the number of input bits, based on the signal, identifying a size of a code block, based on the number of input bits, and performing layered decoding based on a parity check matrix corresponding to the size of the code block, wherein the layered decoding is performed using a likelihood value generated by performing quadrature phase shift keying (QPSK) demodulation based on the signal, the layered decoding is performed based on the following decoding order, and respective entries refer to numbers of row blocks of the parity check matrix, [37, 40, 29, 27, 25, 22, 31, 28, 36, 33, 32, 34, 24, 41, 38, 21, 20, 35, 18, 12, 23, 39, 17, 30, 16, 15, 9, 14, 7, 11, 19, 6, 8, 26, 13, 10, 1, 4, 5, 0, 2, 3].

In accordance with another aspect of the disclosure, a receiver in a communication system is provided. The receiver includes a transceiver, and at least one processor configured to receive a signal corresponding to an input bit transmitted from a transmitter, identify the number of input bits based on the signal, identify a size of a code block, based on the number of input bits, and perform layered decoding based on a parity check matrix corresponding to the size of the code block, wherein the layered decoding is performed using a likelihood value generated by performing quadrature phase shift keying (QPSK) demodulation based on the signal, the layered decoding is performed based on the following decoding order, and respective entries refer to numbers of row blocks of the parity check matrix, [37, 40, 29, 27, 25, 22, 31, 28, 36, 33, 32, 34, 24, 41, 38, 21, 20, 35, 18, 12, 23, 39, 17, 30, 16, 15, 9, 14, 7, 11, 19, 6, 8, 26, 13, 10, 1, 4, 5, 0, 2, 3].

An apparatus and method according to various embodiments of the disclosure enable support of efficient decoding performance according to LDPC decoding scheduling.

An apparatus and method according to various embodiments of the disclosure can improve LDPC decoding performance, that is, improved error-correcting performance or fast decoding convergence performance, without increasing complexity via an LDPC decoding scheme based on layered scheduling.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
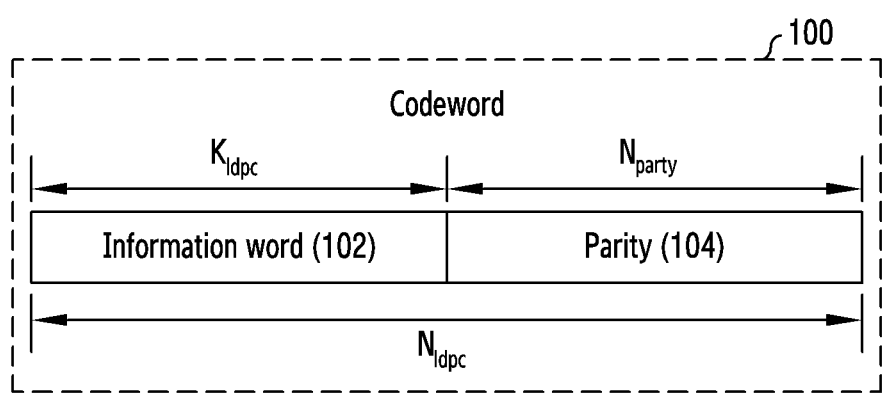
FIG. 1 is a structural diagram of a systematic low-density parity check (LDPC) codeword according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Based on determinations by those skilled in the art, the main gist of the disclosure may be applied to other systems having similar technical backgrounds through some modifications without significantly departing from the scope of the disclosure. For reference, the term "communication system" generally covers the meaning as a broadcast system, but in the disclosure, may also be definitely referred to as a "broadcast system" when the main service of the communication system is a broadcast service.

The advantages and features of the disclosure and ways to achieve them will be apparent by making reference to embodiments as described below in conjunction with the accompanying drawings. However, the disclosure is not limited to the embodiments set forth below, but may be implemented in various different forms. The following embodiments are provided only to completely disclose the disclosure and inform those skilled in the art of the scope of the disclosure, and the disclosure is defined only by the scope of the appended claims. Throughout the specification, the same or like reference numerals designate the same or like elements.

Hereinafter, various embodiments of the disclosure will be described based on an approach of hardware. However, various embodiments of the disclosure include a technology that uses both hardware and software, and thus the various embodiments of the disclosure may not exclude the perspective of software.

In the following description, terms referring to signals (e.g., message, information, preamble, signaling, sequence, and stream), terms referring to resources (e.g., a symbol, a slot, a subframe, a radio frame (RF), a subcarrier, a resource element (RE), a resource block (RB), a bandwidth part (BWP), and occasion), terms for operation states (e.g., a step, an operation, and a procedure), terms referring to data (e.g., information, bit, symbol, and codeword), terms referring to channels, terms referring to control information (e.g., downlink control information (DCI), medium access control control element (MAC CE), and radio access control (RRC) signaling), terms referring to network entities, terms referring to device elements, and the like are illustratively used for the sake of convenience. Therefore, the disclosure is not limited by the terms as used below, and other terms referring to subjects having equivalent technical meanings may be used.

As used in the disclosure, the expression "greater than" or "less than" is used to determine whether a specific condition is satisfied or fulfilled, but this is intended only to illustrate an example and does not exclude "greater than or equal to" or "equal to or less than". A condition indicated by the expression "greater than or equal to" may be replaced with a condition indicated by "greater than", a condition indicated by the expression "equal to or less than" may be replaced with a condition indicated by "less than", and a condition indicated by "greater than and equal to or less than" may be replaced with a condition indicated by "greater than and less than".

In the disclosure, various embodiments will be described using terms employed in some communication standards (e.g., the 3rd generation partnership project (3GPP)), but they are only for the sake of illustration. The embodiments of the disclosure may also be easily applied to other communication systems through modifications.

A low-density parity check (LDPC) code first introduced by Gallager in the 1960s was dismissed for many years due to complexity in realization in those years. However, as a turbo code disclosed by Berrou, Glavieux, and Thitimajshima in 1993 showed performance close to the Shannon channel capacity, much interpretation has been rendered on the performance and characteristic of the turbo code while intensive research is conducted on iterative decoding and graph-based channel coding. With this, as the LDPC code being re-studied in the latter half of the 1990s, the LDPC code has been known to have performance close to the Shannon channel capacity if iterative decoding is applied based on a sum-product algorithm so as to perform decoding on a Tanner graph corresponding to the LDPC code.

The LDPC code is generally defined as a parity check matrix and is expressed using a bipartite graph known as a Tanner graph. In general, the LDPC code is a type of a parity check code, and is named as a "low-density" parity check code due to a characteristic that a ratio (i.e., density) of the number of 1s in a parity check matrix for a very long length is very low. Therefore, in the disclosure, for convenience, techniques proposed based on the LDPC code may be easily extended with respect to general parity check matrix codes.

FIG. 1 is a diagram illustrating a structure of a systematic LDPC codeword according to an embodiment of the disclosure. LDPC encoding may be performed by a transmitter that performs channel coding. LDPC decoding may be performed by a receiver that decodes channel coding. Hereinafter, a transmitter may be referred to as an LDPC encoding device, and a receiver may be referred to as an LDPC decoding device.

Referring to FIG. 1, an LDPC encoding device receives an information word 102 including $K_{ldpc}$ bits or symbols and performs encoding to generate a codeword 100 including $N_{ldpc}$ bits or symbols. For convenience of descriptions, it is assumed that the information word 102 including $K_{ldpc}$ bits is received and the codeword 100 including $N_{ldpc}$ bits is generated. For example, when the information word $I=[i_0, i_1, i_2, \ldots, i_{Kldpc}-1]$ 102 which is $K_{ldpc}$ input bits is LDPC-encoded, the codeword $c=[c_0, c_1, c_2, c_3, \ldots, c_{Nldpc}-1]$ 100 is generated. For example, the information word and the codeword are bit streams including multiple bits, and the information word bits and codeword bits refer to bits constituting the information word and bits constituting the codeword, respectively. In general, if LDPC coded bits include an information word like $C=[c_0, c_1, c_2, \ldots, c_{Nldpc-1}]=[i_0, i_1, i_2, \ldots, i_{Kldpc-1}, p_0, p_1, p_2, \ldots, p_{Nldpc-Kldpc-1}]$, this is referred to as a systematic code. Here, $P=[p_0, p_1, p_2, \ldots, p_{Nldpc-Kldpc-1}]$ is a parity bit 104, and the number of parity bits $N_{parity}$ may be represented as $N_{parity}=N_{ldpc}-K_{ldpc}$.

LDPC encoding is a type of a linear block code, and includes determining of a codeword that satisfies a condition of Equation 1 below. LDPC decoding may be understood as deriving of a codeword (or information word) that satisfies the condition of Equation 1 below.

$$H \cdot c^T = [h_1 h_2 h_3 \ldots h_{N_{ldpc}}-1] \cdot c^T = \Sigma_{i=0}^{Nldpc} c_i \cdot h_i = 0 \qquad \text{Equation 1}$$

In this case, $c=[c_0, c_1, c_2, \ldots, c_{Nldpc}-1]$.

In Equation 1, H is a parity check matrix, c is a codeword, $c_i$ is an i-th bit of the codeword, and $N_{ldpc}$ is a length of the LDPC codeword. Here, $h_i$ denotes an i-th column of the parity check matrix H.

The parity check matrix H includes $N_{ldpc}$ columns equal to the number of bits of the LDPC codeword. Equation 1 indicates that the sum of products of the i-th codeword bit $c_i$ and the i-th column $h_i$ of the parity check matrix is "0", so that the i-th column $h_i$ is related to the i-th codeword bit $c_i$.

Figure 2:
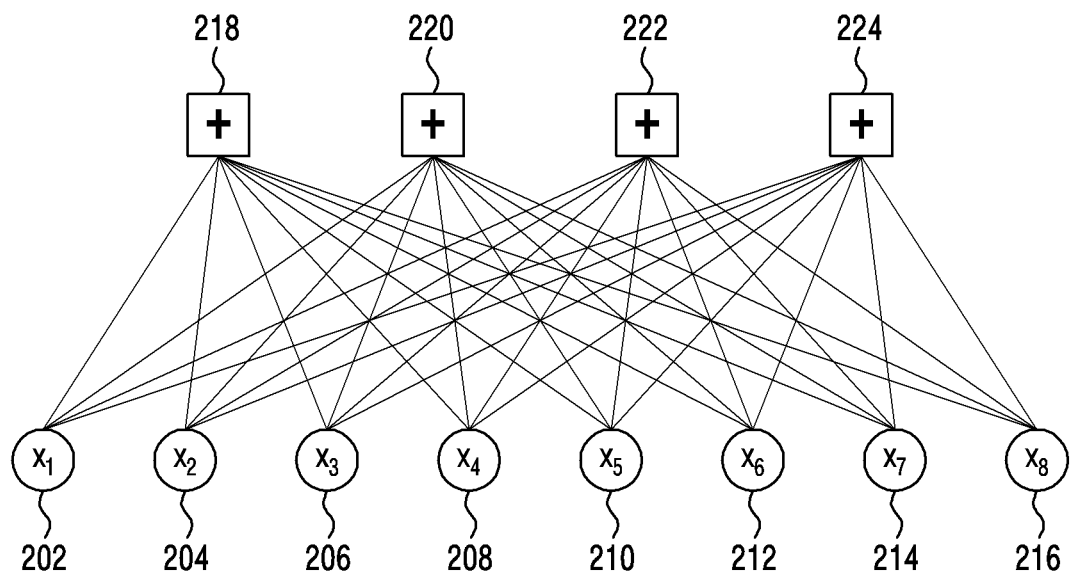
FIG. 2 is a diagram illustrating a method of graph representation of an LDPC code according to an embodiment of the disclosure.

FIG. 2 is a diagram illustrating a method of graph representation of an LDPC code according to an embodiment of the disclosure. A method of graph representation of an LDPC code will be described with reference to FIG. 2.

FIG. 2 is a diagram illustrating an example of a parity check matrix $H_1$ of an LDPC code including 4 rows and 8 columns, and a Tanner graph thereof. Referring to FIG. 2, since the number of columns of the parity check matrix $H_1$ is 8, a codeword having a length of 8 is generated, the code generated via $H_1$ indicates an LDPC code, and each column corresponds to coded 8 bits.

Referring to FIG. 2, the Tanner graph of the LDPC code that is encoded and decoded based on the parity check matrix $H_1$ has eight variable nodes (VNs) which are $x_1$ 202, $x_2$ 204, $x_3$ 206, $x_4$ 208, $x_5$ 210, $x_6$ 212, $x_7$ 214, and $x_8$ 216, and 4 check nodes (CNs) 218, 220, 222, and 224. Here, an i-th column and a j-th row of the parity check matrix $H_1$ of the LDPC code correspond to variable node $x_i$ and a j-th check node, respectively. In addition, a value of 1, i.e., a non-zero value, at a point where the i-th column and the j-th row of the parity check matrix $H_1$ of the LDPC code intersect indicates the presence of an edge connecting variable node $x_i$ and the j-th check node on the Tanner graph as in FIG. 2.

In the Tanner graph of the LDPC code, degrees of variable nodes and check nodes indicate the number of edges connected to respective nodes, and a degree is equal to the number of non-zero entries in a column or row corresponding to a corresponding node in the parity check matrix of the LDPC code. For example, in FIG. 2, degrees of the variable nodes of $x_1$ 202, $x_2$ 204, $x_3$ 206, $x_4$ 208, $x_5$ 210, $x_6$ 212, $x_7$ 214, and $x_8$ 216 are 4, 3, 3, 3, 2, 2, 2, and 2 in order respectively, and degrees of the check nodes 218, 220, 222, and 224 are 6, 5, 5, and 5 in order respectively. In addition, the numbers of non-zero entries in respective columns of the parity check matrix $H_1$ of FIG. 2, which correspond to the variable nodes of FIG. 2, match the aforementioned degrees of 4, 3, 3, 3, 2, 2, 2, and 2 in order, and the numbers of non-zero entries in respective rows of the parity check matrix $H_1$ of FIG. 2, which correspond to the check nodes of FIG. 2, match the aforementioned degrees of 6, 5, 5, and 5 in order. For this reason, a degree of each variable node is also referred to as a column degree or a column weight, and a degree of a check node is also referred to as a row degree or a row weight.

In summary, a degree in the parity check matrix of the LDPC code indicates the number of non-zero entries in a column or a row. In addition, in the parity check matrix, the number of non-zero entries in one column may be expressed as a degree of a corresponding column or a weight of the column, and the number of non-zero entries in one row may be expressed as a degree of a corresponding row or a weight of the row. In addition, entries of the parity check matrix, edges on the Tanner graph, or the like may indicate hardware connection inside a variable node processor (VNU) or a check node processor (CNU) in an LDPC decoder, and may be differently expressed in various ways, such as lines, connection lines, edges, interconnection networks, or shift networks. Such interconnection networks are used to input/output appropriate values for LDPC decoding between node processors of the LDPC decoder.

The LDPC decoding device may receive and obtain a codeword, and LDPC-decode the codeword so as to obtain an information word. In this case, the LDPC-encoded codeword may be decoded using an iterative decoding algorithm based on the sum-product algorithm on the bipartite graph listed in FIG. 2. Here, the sum-product algorithm is a type of a message passing algorithm, and the message passing algorithm represents an algorithm for exchanging messages via edges on a bipartite graph, calculating output messages from messages input to variable nodes or check nodes, so as to perform updating.

Here, the LDPC decoding device may determine a value of an i-th coded bit, based on a message of an i-th variable node. The value of the i-th coded bit may be determined by a hard decision or a soft decision. For example, both a hard decision method and a soft decision method are applicable to LDPC decoding. Therefore, performance of $c_i$ that is an i-th bit of an LDPC codeword corresponds to performance of an i-th variable node of the Tanner graph, and this may be determined according to the number and positions of 1s in the i-th column of the parity check matrix. In other words, performance of $N_{ldpc}$ codeword bits of the codeword may be influenced by the number and positions of is in the parity check matrix, and this may indicate that the performance of the LDPC code is greatly affected by the parity check matrix. Therefore, in order to design an LDPC code with excellent performance, a method of designing a good parity check matrix is required.

For a parity check matrix used in a communication and broadcasting system, a quasi-cyclic (QC) LDPC code (or QC-LDPC code, hereinafter, QC-LDPC code) using a quasi-cyclic type parity check matrix is generally used for ease of implementation.

The QC-LDPC code has a parity check matrix including circulant permutation matrices or a zero matrix (0-matrix) in the form of a small square matrix. In this case, a permutation matrix refers to a matrix in which each row or column includes only one 1 and all other entries thereof are 0. In addition, a circulant permutation matrix refers to a matrix obtained by circularly shifting each entry of an identity matrix to the right or left.

Hereinafter, the QC-LDPC code will be described below.

First, as in Equation 2, circulant permutation matrix $P=(P_{i,j})$ having a size of L×L is defined. Here, $P_{i,j}$ indicates an entry in an i-th row and an j-th column in matrix P ($0 \leq i, j < L$).

$$p_{i,j} = \begin{cases} 1 & \text{if } i+1 \equiv j \bmod L \\ 0 & \text{otherwise} \end{cases} \quad \text{Equation 2}$$

For permutation matrix P defined as above, it may be seen that $P^i (0 \leq i < L)$ is a circulant permutation matrix in the form in which each entry of an identity matrix having a size of L×L is circularly shifted to the right by i times.

Parity check matrix H of the QC-LDPC code may be expressed in the form of Equation 3 below.

$$H = \begin{bmatrix} P^{a_{11}} & P^{a_{12}} & \cdots & P^{a_{1n}} \\ P^{a_{21}} & P^{a_{22}} & \cdots & P^{a_{2n}} \\ \vdots & \vdots & \ddots & \vdots \\ P^{a_{m1}} & P^{a_{m2}} & \cdots & P^{a_{mn}} \end{bmatrix} \quad \text{Equation 3}$$

If $P^{-1}$ is defined as a 0-matrix having a size of L×L, each exponent $a_{i,j}$ of the 0-matrix or circulant permutation matrix in Equation 3 has one value of $\{-1, 0, 1, 2, \ldots, L-1\}$. In addition, since parity check matrix H of Equation 3 has n column blocks and m row blocks, it may be seen that parity check matrix H has a size of mL×nL.

Figure 3A:
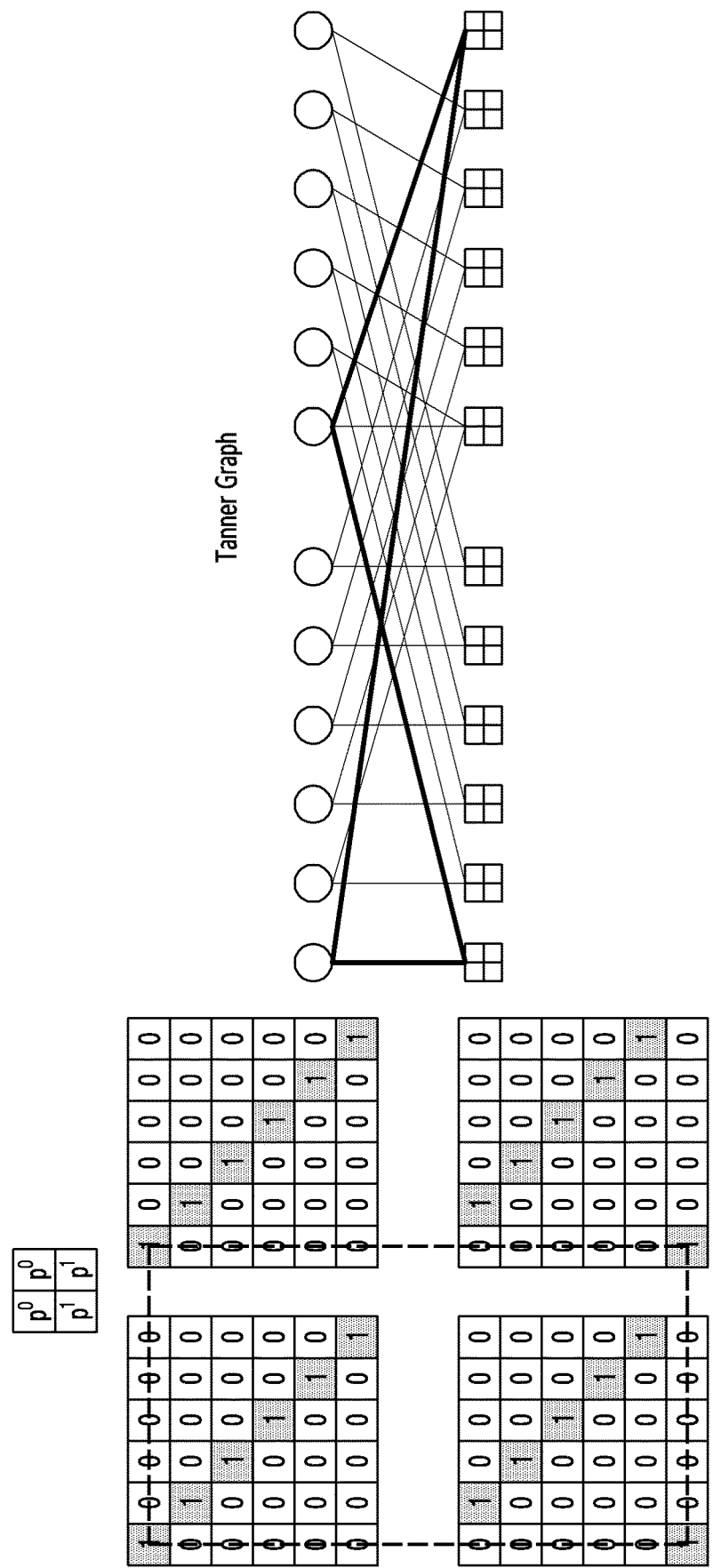
FIGS. 3A and 3B are diagrams for illustrating a cycle characteristic of a quasi-cyclic (QC)-LDPC code according to various embodiments of the disclosure.
Figure 3B:
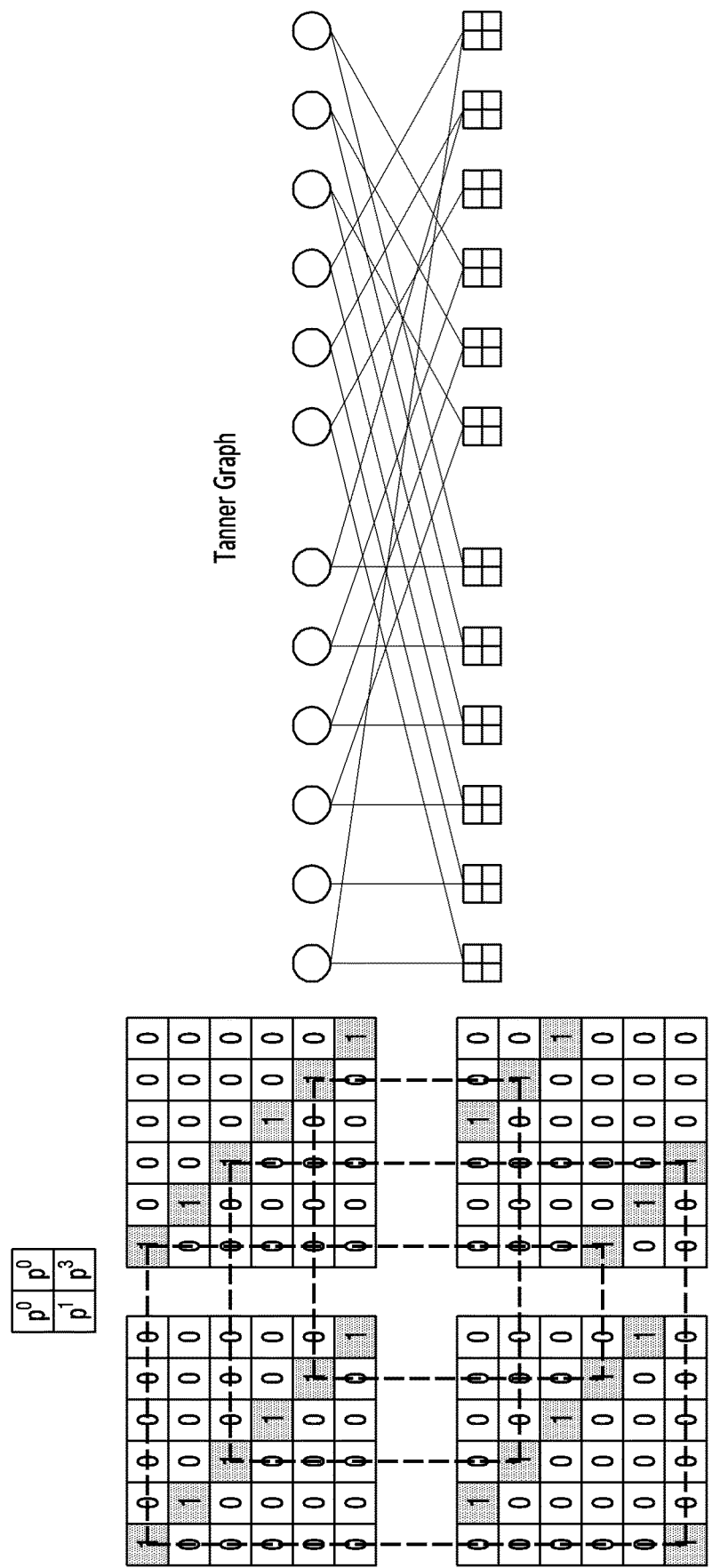

FIGS. 3A and 3B are diagrams for illustrating a cycle characteristic of a quasi-cyclic (QC)-LDPC code according to various embodiments of the disclosure. Referring to FIGS. 3A and 3B, it is identified that matrix H having a size of 12×12 may be simplified to have a size of 2×2 having entries of permutation matrix P as shown in Equation 3.

If the parity check matrix of Equation 3 has a full rank, it is obvious that a size of information word bits of the QC-LDPC code corresponding to the parity check matrix is (n−m)L. For convenience, n-m column blocks corresponding to information word bits are referred to as information word column blocks, and m column blocks corresponding to the remaining parity bits are referred to as parity column blocks. If the parity check matrix of Equation 3 does not have a full rank, the information word bits are greater than (n−m)L.

In general, a binary matrix having a size of m×n, which is obtained by replacing each circulant permutation matrix and 0-matrix in the parity check matrix of Equation 3 with 1 and 0 respectively, is referred to as a mother matrix or base matrix M(H) of parity check matrix H. An integer matrix having a size of m×n, which is obtained by selecting an exponent of each circulant permutation matrix or 0-matrix, as in Equation 4, may be referred to as exponent matrix E(H) of parity check matrix H.

$$E(H) = \begin{bmatrix} a_{11} & a_{12} & \cdots & a_{1n} \\ a_{21} & a_{22} & \cdots & a_{2n} \\ \vdots & \vdots & \ddots & \vdots \\ a_{m1} & a_{m2} & \cdots & a_{mn} \end{bmatrix}$$ Equation 4

Consequently, one integer included in the exponent matrix corresponds to a circulant permutation matrix or zero-matrix in the parity check matrix, and therefore the exponent matrix may be expressed as a sequence including integers for convenience of description. In general, a parity check matrix can be expressed not only as an exponent matrix but also as various sequences which may express the same algebraic characteristics. In the disclosure, for convenience of description, a parity check matrix is expressed as an exponent matrix or a sequence indicating a position of 1 in a parity check matrix. However, since there are various methods of describing a sequence, by which a position of 1 or 0 included in a parity check matrix can be identified, the method of expression is not limited to those described in the specification, and the same may be expressed as various sequences showing the same algebraic effect. In order to distinguish the sequence from another sequence, the sequence may be referred to in various ways, such as an LDPC sequence, an LDPC code sequence, an LDPC matrix sequence, or a parity check matrix sequence.

In addition, although a transceiver in a device may directly generate a parity check matrix to perform LDPC encoding and decoding, LDPC encoding and decoding may be performed using a sequence or an exponent matrix showing the same algebraic effect as the parity check matrix, according to implementation characteristics. Therefore, it is to be noted that encoding and decoding using a parity check matrix is illustrated in the disclosure for convenience of description, but, on an actual device, encoding and decoding can be implemented via various methods by which the same effect as the parity check matrix is obtainable. In other words, embodiments are described such that encoding and decoding are performed using a parity check matrix, but this may include using other information (e.g., a matrix or sequence including corresponding information) which can replace the parity check matrix, in addition to directly generating the parity check matrix.

For reference, the same algebraic effect indicates that at least two different expressions can be described to be completely identical to each other or can be converted logically or mathematically.

In the disclosure, for convenience of description, a case in which there is one circulant permutation matrix corresponding to one block has been described, but the same disclosure is also applicable to a case in which multiple circulant permutation matrices are included in one block. For example, when the sum of two circulant permutation matrices $P^{\alpha_{ij}^{(1)}}$, $P^{\alpha_{ij}^{(2)}}$ is included in a position of one i-th row block and i-th column block as in Equation 5 below, an exponent matrix thereof may be expressed as in Equation 6. It may be understood based on Equation 6 that the matrix has two integers corresponding to the i-th row and j-th column, corresponding to the row block and column block including the sum of the multiple circulant permutation matrices.

$$H = \begin{bmatrix} \ddots & & \cdots \\ & P^{\alpha_{ij}^{(1)}} + P^{\alpha_{ij}^{(2)}} & \\ \cdots & & \ddots \end{bmatrix}$$ Equation 5

$$E(H) = \begin{bmatrix} \ddots & & \cdots \\ & a_{ij}^{(1)} + a_{ij}^{(2)} & \\ \cdots & & \ddots \end{bmatrix}$$ Equation 6

As in the embodiment, for a QC-LDPC code in general, multiple circulant permutation matrices may correspond to a single row block and a single column block in a parity check matrix, but only a case in which one circulant permutation matrix corresponds to one block is described in the disclosure for convenience of description. However, embodiments of the disclosure are not limited thereto. For reference, a matrix having a size of L×L, in which multiple circulant permutation matrices overlap a single row block and a single column block, is referred to as a circulant matrix or a circulant.

The mother matrix or base matrix for the parity check matrix and exponent matrix in Equations 5 and 6 refers to a binary matrix obtained by replacing each circulant permutation matrix and 0-matrix with 1 and 0 respectively, similarly to the definition used in Equation 3, wherein the sum of multiple circulant permutation matrices included in one block (i.e., circulant matrix) is also simply replaced with 1.

Since performance of an LDPC code is determined by a parity check matrix, it is required to design a parity check matrix for an LDPC code having excellent performance. In addition, an LDPC encoding or decoding method capable of supporting various input lengths and code rates is also required.

Lifting refers to a method used to generate an LDPC codeword or generate a parity check matrix of various lengths from a given exponent matrix, as well as to efficiently design a QC-LDPC code. For example, the lifting refers to a method applied to efficiently design a very large parity check matrix by configuring an L value for determination of a size of a circulant permutation matrix or 0-matrix from a given small mother matrix according to a specific rule, or a method of generating a parity check matrix of various lengths or generating an LDPC codeword by applying an L value appropriate for a given exponent matrix or a sequence corresponding thereto. According to an embodiment, the appropriate L value may refer to Z values of embodiments to be described later in the disclosure.

An existing lifting method and characteristics of a QC-LDPC code designed via such lifting are described briefly with reference to the following reference document [Myung 2006].

Reference [Myung2006]

S. Myung, K. Yang, and Y. Kim, "Lifting Methods for Quasi-Cyclic LDPC Codes", IEEE Communications Letters. vol. 10, pp. 489-491, June 2006.

First, it is assumed that, when LDPC code $C_0$ is given, S QC-LDPC codes to be designed via the lifting method are $C_1, \ldots, C_S$, and a value corresponding to a size of a row block and column block of a parity check matrix of each QC-LDPC code is $L_k$. In this case, $C_0$ corresponds to a smallest LDPC code having a mother matrix of codes $C_1, \ldots, C_S$ as a parity check matrix, and value $L_0$ corresponding to the size of the row block and column block is 1. For convenience of description, parity check matrix $H_k$ of each code $C_k$ has exponent matrix $E(H_k)=(e_{i,j}^{(k)})$ having a size of m×n, and each exponent $e_{i,j}^{(k)}$ is selected to be one of values $\{-1, 0, 1, 2, \ldots, L_k-1\}$.

The existing lifting method includes operations, such as $C_0 \to C_1 \to \ldots \to C_S$, and satisfies a condition, such as $L_{k+1}=q_{k+1}L_k$ ($q_{k+1}$ is a positive integer, where k=0, 1, . . . , S−1). In addition, due to characteristics of the lifting, if only parity check matrix $H_S$ of $C_S$ is stored, all of QC-LDPC codes $C_0, C_1, \ldots, C_S$ may be expressed using Equation 7 below according to a lifting scheme.

$$E(H_k) \equiv \left\lfloor \frac{L_k}{L_s} E(H_s) \right\rfloor \quad \text{Equation 7}$$

or $$E(H_k) \equiv E(H_s) \bmod L_k \quad \text{Equation 8}$$

As described above, the method of generating small codes $C_i$ (i=k−1, k−2, . . . 1, 0) from large code $C_k$ by using an appropriate method as in Equation 7 or Equation 8 as well as the method of designing larger QC-LDPC codes $C_1, \ldots, C_S$ and the like from $C_0$ is referred to as lifting.

According to the lifting scheme in Equation 7 or Equation 8, $L_k$ corresponding to the size of the row block or column block in the parity check matrix of each QC-LDPC code $C_k$ has a multiple relation with each other, and an exponent matrix is also determined by a specific scheme. This existing lifting scheme improves algebraic or graph characteristics of each parity check matrix designed via lifting, and thus facilitates designing of a QC-LDPC code having improved error floor characteristics.

In general, lifting may be used for LDPC encoding and decoding by changing values of entries of the exponent matrix of Equation 4 with respect to various L values. For example, when the exponent matrix of Equation 4 is $E=(a_{i,j})$, and an exponent matrix changed according to value L is $E_L=(a_{i,j}^{(L)})$, a conversion equation as in Equation 9 below may normally be applied.

$$a_{i,j}^{(L)} = \begin{cases} a_{i,j} & a_{i,j} < 0 \\ f(a_{i,j}, L) & a_{i,j} \geq 0 \end{cases} \quad \text{Equation 9}$$

or $$a_{i,j}^{(L)} = \begin{cases} a_{i,j} & a_{i,j} < 0 \\ f(a_{i,j}, L) & a_{i,j} > 0 \end{cases}$$

In Equation 9, f(x, L) may be defined in various types. For example, definitions, such as Equation 10 below may be used for f(x, L).

$$f(x, L) = \bmod\left(x, 2^{\lfloor \log_2 L \rfloor}\right) \quad \text{Equation 10}$$

or $$f(x, L) = \left\lfloor \frac{x}{2^{D-\lfloor \log_2 L \rfloor}} \right\rfloor$$

or $$f(x, L) = \left\lfloor \frac{L}{D} x \right\rfloor$$

In Equation 10 above, mod(a,b) refers to a modulo-b operation for a, and D refers to a constant which is a predefined positive integer.

For reference, in the conversion equation of Equation 9, a criterion for applying conversion equation f is shown as 0 for convenience, but a value of the criterion may be differently configured depending on a block size L value to be supported. In addition, in a case of excluding an exponent corresponding to matrix 0 from the beginning in the expression of the exponential matrix or the LDPC sequence, a rule for values with exponents smaller than 0 may be omitted in Equation 9.

As another embodiment of the disclosure, a case of applying LDPC encoding and decoding based on multiple exponent matrices or LDPC sequences on one predetermined base matrix will be described. For example, one base matrix is fixed, exponent matrices, sequences, or the like of an LDPC code defined on the base matrix are determined, and lifting is applied according to a block size included in each block size group from the exponent matrices or the sequences, so that variable-length LDPC encoding and decoding are performed. In this scheme, entries or numbers constituting the exponent matrices or LDPC sequences of the LDPC code may have different values, but positions of the corresponding entries or numbers match exactly on the base matrix. In this way, the exponent matrices or the LDPC sequences respectively refer to exponents of a circulant permutation matrix, that is, a kind of circular shift values for bits, wherein it is easy to identify positions of bits corresponding to the corresponding circulant permutation matrix by configuring the same position for all the entries or numbers. For reference, since an exponent matrix or an LDPC sequence corresponds to a cyclic shift value of bits corresponding to block size Z, the exponent matrix may be variously referred to as a shift matrix, a shift value matrix, a shift sequence, a shift value sequence, or the like.

Block size Z to be supported is classified into multiple block size groups (or sets) as in Equation 11 below. It is noted that block size Z is a value corresponding to size Z×Z of a circulant matrix or a circulant permutation matrix in a parity check matrix of the LDPC code.

Z1={2,4,8,16,32,64,128,256}

Z2={3,6,12,24,48,96,192,384}

Z3={5,10,20,40,80,160,320}

Z4={7,14,28,56,112,224}

Z5={9,18,36,72,144,288}

Z6={11,22,44,88,176,352}

Z7={13,26,52,104,208}

Z8={15,30,60,120,240}  Equation 11

Equation 11 is only an example, and embodiments may be extended via various modifications. According to an embodiment, all block size Z values included in the block size group of Equation 11 may be used. In addition, according to an embodiment, a block size value included in an appropriate subset may be used as in Equation 12 below. According to an embodiment, values appropriate for the block size group (or set) of Equation 11 or Equation 12 may be added or excluded for use.

Z1'={8,16,32,64,128,256}

Z2'={12,24,48,96,192,384}

Z3'={10,20,40,80,160,320}

Z4'={7,14,28,56,112,224}

Z5'={18,36,72,144,288}

Z6'={11,22,44,88,176,352}

Z7'={26,52,104,208}

Z8'={15,30,60,120,240}  Equation 12

The block size groups of Equations 11 and 12 have characteristics in which not only the block size groups have different granularities but also all ratios between adjacent block sizes have the same integer value. In other words, block sizes included in one group are divisors or multiples to each other. When each exponent matrix corresponding to a p-th group (p=1, 2, ..., 8) is $E_P=(e_{i,j}^{(p)})$, and an exponent matrix corresponding to a Z value included in the p-th group is $E_P(Z)=(e_{i,j}(Z))$, the conversion method of the sequence as in Equation 9 is applied using $f_p(x,Z)=x(\bmod Z)$. For example, if block size Z is determined to be Z=28, each entry $e_{i,j}(28)$ in the exponent matrix (or LDPC sequence) of $E_4(28)=E_4=(e_{i,j}(28))$ for Z=28 may be obtained as in Equation 13 below, with respect to an exponent matrix (or LDPC sequence) of $E_4=(e_{i,j}(4))$ corresponding to a fourth block size group including Z=28.

$$e_{i,j}(28) = \begin{cases} e_{i,j}^{(4)} & e_{i,j}^{(4)} \leq 0 \\ e_{i,j}^{(4)}(\bmod 28) & e_{i,j}^{(4)} > 0 \end{cases}$$  Equation 13 or $$e_{i,j}(28) = \begin{cases} e_{i,j}^{(4)} & e_{i,j}^{(4)} < 0 \\ e_{i,j}^{(4)}(\bmod 28) & e_{i,j}^{(4)} \geq 0 \end{cases}$$

The conversion as in Equation 13 may also be simply expressed as shown in Equation 14 below.

$E_p(Z)=E_p(\bmod Z), Z \in Z_p$  Equation 14

For reference, descriptions have been provided in the above on the assumption that the lifting or exponent matrix conversion scheme according to Equations 9, 10, or 11 to 14 is applied to all the exponent matrix corresponding to the parity check matrix, but this conversion scheme is also partially applicable to the exponent matrix.

In general, a submatrix corresponding to a parity bit of a parity check matrix often has a special structure for efficient encoding. In this case, a change may occur in the encoding method or a degree of complexity due to lifting. Accordingly, in order to maintain the same encoding method or degree of complexity, lifting may not be applied to a part of an exponent matrix for a submatrix corresponding to a parity in the parity check matrix, or lifting different from a lifting scheme applied to an exponent matrix for a submatrix corresponding to an information word bit may be applied. In other words, a lifting scheme applied to a sequence corresponding to the information word bit within the exponent matrix and a lifting scheme applied to a sequence corresponding to the parity bit may be configured differently, and in some cases, no lifting may be applied to a part or all of the sequence corresponding to the parity bit so that a fixed value is used without sequence conversion.

Figure 4:
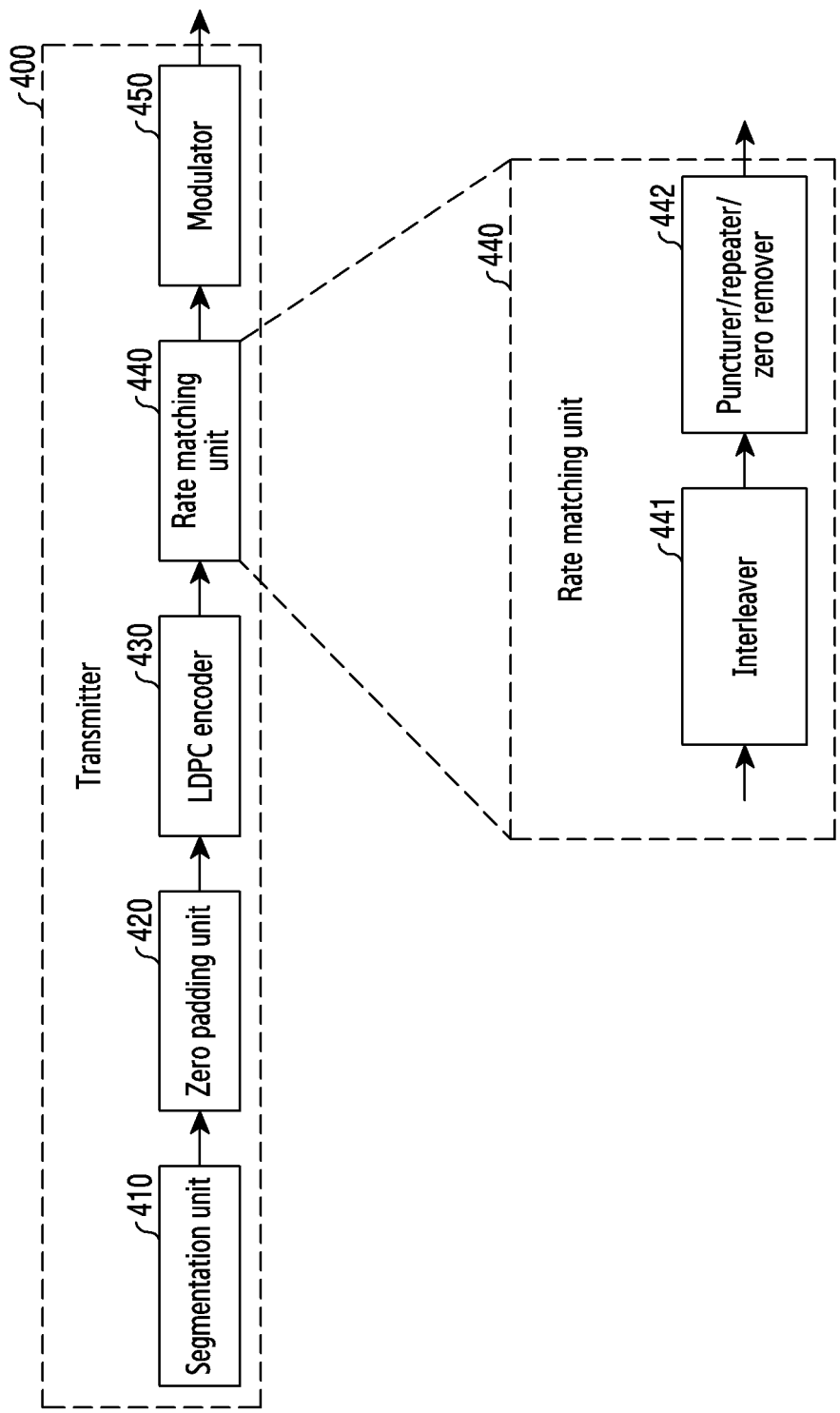
FIG. 4 is a block diagram for a configuration of a transmitter according to an embodiment of the disclosure.

FIG. 4 is a block diagram for a configuration of a transmitter according to an embodiment of the disclosure.

Referring to FIG. 4, a transmitter 400 may include, in order to process variable-length input bits, a segmentation unit 410, a zero padding unit 420, an LDPC encoder 430, a rate matching unit 440, a modulator 450, and the like. The rate matching unit 440 may include an interleaver 441, a puncturer/repeater/zero remover 442, and the like.

Here, the components illustrated in FIG. 4 are components which encode and modulate variable-length input bits, which is merely an example. In some cases, some of the components illustrated in FIG. 4 may be omitted or modified, and another component may be further added. As an example of a modulation scheme, one of schemes including a quadrature phase shift keying (QPSK) scheme, a quadrature amplitude modulation (QAM) scheme, such as 16-QAM, 64-QAM, 256-QAM, and 1024-QAM, a phase shift keying (PSK) scheme, an amplitude and PSK (APSK) scheme, or the like is possible.

The transmitter 400 may determine a necessary parameter (e.g., an input bit length, a modulation and code rate (ModCod), a parameter for zero padding (or shortening), a code rate of an LDPC code, an information word or codeword length, a parameter for interleaving, and parameters and modulation schemes for repetition and puncturing, or the like), encode an input bit based on the determined parameter, and transmit the encoded input bit to a receiver 500.

Since the number of input bits is variable, if the number of input bits is greater than a preconfigured value, the input bits may be segmented to have a length shorter than or equal to the preconfigured value. In addition, each segmented block may correspond to one LDPC-coded block. If the number of the input bits is less than or equal to the preconfigured value, segmentation is not performed. The input bits may correspond to one LDPC-coded block.

The transmitter 400 may pre-store various parameters used for encoding, interleaving, and modulation. Here, parameters used for encoding may include at least one of a code rate of an LDPC code, an input bit, information word, or codeword length, and information on a parity check matrix. Parameters used for interleaving may include information on an interleaving rule, and parameters used for modulation may include information on a modulation scheme. In addition, information on puncturing may include a puncturing length. In addition, information on repetition may include a repetition length. Information on the parity check matrix may include an exponent value of a circulant matrix if the parity matrix proposed in the disclosure is used. Respective components constituting the transmitter 400 may perform operations using the parameters.

Functional components for channel encoding have been described in FIG. 4, but, in some cases, the transmitter 400 may further include components (not illustrated) for controlling an operation of the transmitter 400.

According to an embodiment, the transmitter 400 may further include a communication unit. The communication unit performs functions to transmit or receive a signal via a radio channel. For example, the communication unit performs a function of conversion between a baseband signal and a bitstream according to a physical layer specification of the system. For example, when transmitting data, the communication unit generates complex symbols by encoding and modulating a transmitted bitstream. In addition, when receiving data, the communication unit restores a received bitstream via demodulation and decoding of a baseband signal. The communication unit up-converts a baseband signal to a radio frequency (RF) band signal, transmits the up-converted RF band signal via an antenna, and then down-converts the RF band signal received via the antenna to a baseband signal. According to various embodiments, the transmitter 400 may transmit an LDPC-coded signal to a receiver 500 to be described later.

To this end, the communication unit may include a transmission filter, a reception filter, an amplifier, a mixer, an oscillator, a digital-to-analog converter (DAC), an analog-to-digital converter (ADC), and the like. The communication unit may include multiple transmission/reception paths. Furthermore, the communication unit may include at least one antenna array including multiple antenna elements. In terms of hardware, the communication unit may include a digital unit and an analog unit, wherein the analog unit includes multiple sub-units according to an operation power, an operation frequency, and the like.

The communication unit may transmit or receive a signal. To this end, the communication unit may include at least one transceiver. For example, the communication unit may transmit a synchronization signal, a reference signal, system information, a message, control information, data, or the like. The communication unit may perform beamforming.

The communication unit transmits and receives a signal as described above. Accordingly, all or a part of the communication unit may be referred to as "transmitter", "receiver", or "transceiver". In the following description, transmission and reception performed via a radio channel are used in a sense including processing performed as described above by the communication unit.

According to an embodiment, the transmitter 400 may further include a storage unit. The storage unit may store the aforementioned parameters and data, such as, a default program, an application program, and configuration information for operations of the transmitter 400. The storage unit may include a memory. The storage unit may include a volatile memory, a nonvolatile memory, or a combination of a volatile memory and a nonvolatile memory. In addition, the storage unit may provide stored data in response to a request of a controller.

According to an embodiment, the transmitter 400 may further include a controller. The controller may control overall operations of the transmitter 400. For example, the controller transmits and receives a signal via the communication unit. In addition, the controller records data in the storage unit and reads the data. The controller may perform functions of a protocol stack required by a communication standard. To this end, the controller may include at least one processor. The described operations for channel encoding correspond to stored instruction sets or codes, and may be instructions/codes which are at least temporarily residing in the controller, a storage space storing instructions/codes, or a part of circuitry constituting the controller. According to various embodiments, the controller may control the transmitter to perform operations according to various embodiments described below.

Figure 5:
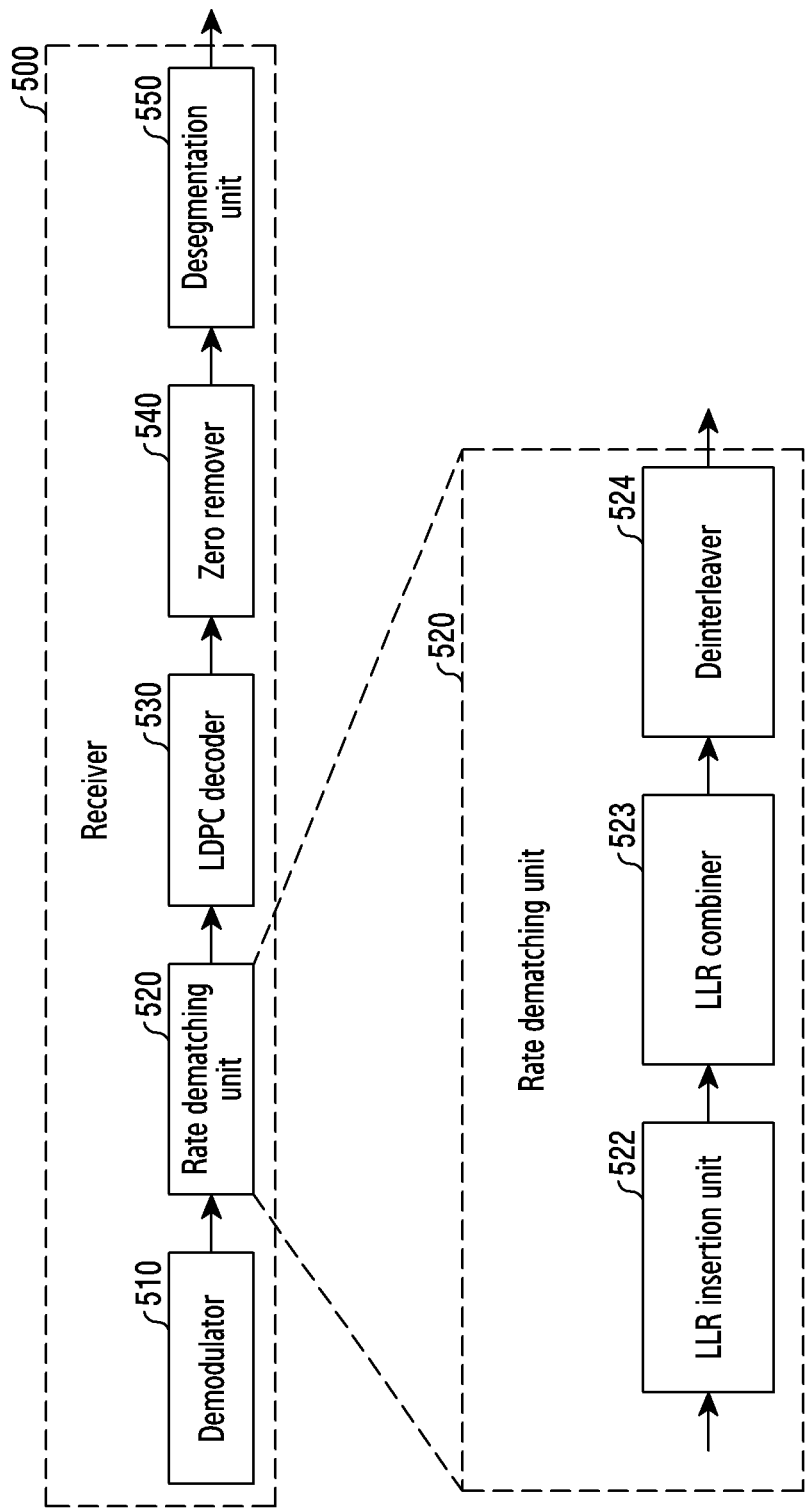
FIG. 5 is a block diagram for a configuration of a receiver according to an embodiment of the disclosure.

FIG. 5 is a block diagram for a configuration of a receiver according to an embodiment of the disclosure.

Referring to FIG. 5, a receiver 500 may include, in order to process variable-length information, a demodulator 510, a rate dematching unit 520, an LDPC decoder 530, a zero remover 540, a desegmentation unit 550, and the like. The rate dematching unit 520 may include a log likelihood ratio (LLR) insertion unit 522, an LLR combiner 523, a deinterleaver 524, and the like. Names of the LLR insertion unit 522, the LLR combiner 523, and the like may vary depending on values used for decoding. For example, when decoding is performed based on values, such as a likelihood ratio (LR) instead of an LLR, names may be determined based on values used for decoding, such as an LR insertion unit and an LR combiner, and operations may be slightly different based on the values.

Operations of the demodulator 510 may be subdivided into several procedures in some cases. For example, operations of the demodulator 510 may be subdivided into a procedure of obtaining a channel estimation result based on a received signal and a procedure of determining values (e.g., LLR, LR, or equivalent values thereof, or the like) required for forward error control (FEC) decoding, which correspond to codeword bits transmitted from a symbol or a signal demodulated based on the channel estimation result. In this case, an operation in each demodulation unit may be represented by subdivision into each channel measurement block, symbol-to-LLR conversion block, and the like. Various subdivisions are certainly possible depending on a structure of the system.

Here, the components illustrated in FIG. 5 are components performing functions corresponding to the components illustrated in FIG. 5, which is merely an example. Further, some of the components may be omitted or modified in some cases, and another component may be further added.

A parity check matrix in the disclosure may be read using a memory, may be given in advance by the transmitter or the receiver, or may be directly generated by the transmitter or the receiver. In addition, the transmitter may store or generate a sequence or exponent matrix corresponding to the parity check matrix and apply the same to encoding. Likewise, it is certain that the receiver may store or generate a sequence or exponent matrix corresponding to the parity check matrix and apply the same to decoding.

Hereinafter, a detailed description of a receiver operation will be provided based on FIG. 5. The demodulator 510 demodulates a signal received from the transmitter 400. Specifically, the demodulator 510 is a component corresponding to the modulator 450 of the transmitter 400, and may receive and demodulate a signal transmitted from the transmitter 400 so as to generate values (e.g., LLR, LR, or equivalent values) corresponding to bits transmitted by the transmitter 400. To this end, the receiver 500 may pre-store information on a modulation scheme, modulated by the transmitter 400 according to a mode. Accordingly, the demodulator 510 may demodulate a signal received from the transmitter 400 according to the mode so as to generate values corresponding to LDPC codeword bits.

An LR value refers to a ratio between a likelihood that a bit transmitted by the transmitter 400 is 0 and a likelihood that the same is 1, and an LLR value may be represented by a value obtained by taking a log of the ratio between the likelihood that the bit transmitted by the transmitter 400 is 0 and the likelihood that the same is 1. Alternatively, a hard decision may be made for an LR or an LLR value according to the likelihood, the likelihood ratio, or the log value for the likelihood ratio so as to be indicated by the bit value itself, or may be indicated by a predefined representative value according to a range to which the likelihood, the likelihood ratio, or the log value for the likelihood ratio belongs. An example of a method for determining the predefined representative value according to the range to which the likelihood, the likelihood ratio, or the log value for the likelihood ratio belongs includes a method based on quantization. In addition, various other values corresponding to the likelihood, the likelihood ratio, or the log value for the likelihood ratio may be used.

In the disclosure, for convenience of description, a reception method and device operations are described using an LLR value as an example of a likelihood value for determination, but the likelihood value is not necessarily limited thereto.

The demodulator 510 includes a function of performing multiplexing (not illustrated) on an LLR value. Specifically, a mux (not illustrated) is a component corresponding to a bit demux (not illustrated) of the transmitter 400 and may perform an operation corresponding to the bit demux (not illustrated). To this end, the receiver 500 may pre-store information on parameters used for demultiplexing and block interleaving by the transmitter 400. Accordingly, with respect to an LLR value corresponding to a cell word (information indicating a reception symbol for the LDPC codeword), the mux (not illustrated) may reversely perform demultiplexing and block interleaving performed by the bit demux (not illustrated), so as to multiplex the LLR value corresponding to the cell word in bit units.

The rate dematching unit 520 may additionally insert an LLR value into LLR values output from the demodulator 510. In this case, the rate dematching unit 520 may insert pre-arranged LLR values between the LLR values output from the demodulator 510. Specifically, the rate dematching unit 520 is a component corresponding to the rate matching unit 440 of the transmitter 400, and may perform operations corresponding to the interleaver 441 and the puncturer/repeater/zero remover 442.

The rate dematching unit 520 performs deinterleaving to correspond to the interleaver 441 of the transmitter. In output values of the deinterleaver 524, the LLR insertion unit 522 may insert an LLR value corresponding to zero bits in a position at which zero bits have been padded in an LDPC codeword. In this case, the LLR value corresponding to the padded zero bits, i.e., shortened zero bits, may be $\infty$ or $-\infty$. However, $\infty$ or $-\infty$ is a theoretical value, and may substantially be a maximum value or minimum value of the LLR value used by the receiver 500.

To this end, the receiver 500 may pre-store information on parameters used for padding zero bits by the transmitter 400. Accordingly, the rate dematching unit 520 may determine the position at which zero bits have been padded in the LDPC codeword, and may insert an LLR value corresponding to shortened zero bits in the corresponding position.

In addition, the LLR insertion unit 522 of the rate dematching unit 520 may insert an LLR value corresponding to punctured bits in positions of the punctured bits in the LDPC codeword. In this case, the LLR value corresponding to the punctured bits may be 0 or another predetermined value. In general, when degree-1 parity bits are punctured, there is no effect on performance improvement in LDPC decoding, so that the bits may not be used in LDPC decoding without LLR insertion in some or all of corresponding puncturing positions. However, in order to increase efficiency of LDPC decoding based on parallel processing, the LLR insertion unit 522 may insert a predetermined LLR value in positions corresponding to some or all of degree-1 puncturing bits regardless of decoding performance improvement. To this end, the receiver 500 may pre-store information on parameters used for puncturing by the transmitter 400. Accordingly, the LLR insertion unit 522 may insert, in positions at which LDPC information word bits or parity bits are punctured, an LLR value (e.g., LLR=0) corresponding thereto. However, this procedure may be omitted for positions of some punctured parity bits.

The LLR combiner 523 may combine, i.e., add up, LLR values output from the LLR insertion unit 522 and the demodulator 510. Specifically, the LLR combiner 523 is a component corresponding to the puncturer/repeater/zero remover 442 of the transmitter 400, and may perform an operation corresponding to the repeater 442. First, the LLR combiner 523 may combine LLR values corresponding to repeated bits with another LLR value. Here, another LLR value may be an LLR value for bits which are the basis for generation of bits repeated by the transmitter 400, i.e., parity bits or LDPC information word bits selected for repetition. In addition, according to TS 38.212 document which is the 3GPP 5G standard specification, repeated bits may be determined variously based on a parameter, such as a code rate or a redundancy version (RV) value configured during retransmission, such as a hybrid automatic repeat request (HARQ).

As described above, the transmitter 400 selects LDPC coded bits and transmits some of LDPC parity bits and LDPC information word bits to the receiver 500 by repeating the same. Accordingly, the LLR value for the LDPC coded bits may include an LLR value for repeated LDPC coded bits and an LLR value for non-repeated LDPC coded bits. The LLR combiner 523 may combine LLR values corresponding to the same LDPC coded bits. To this end, the receiver 500 may pre-store information on parameters used for repetition by the transmitter 400. Accordingly, the LLR combiner 523 may determine the LLR value for the repeated LDPC coded bits and combine the same with the LLR value for the LDPC coded bits which are the basis for repetition.

In addition, the LLR combiner 523 may combine an LLR value corresponding to retransmitted bits or incremental redundancy (IR) bits with other another LLR value. Here, another LLR value may be an LLR value for some or all of the LDPC codeword bits which are the basis for generation of bits retransmitted or IR-ed by the transmitter 400.

As described above, when an NACK is generated for an HARQ, the transmitter 400 may transmit some or all of the codeword bits to the receiver 500. Accordingly, the LLR combiner 523 may combine the LLR value for bits retransmitted or received via IR with an LLR value for LDPC codeword bits received via a previous frame. To this end, the receiver 500 may pre-store information on parameters used for retransmission or generation of IR bits by the transmitter 400. Accordingly, the LLR combiner 523 may determine the LLR value for retransmitted or IR-ed bits and may combine the same with the LLR value for at least some of the LDPC coded bits which are the basis for generation of retransmitted bits.

The deinterleaver 524 may deinterleave an LLR value output from the LLR combiner 523. Specifically, the deinterleaver 524 is a component corresponding to the interleaver 441 of the transmitter 400, and may perform an operation corresponding to the interleaver 441. To this end, the receiver 500 may pre-store information on parameters used for interleaving by the transmitter 400. Accordingly, with respect to an LLR value corresponding to transmitted LDPC coded bits, the deinterleaver 524 may reversely perform interleaving performed by the interleaver 441, so as to deinterleave the LLR value corresponding to the transmitted LDPC coded bits.

The LDPC decoder 530 may perform LDPC decoding based on an LLR value output from the rate dematching unit 520. Specifically, the LDPC decoder 530 is a component corresponding to the LDPC encoder 430 of the transmitter 400, and may perform an operation corresponding to the LDPC encoder 430. To this end, the receiver 500 may pre-store information on parameters used by the transmitter 400 to perform LDPC encoding according to a mode. Accordingly, the LDPC decoder 530 may perform LDPC decoding based on the LLR value output from the rate dematching unit 520 according to a mode. For example, the LDPC decoder 530 may perform LDPC decoding based on the LLR value output from the rate dematching unit 520, based on an iterative decoding scheme based on the sum-product algorithm, and may output error-corrected bits according to LDPC decoding.

The zero remover 540 may remove zero bits from bits output from the LDPC decoder 530. Specifically, the zero remover 540 is a component corresponding to the zero padding unit 420 of the transmitter 400, and may perform an operation corresponding to the zero padding unit 420. To this end, the receiver 500 may pre-store information on parameters used for padding zero bits by the transmitter 400. Accordingly, when the LDPC decoder 530 performs decoding using the padded bits, the zero remover 540 may remove, from the output bits, the zero bits padded by the zero padding unit 420. The operation of removing the zero-padded (or shortened) bits by the zero remover 540 may actually refer to an operation of removing the padding bits, but may refer to an operation of, when transferring the output bits of the LDPC decoder 530 to the next desegmentation unit 550, transferring the output bits after excluding the padded bits. In addition, since the receiver accurately knows positions of the bits zero-padded by the transmitter, the zero-padded bits may not be used during decoding, in which case, removing of the zero-padded bits may be omitted.

The desegmentation unit 550 is a component corresponding to the segmentation unit 410 of the transmitter 400, and may perform an operation corresponding to the segmentation unit 410. To this end, the receiver 500 may pr-store information on parameters used for segmentation by the transmitter 400. Accordingly, the desegmentation unit 550 may combine bits output from the zero remover 540, i.e., segments for variable-length input bits, and restore bits before segmentation.

According to an embodiment, an LDPC code may be decoded using the iterative decoding algorithm based on the sum-product algorithm on the bipartite graph listed in FIG. 2, and the sum-product algorithm is a type of message passing algorithm.

Functional components for channel decoding have been described in FIG. 5, but, in some cases, the receiver 500 may further include components (not illustrated) for controlling an operation of the receiver 500.

According to an embodiment, the receiver 500 may further include a communication unit. The communication unit performs functions to transmit or receive a signal via a wireless channel. For example, the communication unit performs a function of conversion between a baseband signal and a bitstream according to a physical layer specification of the system. For example, when transmitting data, the communication unit generates complex symbols by encoding and modulating a transmitted bitstream. In addition, when receiving data, the communication unit restores a received bitstream via demodulation and decoding of a baseband signal. The communication unit up-converts a baseband signal to a radio frequency (RF) band signal, transmits the up-converted RF band signal via an antenna, and then down-converts the RF band signal received via the antenna to a baseband signal. According to various embodiments, the receiver 500 may receive an LDPC-encoded signal from the transmitter 400.

To this end, the communication unit may include a transmission filter, a reception filter, an amplifier, a mixer, an oscillator, a digital-to-analog converter (DAC), an analog-to-digital converter (ADC), and the like. The communication unit may include multiple transmission/reception paths. Furthermore, the communication unit may include at least one antenna array including multiple antenna elements. In terms of hardware, the communication unit may include a digital unit and an analog unit, wherein the analog unit includes multiple sub-units according to an operation power, an operation frequency, and the like.

The communication unit may transmit or receive a signal. To this end, the communication unit may include at least one transceiver. For example, the communication unit may transmit a synchronization signal, a reference signal, system information, a message, control information, data, or the like. The communication unit may perform beamforming.

The communication unit transmits and receives a signal as described above. Accordingly, all or a part of the communication unit may be referred to as "transmitter", "receiver", or "transceiver". In the following description, transmission and reception performed via a radio channel are used in a sense including processing performed as described above by the communication unit.

According to an embodiment, the receiver 500 may further include a storage unit. The storage unit may store the aforementioned parameters and data, such as, a default program, an application program, and configuration information for operations of the receiver 500. The storage unit may include a memory. The storage unit may include a volatile memory, a nonvolatile memory, or a combination of a volatile memory and a nonvolatile memory. In addition, the storage unit may provide stored data in response to a request of a controller.

According to an embodiment, the receiver 500 may further include a controller. The controller may control overall operations of the receiver 500. For example, the controller transmits and receives a signal via the communication unit. In addition, the controller records data in the storage unit and reads the data. The controller may perform functions of a protocol stack required by a communication standard. To this end, the controller may include at least one processor. The described operations for channel encoding correspond to stored instruction sets or codes, and may be instructions/codes which are at least temporarily residing in the controller, a storage space storing instructions/codes, or a part of circuitry constituting the controller. According to various embodiments, the controller may control the receiver to perform operations according to various embodiments described below.

Figure 6A:
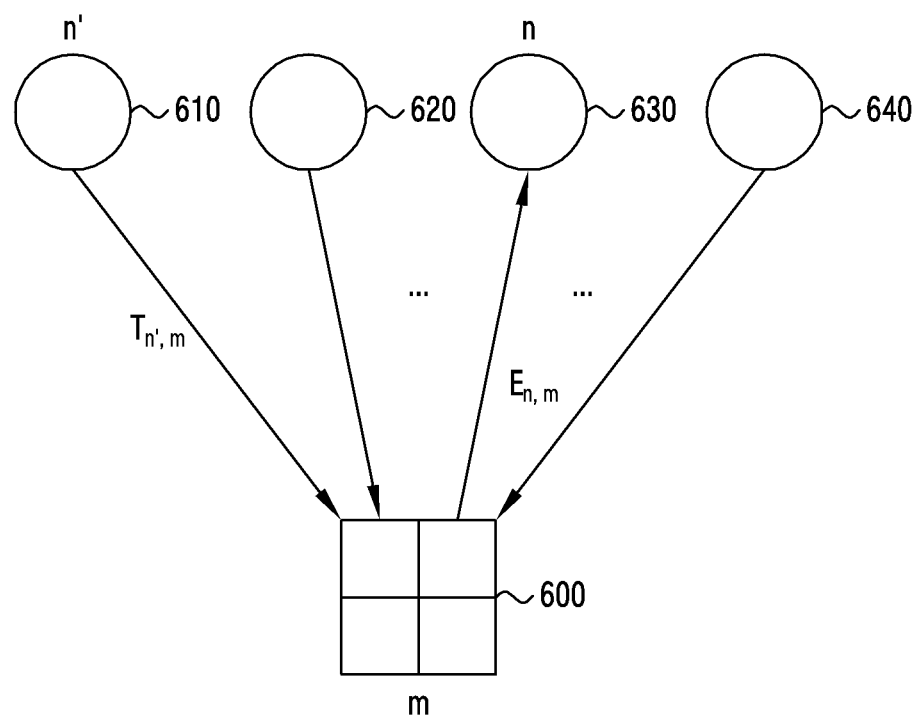
FIGS. 6A and 6B are message structure diagrams illustrating a message passing operation in any check node and variable node for LDPC decoding according to various embodiments of the disclosure.
Figure 6B:
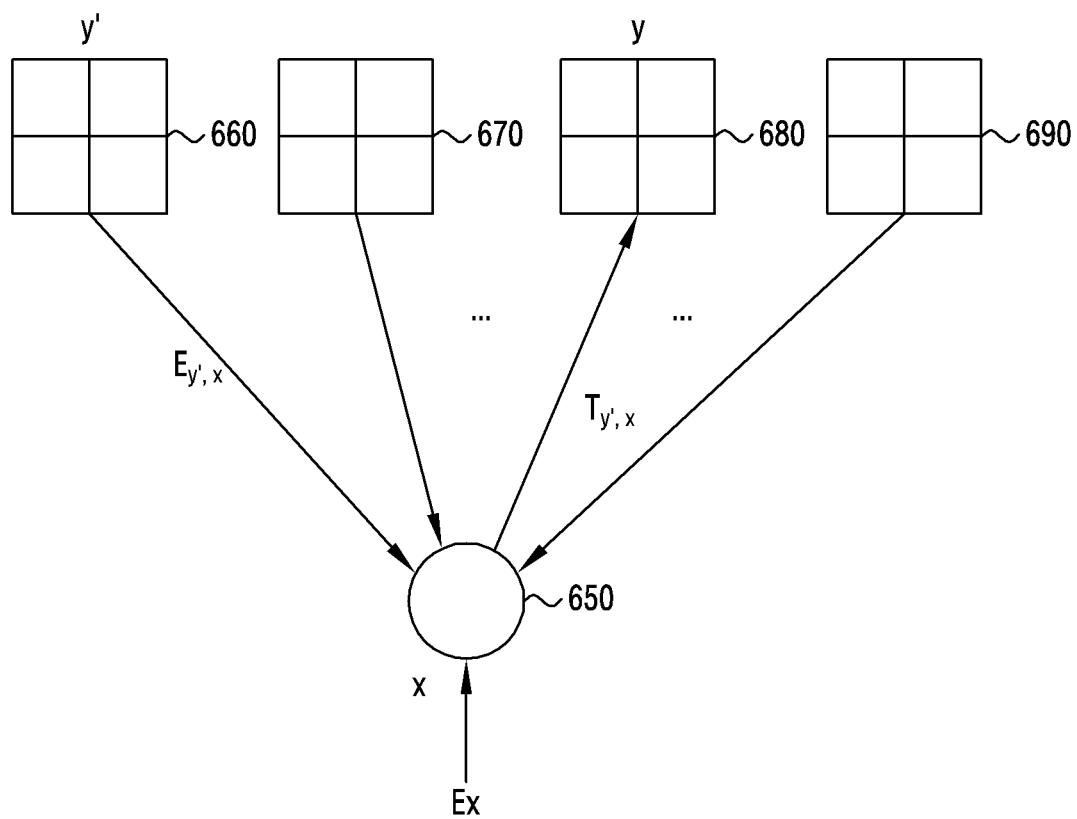

FIGS. 6A and 6B are message structure diagrams illustrating a message passing operation in any check node and variable node for LDPC decoding according to various embodiments of the disclosure. Hereinafter, message passing generally used during LDPC decoding will be described with reference to FIGS. 6A and 6B.

FIGS. 6A and 6B are diagrams illustrating message passing in any check node and variable node for LDPC decoding. Message passing may include updating of the check node and updating of the variable node. FIG. 6A describes an updating procedure of variable node n, and FIG. 6B describes an updating procedure of check node y.

FIG. 6A illustrates check node m 600 and multiple variable nodes 610, 620, 630, and 640 connected to check node m 600. In addition, illustrated $T_{n',m}$ represents a message passed from variable node n' 610 to check node m 600, and $E_{n,m}$ represents a message passed from check node m 600 to variable node n 630. Here, a set of all variable nodes connected to check node m 600 is expressed as N(m), and a set obtained by excluding variable node n 630 from N(m) is expressed as N(m)\n.

In this case, a message update rule based on the sum-product algorithm may be expressed as in Equation 15 below.

$$|E_{n,m}| = \phi\left[\sum_{n' \in N(m)\backslash n} \phi(|T_{n',m}|)\right]$$

$$\text{Sign}(E_{n,m}) = \prod_{n' \in N(m)\backslash n} \text{sign}(T_{n',m})$$

Equation 15

Here, Sign($E_{n,m}$) represents a sign of message $E_{n,m}$, and $|E_{n,m}|$ represents a magnitude of message $E_{n,m}$. Function $\varphi(x)$ may be expressed as Equation 16 below.

$$\phi(x) = -\log(\tanh(\frac{x}{2}))$$

Equation 16

For reference, the −log(tanh(•)) function in Equation 16 may be expressed more simply as log(coth(•)).

FIG. 6B illustrates variable node x 650 and multiple check nodes 660, 670, 680, and 690 connected to variable node x 650. In addition, illustrated $E_{y',x}$ represents a message passed from check node y' 660 to variable node x 650, and $T_{y,x}$ represents a message passed from variable node x 650 to check node y 680. Here, a set of all check nodes connected to variable node x 650 is expressed as M(x), and a set obtained by excluding check node y 680 from M(x) is expressed as M(x)\y. In this case, a message update rule based on the sum-product algorithm may be expressed as in Equation 17 below.

$$T_{y,x} = E_x + \sum_{y' \in M(x)\backslash y} E_{y',x}$$

Equation 17

Here, $E_x$ refers to an initial message value of variable node x.

In addition, determination of a bit value of node x may be expressed as in Equation 18 below.

$$P_x = E_x + \sum_{y' \in M(x)} E_{y',x}$$

Equation 18

In this case, a coded bit corresponding to variable node x may be determined according to a $P_x$ value.

Since methods described in FIGS. 6A and 6B are general decoding methods, further detailed descriptions thereof will be omitted. However, in addition to the methods described in FIGS. 6A and 6B, another method may be applied to determining a value of a passed message in a variable node and a check node. For a detailed description related to this, a reference is made to ⌈Frank R. Kschischang, Brendan J. Frey, and Hans-Andrea Loeliger, "Factor Graphs and the Sum-Product Algorithm", IEEE TRANSACTIONS ON INFORMATION THEORY, VOL. 47, NO. 2, February 2001, pp 498-519). For example, in Equations 15 and 16, an update expression of a check node is expressed based on the −log(tanh(•)) function so as to be expressed in the form of a sum. However, in the reference document, an update expression is expressed in the form of a product based on a tanh(•) function or an inverse function tanh−1(•) thereof. In this way, there may be various expression methods that are conceptually the same. In addition, various simplified decoding methods, such as a min-sum algorithm, may exist to reduce complexity. Detailed descriptions of these various decoding algorithms are omitted in the disclosure, but it is obvious that not only the decoding algorithms and the decoding scheduling scheme to be proposed in the disclosure, but also various other types of decoding algorithms may be combined.

Figure 7:
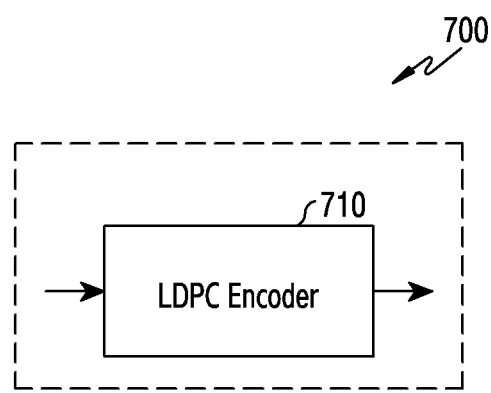
FIG. 7 is a block diagram for illustrating a configuration of an LDPC encoder according to an embodiment of the disclosure.

FIG. 7 is a block diagram for illustrating a configuration of an LDPC encoder according to an embodiment of the disclosure. $K_{ldpc}$ bits may constitute $K_{ldpc}$ LDPC information word bits $I=(i_0, i_1, \ldots, i_{K_{ldpc}-1})$ for an LDPC encoder 700. The LDPC encoder 700 may systematically LDPC-code $K_{ldpc}$ LDPC information word bits so as to generate an LDPC codeword $C=(c_0, c_1, \ldots, c_{Nldpc-1})=(i_0, i_1, \ldots, i_{Kldpc-1}, p_0, p_1, \ldots, p_{Nldpc-Kldpc-1})$ including $N_{ldpc}$ bits. As described in Equation 1, a codeword is determined so that a product of the LDPC codeword and a parity check matrix becomes a zero vector.

Referring to FIG. 7, an encoding device 700 includes an LDPC encoder 710. The LDPC encoder 710 may generate an LDPC codeword by performing LDPC encoding on input bits, based on a parity check matrix or an exponent matrix or sequence corresponding thereto. In this case, the LDPC encoder 710 may perform LDPC encoding using parity check matrices defined differently according to a code rate (i.e., a code rate of an LDPC code), an input bit (or codeword or information word) length, or block length Z.

The encoding device 700 may further include a memory (not illustrated) for pre-storing information on a parity check matrix, an input bit (or information word or codeword) length, and a code rate of an LDPC code, and the LDPC encoder 710 may perform LDPC encoding using this information. Information on the parity check matrix may include information on an exponent value of a circulant matrix if the parity matrix proposed in the disclosure is used.

Figure 8:
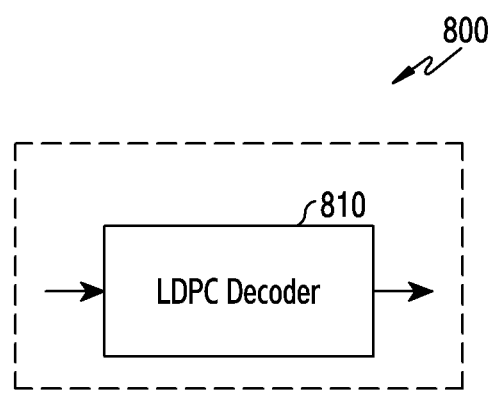
FIG. 8 is a block diagram illustrates a configuration of a decoding device according to an embodiment of the disclosure.

FIG. 8 is a block diagram illustrates a configuration of a decoding device according to an embodiment of the disclosure.

Referring to FIG. 8, a decoding device 800 may include an LDPC decoder 810. The LDPC decoder 810 performs LDPC decoding on an LDPC codeword, based on a parity check matrix or an exponent matrix or sequence corresponding thereto. For example, the LDPC decoder 810 may generate information word bits by performing LDPC decoding by passing an LLR value corresponding to LDPC codeword bits via the iterative decoding algorithm. In this case, the LLR value is a channel value corresponding to LDPC codeword bits transmitted from a transmitter, and may be expressed in various ways.

According to an embodiment, the LDPC decoder 810 may perform LDPC decoding using parity check matrices defined differently according to a code rate (i.e., a code rate of an LDPC code).

Figure 9:
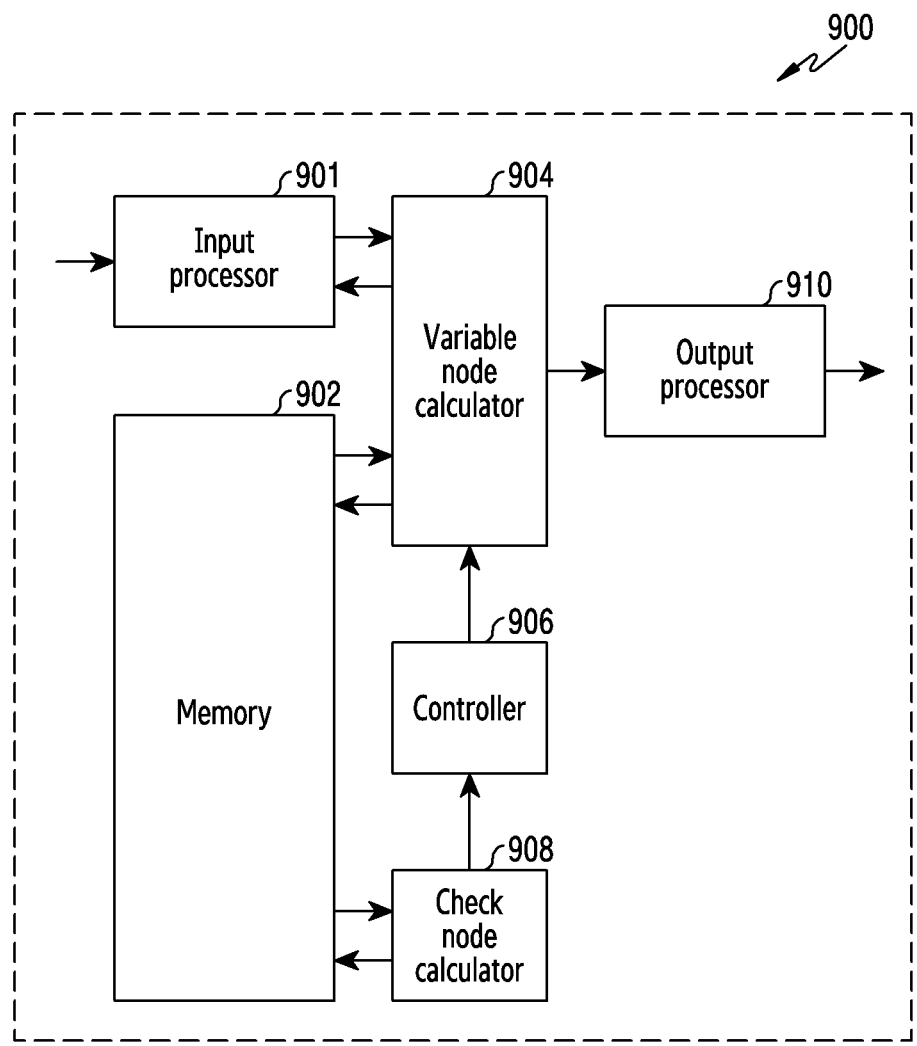
FIG. 9 illustrates a functional configuration of an LDPC decoder according to an embodiment of the disclosure.

FIG. 9 illustrates a functional configuration of an LDPC decoder according to an embodiment of the disclosure. As described above, the LDPC decoder 810 may perform LDPC decoding using the iterative decoding algorithm, in which case, the LDPC decoder 810 may have a structure as in FIG. 9. However, the detailed configuration illustrated in FIG. 9 is also merely an example.

Referring to FIG. 9, a decoding device 900 *mm* include an input processor 901, a memory 902, a variable node calculator 904, a controller 906, a check node calculator 908, an output processor 910, and the like.

The input processor 901 stores an input value. Specifically, the input processor 901 may store an LLR value of a reception signal received through a radio channel.

The controller 906 determines the number of values input to the variable node calculator 904, an address value in the memory 902, the number of values input to the check node calculator 908, an address value in the memory 902, and the like, based on a parity check matrix corresponding to a code rate and a size (i.e., a length of a codeword) of a block of a reception signal received via a radio channel.

The memory 902 stores input data and output data of the variable node calculator 904 and the check node calculator 908.

The variable node calculator 904 receives data from the memory 902 according to address information of input data received from the controller 906 and the number information of the input data, so as to perform variable node calculation. Then, the variable node calculator 904 stores variable node calculation results in the memory 902, based on address information of output data received from the controller 906 and the number information of the output data. In addition, the variable node calculator 904 inputs a variable node calculation result to the output processor 910, based on data received from the input processor 901 and the memory 902. Here, variable node calculation has been described above based on FIG. 6A.

The variable node calculator 908 receives data from the memory 902 and performs check node calculation, based on the address information of the input data received from the controller 906 and the number information of the input data. Then, the check node calculator 908 stores check node calculation results in the memory 902, based on address information of output data received from the controller 906 and the number information of the output data. Here, check node calculation has been described above based on FIG. 6B.

The output processor 910 makes a hard decision on whether information word bits of a codeword at a transmission side are 0 or 1, based on data received from the variable node calculator 904, and then outputs a result of the hard decision, wherein an output value of the output processor 910 becomes a final decoded value. In this case, the hard decision may be made based on a value obtained by adding all message values (an initial message value and all message values input from the check node) input to one variable node via FIGS. 6A and 6B.

The memory 902 of the decoding device 900 may pre-store information on a parity check matrix, an input bit (or information word or codeword) length, and a code rate of an LDPC code, and the LDPC decoder 810 may perform LDPC encoding (decoding?) using this information. However, this is merely an example, and corresponding information may be provided from a transmission side.

Figure 10:
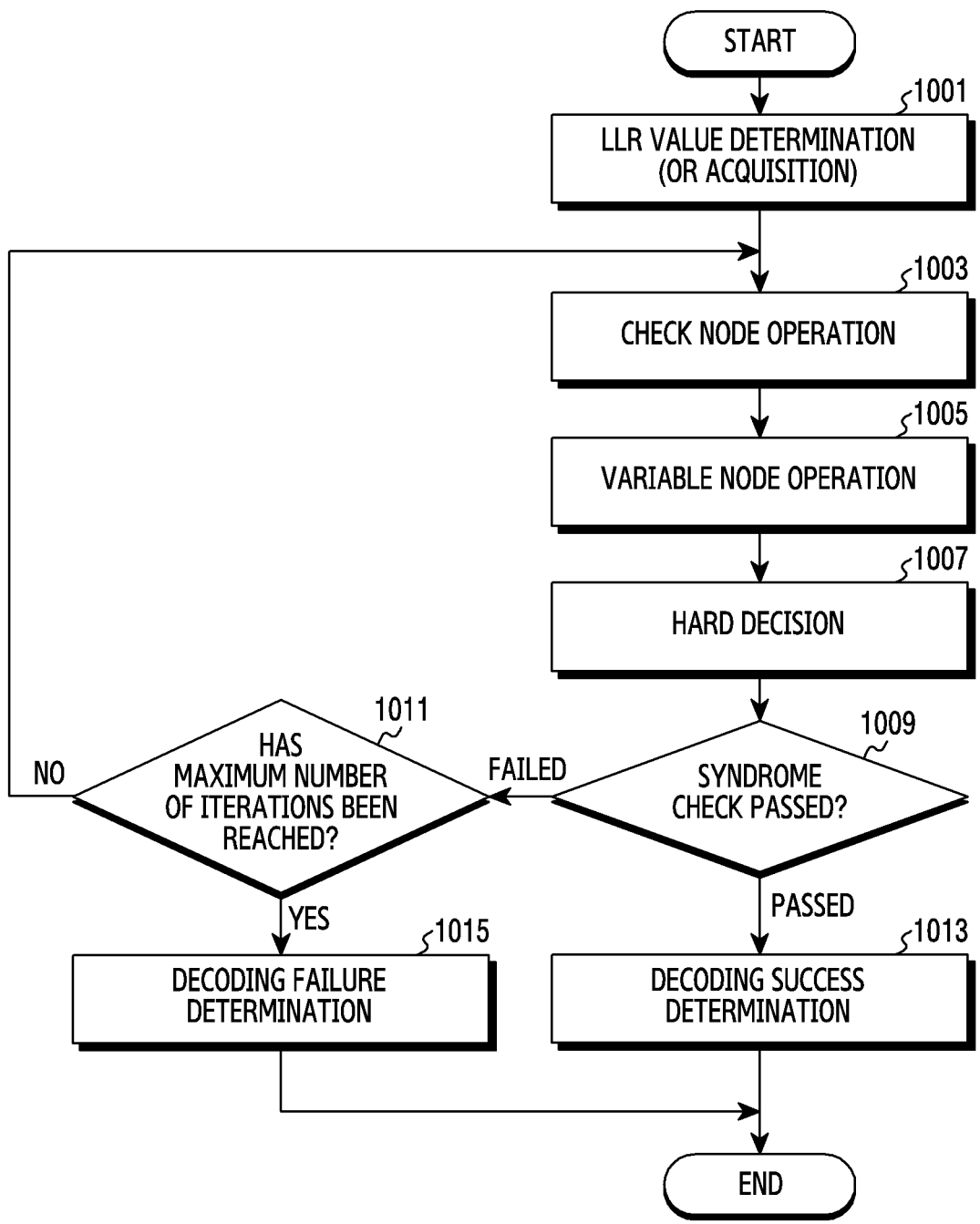
FIG. 10 illustrates an operation flow for LDPC decoding of an LDPC decoding device according to an embodiment of the disclosure.

FIG. 10 illustrates an operation flow for LDPC decoding of an LDPC decoding device according to an embodiment of the disclosure. The LDPC decoding device may be a receiver for receiving an LDPC-encoded signal. For example, the LDPC decoding device may be a base station for decoding an uplink signal. For example, the LDPC decoding device may be a terminal for decoding a downlink signal.

Referring to FIG. 10, in operation 1001, the LDPC decoding device may obtain an LLR value. A value, which is generated from a reception signal and is referred to as a channel LLR or intrinsic LLR of a corresponding bit, is input to each variable node. Input LLR values may be rate dematched LLR values.

According to an embodiment, the LDPC decoding device may perform flooding LDPC decoding. In flooding LDPC decoding, all check nodes calculate and update a message value, and a message corresponding to a calculated extrinsic LLR is transferred to a neighboring variable node along a connected connection line.

In operation 1003, the LDPC decoding device may perform a check node operation. An intrinsic LLR of each variable node is transferred to a neighboring check node, and the LDPC decoding device calculates, based on the received message, a message corresponding to the extrinsic LLR that is to be transferred to each variable node from each of all check nodes.

In operation 1005, the LDPC decoding device may perform a variable node operation. The LDPC decoding device generates, based on the received message corresponding to the calculated extrinsic LLR and the received intrinsic LLR values, complete LLRs for determination of bit values and messages to be transferred to check nodes from all the respective variable nodes. A complete LLR may be referred to as a posteriori probability (APP) metric, an APP LLR, or other terms having an equivalent technical meaning. According to an embodiment, in a flooding LDPC decoder, all variable nodes calculate and update message values.

In operation 1007, the LDPC decoding device may make a hard decision. The LDPC decoding device may estimate a bit value by making a hard decision on the complete LLR in each variable node, before transferring a message from the variable node to the check node.

In operation 1009, the LDPC decoding device may determine whether the estimated bit value(s) passes a syndrome check. The syndrome check refers to a procedure of identifying whether each row of a matrix is 0, the matrix being obtained via the product of a channel matrix and a transpose channel matrix of the estimated codeword obtained via operation 1007. In the LDPC decoding device, whether the bit value estimated in operation 1007 satisfies a syndrome check equation in which a determination is made based on a parity check matrix. The syndrome check can be expressed by Equation 19 to be described later.

If it is identified that the syndrome check equation is satisfied, the LDPC decoding device may perform operation 1013. In operation 1013, the LDPC decoding device may determine that decoding is successful. Decoding of the received signal is determined to be successful, and the success of decoding is output and reported.

If it is identified that the syndrome check equation is not satisfied, the LDPC decoding device may perform operation 1011. In operation 1011, the LDPC decoding device may determine whether a maximum number of iterations is reached. In other words, it may be identified whether the number of iterations of decoding performed up to the current time has reached the maximum number of times of iterative decoding specified in advance. If the number of iterations of decoding performed up to the current time has not reached the maximum number of times of iterative decoding, the LDPC decoding device may perform the series of operations (e.g., operations 1003 to 1009) again. If a decoding result does not satisfy the syndrome check equation until the number of iterations of decoding performed up to the current time reaches the maximum number of times of iterative decoding, the LDPC decoding device may perform operation 1015. In operation 1015, the LDPC decoding device outputs and reports a decoding failure.

According to an embodiment, the LDPC decoding device may perform layered LDPC decoding. Layered decoding refers to a method of dividing check nodes into multiple layers and then sequentially performing decoding from a check node in turn.

Referring to FIG. 10, in operation 1003, the LDPC decoding device may perform a check node operation. The LDPC decoding device receives, at a check node belonging to a layer in turn, a message from a variable node connected to the check node. The LDPC decoding device transfers, to a neighboring variable node, the message calculated and updated in the check node.

In operation 1005, the LDPC decoding device may perform a variable node operation. In the LDPC decoding device, variable nodes having received the updated message calculate and update a complete LLR and a message to be transferred to the check node. The series of calculation procedures for one layer as described above is referred to as layer processing. If layer processing is performed on all layers, the LDPC decoding device may perform operation 1007.

In operation 1007, the LDPC decoding device may make a hard decision. The LDPC decoding device calculates an estimated bit value by making a hard decision on the complete LLR calculated in each variable node.

In operation 1009, the LDPC decoding device may determine whether the estimated bit value(s) passes the syndrome check. The LDPC decoding device identifies a success or failure of decoding by performing the syndrome check based on the estimated bit value. In this case, check nodes of the parity check matrix corresponding to the syndrome check may be all check nodes or some predetermined check nodes. (For example, some or all check nodes connected to a degree-1 variable node may be excluded.)

In general, an error may be detected via a syndrome in an LDPC code, but in order to support a higher level of error detection capability, a CRC code may be additionally applied as an external code. A general example of FEC decoding in a case of applying a CRC code as an external code and applying an LDPC code as an internal code is described with reference to FIG. 11.

Figure 11:
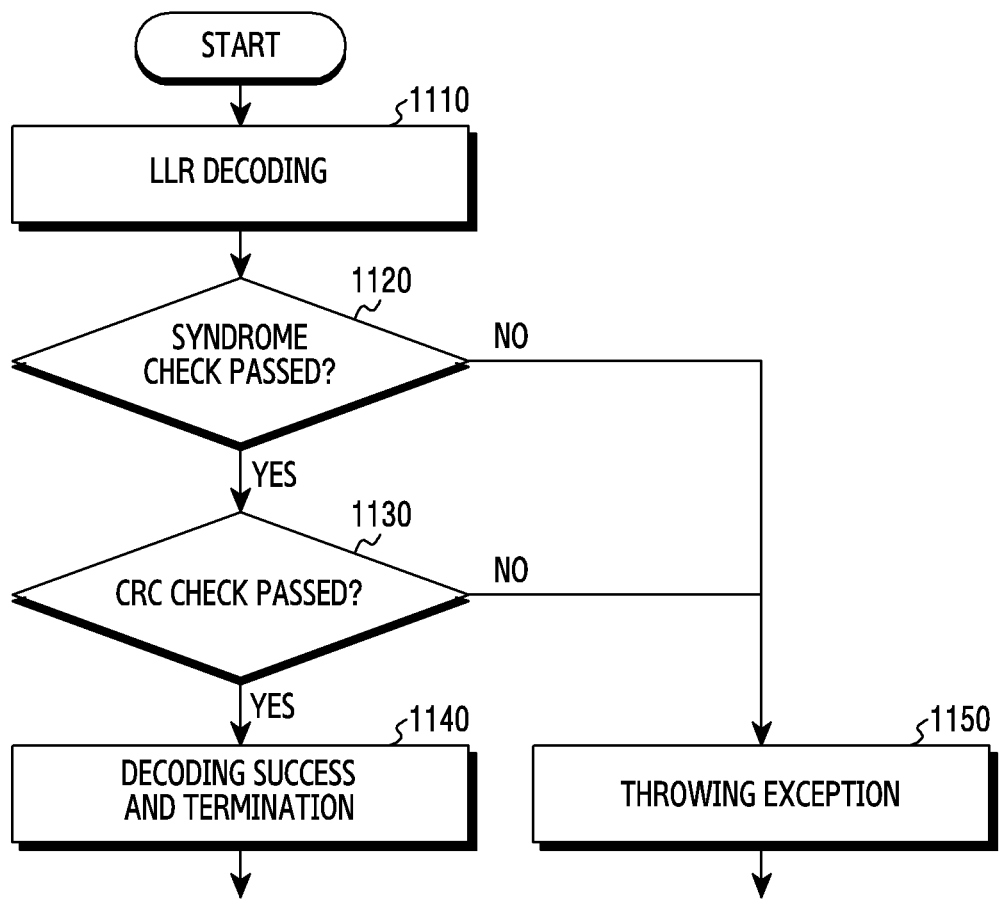
FIG. 11 illustrates an operation flow for decoding based on LDPC and cyclic redundancy check (CRC) codes of an LDPC decoding device according to an embodiment of the disclosure.

FIG. 11 illustrates an operation flow for decoding based on LDPC and CRC codes of an LDPC decoding device according to an embodiment of the disclosure. The LDPC decoding device may be a receiver for receiving an LDPC-encoded signal. For example, the LDPC decoding device may be a base station for decoding an uplink signal. For example, the LDPC decoding device may be a terminal for decoding a downlink signal.

Referring to FIG. 11, in operation 1110, the LDPC decoding device may perform LDPC decoding. In general, as illustrated in FIG. 11, the LDPC decoding device may perform LDPC decoding, and then perform operation 1120.

In operation 1120, the LDPC decoding device may determine whether an LDPC code has passed a syndrome check. The LDPC decoding device identifies or checks an LDPC syndrome obtained via a decoding result, so as to determine whether an error is detected. Here, the LDPC syndrome refers to a value determined as in Equation 19 below when a codeword obtainable via a hard decision after performing LDPC decoding is ĉ, and H is a parity check matrix used in decoding.

$$s = H \cdot \hat{c}^T \qquad \text{Equation 19}$$

If a codeword transmitted from an actual transmitter is c, $H \cdot c^T = 0$ is established by Equation 1, so that when decoding is successfully performed, syndrome value s in Equation 19 should also be 0. (In some cases, an LDPC syndrome value of 0 may represent passing the syndrome check based on identification of the LDPC syndrome value.) However, if the syndrome value is not 0 (or if the LDPC syndrome value indicates not passing), this indicates c≠ĉ.

If the syndrome check is passed, the LDPC decoding device may perform operation 1130. If the syndrome check is not passed, the LDPC decoding device may perform operation 1150. In other words, if LDPC syndrome value s is not 0, the LDPC decoding device may perform operation 1150. The LDPC decoding device may immediately throw an exception in operation 1150 to determine whether or not to use a code block or an information word bit, for which LDPC decoding has been performed, in a higher layer of the system, or may determine whether to discard the code block or the information word bit, for which LDPC decoding has been performed, according to a predetermined condition.

According to another embodiment, unlike FIG. 11, the LDPC decoding device may perform operation 1130 without immediately throwing an exception in operation 1150 even if LDPC syndrome value s is not 0 in operation 1120. In operation 1130, the LDPC decoding device may determine whether a CRC code has passed a CRC check. The LDPC decoding device may perform CRC detection (or identification) for the information word bit. This is because, although codeword decoding has failed according to the LDPC decoding result, since there is a possibility that an error remains only in the parity bit after LDPC decoding and there is no error in the information word bit, the LDPC decoding device may perform CRC detection in operation 1130 so as to determine whether an error is detected in the information word bit.

As described above, if the LDPC syndrome value according to LDPC decoding is 0, the LDPC decoding device may perform CRC detection in operation 1130. If it is determined, via CRC detection in operation 1130, that an information word bit vector has been successfully decoded, the LDPD decoding device may perform operation 1140. In operation 1140, the LDPC decoding device may determine that decoding has been successful and terminate the decoding. If it is determined, as a result of the CRC detection in operation 1130, that the information word bit vector has an error, the LDPC decoding device may throw an exception for the decoded information word vector or code block as in operation 1150, so as to determine whether to use the information word vector or code block in a higher layer of the system or determine whether to discard the information word vector or code block.

In the disclosure, it is noted that throwing an exception may refer to all operations performed when it is determined that decoding has failed or is likely to fail, in addition to operations required to be performed when decoding has successfully progressed in all processes.

In addition, the receiver may generate an instruction, a flag, or the like relating to a success or failure of decoding and transfer the same to a higher layer. A higher layer may determine a method of processing decoded information bits or code blocks, based on the instruction or flag (e.g., determining a retransmission request, or the like).

For reference, c≠ĉ in Equation 19, but when decoded codeword ĉ is a codeword different from c, the LDPC syndrome may be 0. This error cannot be detected via an LDPC code (undetected error), so that the error, in general, may be detected only by performing CRC detection after LDPC decoding.

In addition, syndrome value s may be obtained (or calculated or determined) via calculation based on the parity check matrix and the decoded codeword as in Equation 19, but may be easily obtained depending on implementation characteristics of the LDPC decoder. For example, in Equation 15, for LDPC decoding, decoding may be performed by dividing messages used in decoding according to sizes and signs, wherein syndrome value s may be easily obtained (or calculated or determined) via operation of + or − signs of the messages. For example, the LDPC decoding device may easily obtain the syndrome value, based on an appropriate XOR operation by matching signs with binary numbers such that a + sign corresponds to 0 and a − sign corresponds to 1, in an actual decoder implementation. More particularly, in the LDPC iterative decoding, whether the syndrome value is 0 or not is easily identifiable from implementation characteristics. For reference, a hard decision of an actually LDPC-decoded codeword may also be easily determined based on signs of messages for respective bits for which LDPC decoding has been performed.

When checking or identifying the LDPC syndrome in operation 1120, in some embodiments, the LDPC decoding device does not necessarily check or identify all syndromes of the LDPC code, and may check or identify only some syndrome values. For example, syndrome values associated with check nodes connected to degree-1 variable nodes, i.e., check nodes corresponding to degree-1 parity bits, may not be used for checking or identification in operation 1120. This is because bits corresponding to degree-1 variable nodes generally have a significantly low probability of correcting errors, and thus are highly likely to always be detected as having errors even if LDPC syndrome is checked. Therefore, in many cases, in order to prevent an erroneous error check result, the LDPC decoding device may check or identify the LDPC syndrome for all or some of check nodes connected only to variable nodes or bits of degree 2 or higher.

The LDPC code considered in the disclosure is a quasi-cyclic LDPC code that may be defined as a quasi-cyclic parity check matrix as in FIGS. 3A and 3B, and usually has algebraic characteristics depending on a block size expressed as L, Z, or the like as shown in Equation 11. For example, cycle characteristics, or the like, on the Tanner graph of the quasi-cyclic LDPC code are related to the block size, and if the parity check matrix is full rank, an LDPC information word length may also be expressed in a multiple of the block size. Due to these algebraic characteristics, the quasi-cyclic LDPC code may be decoded as well as encoded more efficiently based on a block length.

However, transport blocks generally have various lengths, and therefore the LDPC information word length may not necessarily appear in the form of a multiple of specific block size Z, i.e., the number of information word bits of the LDPC code, which may be defined in the parity check matrix of the quasi-cyclic LDPC code. Similarly, even after the segmentation described in FIG. 4, the LDPC information word length may not appear in the form of a multiple of block size Z. In this way, when encoding information bits or code blocks which are less than a maximum number of LDPC information word bits or a maximum code block size enabling execution of LDPC encoding on the parity check matrix at one time, or are not in the form of the multiple of the block size, an operation, such as zero padding (or shortening) may be additionally performed to satisfy the multiple of the block size, for convenience of encoding or decoding.

In the disclosure, for convenience of description, the maximum number of LDPC information word bits, which can be encoded at one time with respect to the parity check matrix of the LDPC code or the base matrix (or parent matrix) of the parity check matrix, may be referred to as the maximum code block size or the maximum number of LDPC information word bits of the parity check matrix, and this may be expressed as $K_{cb}$.

The maximum number of LDPC information word bits or the maximum code block size ($K_{cb}$) may be defined differently for each given parity check matrix or base matrix. For example, the maximum code block size may be defined as $K_{cb1}=8448$ in encoding using a parity check matrix (i.e., a parity check matrix using base graph (BG) #1) defined based on base matrix B1, and the maximum code block size may be defined as $K_{cb2}=3840$ in encoding using a parity check matrix (i.e., BG #2) defined based on base matrix B2. In this case, it is noted that both $K_{cb1}=8448$ and $K_{cb2}=3840$ should be multiples of the maximum value of block size Z applicable to respective base matrices.

For example, if both the maximum values of block sizes applicable to base matrices B1 and B2 are equal to 384, the maximum values may be expressed as $K_{cb1}=8448=22*384$ and $K_{cb2}=3840=10*384$, and this indicates that a submatrix corresponding to the information word bit of base matrix B1 includes 22 column blocks, and a submatrix corresponding to the information word bit of base matrix B2 includes 10 column blocks.

In this way, in the disclosure, since the number of columns of the submatrix corresponding to the information word bit is a multiple of the block size, for convenience of encoding and decoding, <Null> bits may be added to a transport block for transmission so that the size of a code block, to which LDPC encoding is to be applied, may be configured to be a multiple of block size Z of the LDPC parity check matrix. <Null> bits may be added regardless of whether segmentation is applied or not, and may be added to configure the size of the code block to be constant. Adding <Null> bits to the information word bit of the LDPC code may be generally referred to as "shortening". Since the transmitter and the receiver are configured with an appointed bit value (e.g., 0) for an appointed position, actual transmission may not be performed, and since the receiver may accurately know the value, the receiver may perform decoding by excluding the value during the decoding or may perform decoding by applying the appointed value during the decoding. For example, if an appointed value of shortened bits is 0, the decoder may perform decoding by applying, to a probability that a bit at a shortened position is 0, a value corresponding to 1 (e.g., in a case of LLR, a maximum value configured in the system, which corresponds to an infinity value).

In general, as in the lifting method described in Equations 9 to 14, in the case of the system in which sequences are appropriately converted and used for a wide variety of block size L (or Z) based on one LDPC exponent matrix, sequence, or parity check matrix, there are many advantages because implementation is performed only for one or a small number of sequences. However, as the number of block sizes to be supported increases, it is very difficult to design an LDPC code with good performance for all block sizes.

Figure 12:
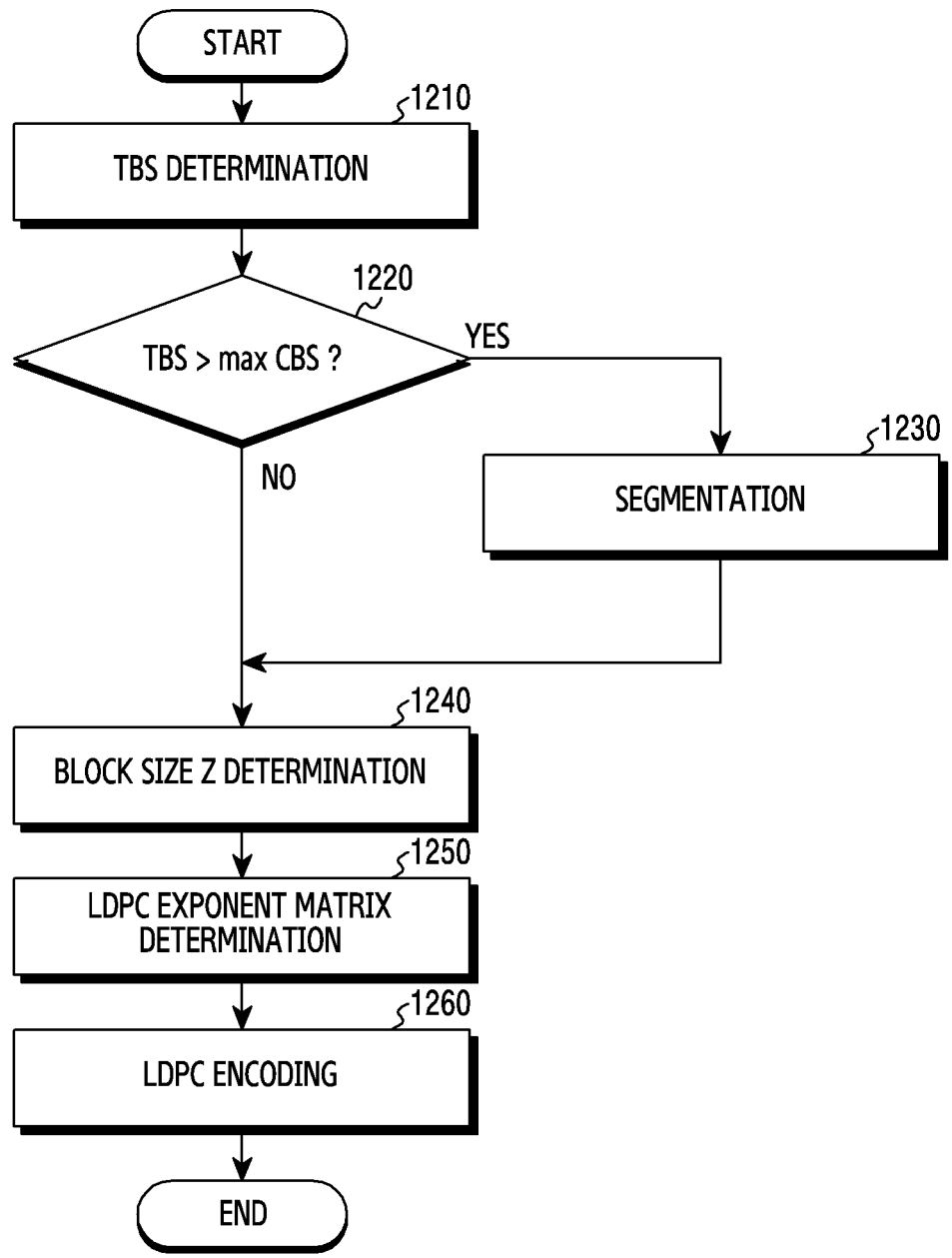
FIG. 12 illustrates an operation flow of a transmitter, for LDPC encoding according to an embodiment of the disclosure.
Figure 13:
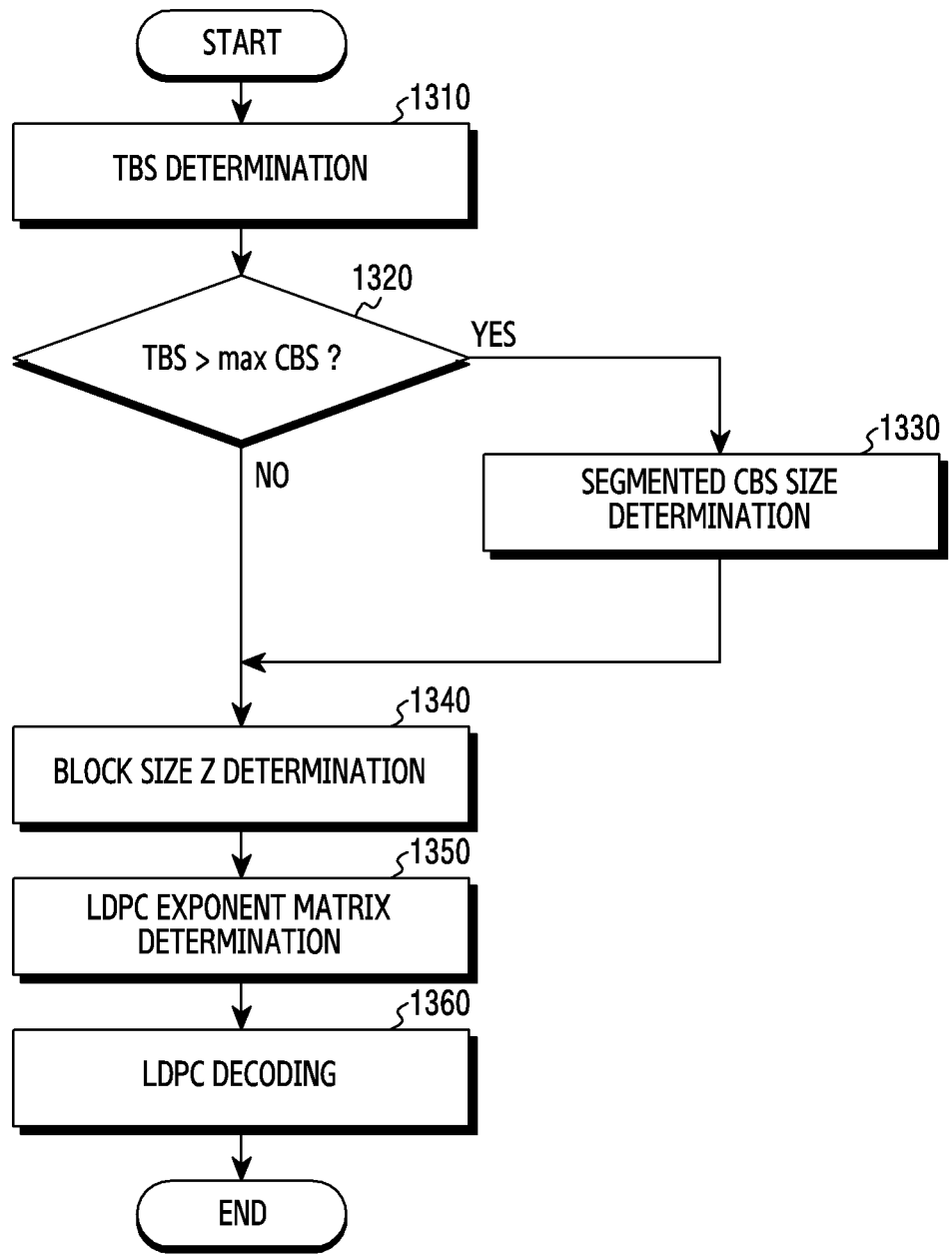
FIG. 13 illustrates an operation flow of a receiver, for LDPC encoding according to an embodiment of the disclosure.

FIGS. 12 and 13 show flowcharts of embodiments of LDPC encoding and decoding based on a designed base matrix or exponent matrix.

FIG. 12 illustrates an operation flow of a transmitter, for LDPC encoding according to an embodiment of the disclosure. For example, the transmitter may be a base station. For another example, the transmitter may be a terminal.

Referring to FIG. 12, in operation 1210, the transmitter may determine a transport block size (TBS).

In operation 1220, the transmitter may determine whether the TBS is greater than max CBS that is a maximum code block size, or is smaller than or equal to max CBS. If the TBS is greater than max CBS, the transmitter may perform operation 1230.

In operation 1230, the transmitter may perform segmentation. The transmitter may newly determine the CBS by segmenting the transport block. The transmitter may obtain code blocks by segmenting the transport block. Then, the transmitter may perform operation 1240.

If the TBS is not greater than max CBS, that is, if the TBS is smaller than or equal to max CBS, segmentation may be omitted and the TBS may be determined to be the CBS. The transmitter may perform operation 1240 without performing segmentation.

In operation 1240, the transmitter may determine block size Z. The transmitter may determine, based on the CBS, a block size Z value to be applied to LDPC encoding. According to an embodiment, the transmitter may identify predetermined candidate values indicated by an index value, and the transmitter may identify block size Z to be applied to LDPC encoding according to the CBS from among the predetermined candidate values.

In operation 1250, the transmitter may determine an LDPC exponent matrix. The transmitter may appropriately determine an LDPC exponent matrix or sequence according to the TBS, the CBS, or the block size Z value. In embodiments, operation 1250 may include converting the determined LDPC exponent matrix or sequence, based on the determined block size. It is obvious that the LDPC exponent matrix, sequence, or parity check matrix for LDPC encoding may be determined in various ways based on the TBS or the CBS depending on the system. For example, the transmitter may first determine a base matrix via the TBS, and can also determine the LDPC exponent matrix, the sequence, or the parity check matrix, based on the determined base matrix and the CBS. In addition, various methods are applicable within a scope for achieving the same technical effect.

In operation 1260, the transmitter may perform LDPC encoding. The transmitter may perform LDPC encoding based on the determined block size, exponent matrix, or sequence.

LDPC decoding may be expressed to correspond to LDPC encoding of FIG. 12, as in FIG. 13 below.

FIG. 13 illustrates an operation flow of a receiver, for LDPC encoding according to an embodiment of the disclosure. For example, the transmitter may be a base station. For another example, the transmitter may be a terminal. The receiver may receive a signal corresponding to an input bit, a transport block, or a code block. In the disclosure, an input bit may refer to an LDPC information word bit, a TB, bits obtained by appending a CRC to a TB (TB+CRC), or a code block bit.

Referring to FIG. 13, in operation 1310, the receiver may determine a TBS. The receiver determines a transport block or the number of input bits, based on the signal. The TBS refers to a size of the transport block transferred from a MAC layer.

In operation 1320, the receiver may determine whether the TBS is greater than max CBS. Here, since the max CBS may vary according to a parity check matrix or a base matrix used for LDPC encoding, a procedure (not illustrated) of determining max CBS according to the TBS or a code rate may be additionally required. If the TBS is greater than max CBS, the receiver may perform operation 1330.

In operation 1330, the receiver may determine a CBS to which segmentation is applied. If the TBS is determined to be smaller than or equal to max CBS, the TBS is immediately determined to be equal to the CBS. Accordingly, the receiver may not separately perform operation 1330.

In operation 1340, the receiver may determine block size Z. The receiver may determine a block size Z value to be applied to LDPC decoding. Operation 1310 to operation 1340 are operations for determining a block size and may be expressed as one operation.

In operation 1350, the receiver may determine an LPDC exponent matrix. The receiver may determine an LDPC parity check matrix, an exponent matrix, or a sequence, based on the TBS, the CBS, the block size Z value, or the code rate. According to an embodiment, operation 1350 may include converting the determined LDPC parity check matrix, exponent matrix, or sequence, based on the determined block size.

It is obvious that the LDPC exponent matrix, sequence, or parity check matrix for LDPC decoding may be determined in various ways based on the TBS or the CBS depending on the system. For example, the base matrix can be first determined based on the TBS or the code rate, max CBS can be determined (or configured) based on the determined base matrix, the CBS can be determined based on the determined or configured max CBS, and then block size Z and the LDPC exponent matrix, sequence, or parity check matrix can also be determined based on the determined CBS. In addition, various methods are applicable within a scope for achieving the same technical effect.

In operation 1360, the receiver may perform LDPC decoding. The receiver may perform LDPC decoding using the determined block size, parity check matrix, exponent matrix, or sequence.

According to the embodiments, operation 1250 of FIG. 12 and operation 1350 of FIG. 13 describe that determining of the exponent matrix or sequence of the LDPC code includes determining the exponent matrix or the sequence according to one of the TBS, the CBS, or block size Z, but various other methods may also be applied.

In the embodiments of LDPC encoding and decoding based on the base matrix and exponent matrix (or LDPC sequence) of the LDPC code in FIGS. 12 and 13, LDPC encoding and decoding of various code rates and various lengths may be supported by appropriately shortening some of the information word bits of the LDPC code and puncturing and repeating some of the codeword bits. For example, after applying shortening to some of the information word bits in the base matrix or exponent matrix determined for LDPC encoding and decoding in FIGS. 12 and 13, if some of code blocks, input bits, or information word bits corresponding to first two column blocks in the parity check matrix are punctured, and a part of parity is punctured or a part of the LDPC codeword is repeated, various information word lengths (or code block lengths) and various code rates may be supported.

In addition, when a variable information word length or a variable code rate is supported using shortening or zero padding of the LDPC code, code performance may be improved according to a shortening order or a shortening method. If a shortening order is preconfigured, encoding performance may be improved by appropriately rearranging the order of a part of or the entire base matrix. In addition, performance may be improved by appropriately determining a block size or the number of column blocks, to which shortening is to be applied, with respect to a specific information word length (or code block length, CBS).

In general, the code rate of the LDPC code may be adjusted by applying puncturing to codeword bits according to the code rate. When a parity bit corresponding to a degree-1 column is punctured, the LDPC decoder may perform decoding without using some or all corresponding parts in the parity check matrix, so that decoding complexity can be reduced. When encoding performance is considered, there is a method of adjusting a puncturing order of a parity bit or a transmission order of a generated LDPC codeword, thereby improving performance of the LDPC code. For example, better performance may be supported in a case where parity bits and some of information word bits are appropriately punctured, compared to a case of simply puncturing parity bits to support a variable code rate. In addition, when repeating a part of the LDPC codeword to support a lower code rate, LDPC encoding performance may be improved by appropriately determining the order thereof in advance.

In general, in the LDPC encoding, the transmitter first determines the number (or size) of input bits (or code blocks) to which LDPC encoding is to be applied, subsequently determines block size Z, to which the LDPC encoding is to be applied, according to the number, determines an appropriate LDPC exponent matrix or sequence according to the block size, and then performs LDPC encoding based on block size Z and the determined exponent matrix or LDPC sequence. In this case, the LDPC exponent matrix or sequence may be applied to LDPC encoding without conversion, and in some cases, LDPC encoding may be performed by appropriately converting the LDPC exponent matrix or sequence according to block size Z.

Similarly, in the LDPC decoding, the receiver determines the number (or size) of input bits (or code blocks) for the transmitted LDPC codeword, subsequently determines block size Z, to which LDPC decoding is to be applied, according to the number, determines an appropriate LDPC exponent matrix or sequence according to the block size, and then performs LDPC decoding based on block size Z and the determined exponent matrix or LDPC sequence. In this case, the LDPC exponent matrix or sequence may be applied to LDPC decoding without conversion, and in some cases, LDPC decoding may be performed by appropriately converting the LDPC exponent matrix or sequence according to block size Z.

Figure 14:
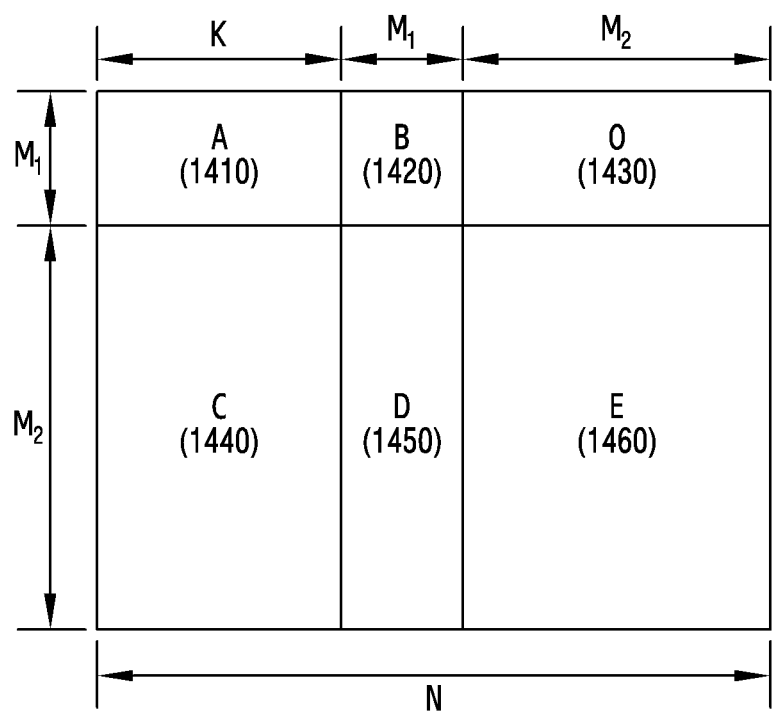
FIG. 14 is a diagram for illustrating a structure of a parity check matrix according to an embodiment of the disclosure.

FIG. 14 is a diagram for illustrating a structure of a parity check matrix according to an embodiment of the disclosure. Based on FIG. 14, a general structure of a parity check matrix of an LDPC code, which is an internal code applied to an FEC encoder and an FEC decoder, is described.

Referring to FIG. 14, the number of columns is N, and the number of rows is $(M_1+M_2)$ in the parity check matrix. In general, when the parity check matrix has a full rank, the number of columns corresponding to information word bits in the parity check matrix is equal to the number obtained by subtracting a total number of rows from a total number of columns. For example, the parity check matrix of FIG. 14 having a full rank (i.e., the rank is $(M_1+M_2)$) indicates that the number of information word bits K is $N-(M_1+M_2)$. For convenience of description, the disclosure provides descriptions of only a case where a parity check matrix has a full rank in FIG. 14, but the disclosure is not necessarily limited thereto.

First, the parity check matrix of FIG. 14 may be divided into a first part of the parity check matrix and a second part of the parity check matrix, wherein the first part includes submatrices A 1410 and B 1420, and the second part includes submatrices C 1440, D 1450, and E 1460. Submatrix O 1430 refers to a 0-matrix having a size of $(M_1 \times M_2)$. Submatrix O 1430 is a 0-matrix having a size of $(M_1 \times M_2)$, and therefore even if submatrix O is included in the parity check matrix, submatrix O does not affect a matrix operation. For this reason, in the disclosure, for convenience of description, a matrix including submatrices A 1410 and B 1420 excluding submatrix O 1430, which is a 0-matrix having a size of $((M_1 \times M_2)$, is defined as the first part of the parity check matrix, but in some cases, the first part of the parity check matrix may include submatrix O 1430.

For convenience of description, it is assumed that the parity check matrix of FIG. 14 is referred to as H, information word bits (or information word bit vectors) corresponding to submatrix A 1410 or C 1440 are $i=(i_0, i_1, \ldots i_{K-1})$, first parity bits (or first parity bit vectors) corresponding to submatrix B 1420 or D 1450 are $p_1 = p_{1,0}, p_{1,1}, \ldots, p_{1,M_1-1}$, and second parity bits (or second parity bit vectors) corresponding to submatrix E 1460 are $p_2 = p_{2,0}, p_{2,1}, \ldots, p_{2,M_2-1}$. A relation expression, such as Equation 20 below may be obtained from Equation 1.

$$H \cdot C^T = H \cdot \begin{bmatrix} i^T \\ p_1^T \\ p_2^T \end{bmatrix} = \begin{bmatrix} A\ B\ O \\ C\ D\ E \end{bmatrix} \cdot \begin{bmatrix} i^T \\ p_1^T \\ p_2^T \end{bmatrix} = \begin{cases} A \cdot i^T + B \cdot p_1^T = 0 \\ C \cdot i^T + D \cdot p_1^T + E \cdot p_2^T = 0 \end{cases} \quad \text{Equation 20}$$

Referring to Equation 20, first parity vector $p_1$ may be obtained (or calculated or determined) based on information word bit vector i and the first part of the parity check matrix. After obtaining parity vector $p_1$, parity vector $p_2$ may be obtained (or calculated or determined) based on information word bit vector i, parity vector $p_1$, and the second part of the parity check matrix.

As described above, an error probability for each bit of an LDPC code varies according to a degree. More particularly, when the LDPC code has a degree of 2 or greater, a bit error rate (BER, or bit error ratio) is rapidly reduced compared to a degree-1 bit. More particularly, if information bits are successfully decoded, codeword bits with a degree of 2 or greater also have almost no error, but degree-1 codeword bits (particularly, parity bits) may include a large number of bit errors even if information bits are successfully decoded. For this reason, in the communication system to which LDPC encoding and decoding based on the parity check matrix of FIG. 14 is applied, some of syndrome values corresponding to the second part of the parity check matrix, which includes submatrices C 1440, D 1450, and E 1460, may not have a value of 0 with a very high probability regardless of whether an error occurs in information word bits. For example, when syndrome values determined based on the first part (submatrix O 1430 may also be included) of the parity check matrix, which includes submatrices A 1410 and B 1420 in FIG. 14, and the second part of the parity check matrix, which includes submatrices C 1440, D 1450, and E 1460 in FIG. 14, are first part $s_1$ of LDPC syndrome and second part $s_2$ of LDPC syndrome, respectively, $s_2$ highly likely has a vector value other than 0 regardless of a decoding result, as in Equation 21. (In Equation 21, $\hat{I}^T$, $\hat{P}_1^T$, and $\hat{P}_2^T$ denote hard decision result values for LDPC decoding results of the information word bit vector, the first parity vector, and the second parity vector, respectively.)

$$s = \begin{bmatrix} s_1 \\ s_2 \end{bmatrix} = \begin{bmatrix} A & B & O \\ C & D & E \end{bmatrix} \cdot \hat{c}^T = \begin{cases} A \cdot \hat{I}^T + B \cdot \hat{P}_1^T \\ C \cdot \hat{I}^T + D \cdot \hat{P}_1^T + E \cdot \hat{P}_2^T \end{cases} \quad \text{Equation 21}$$

As a result, the entire LDPC syndrome may be used to determine whether LDPC decoding is successful, but the LDPC decoding device may determine whether decoding is successful, by using syndrome or at least a part thereof, wherein the syndrome is based on submatrix [A 1410 B 1420] including independent rows for degree-1 parity bits and degree-2 columns in the parity check matrix as in first part $s_1$ of the syndrome. (Even when the first part of the parity check matrix includes a 0-matrix, such as submatrix O 1430, actual syndrome values are determined based on submatrices A 1410 and B 1420 including columns with a degree of 2 or greater.)

Figure 15:
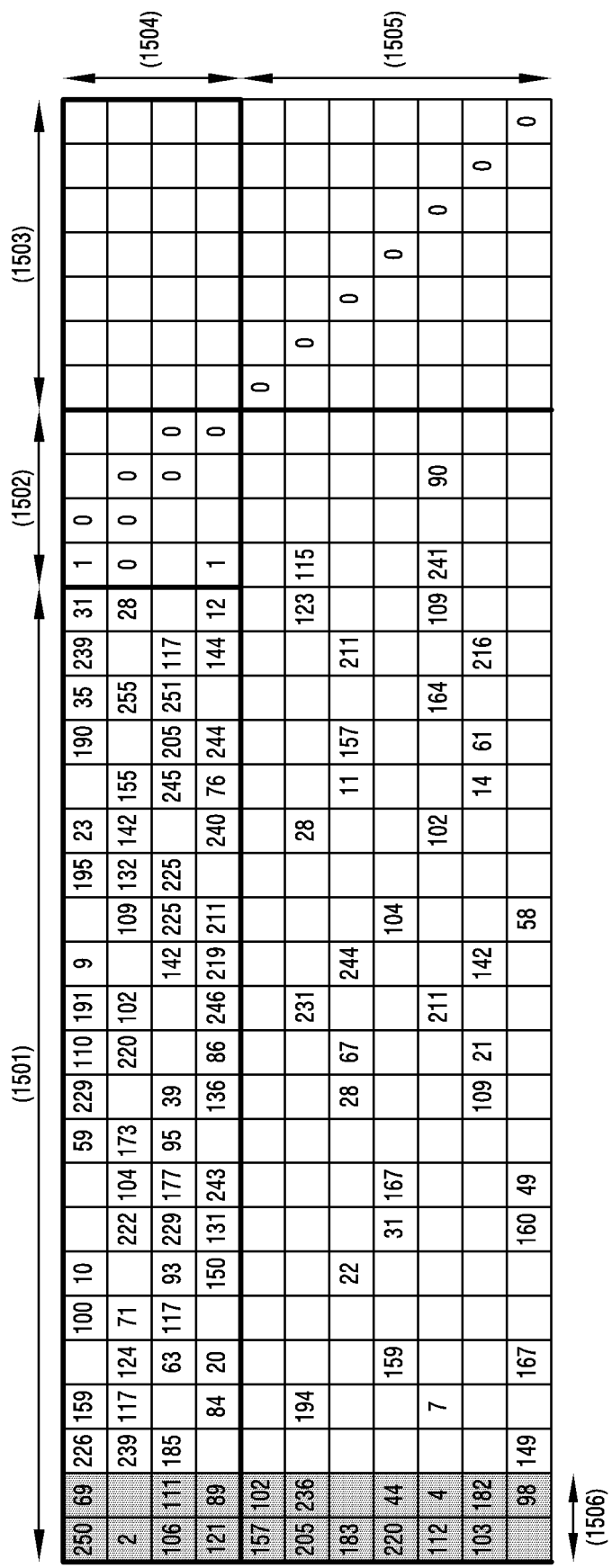
FIG. 15 is a diagram of a parity check matrix for an LDPC code according to an embodiment of the disclosure.
Figure 16:
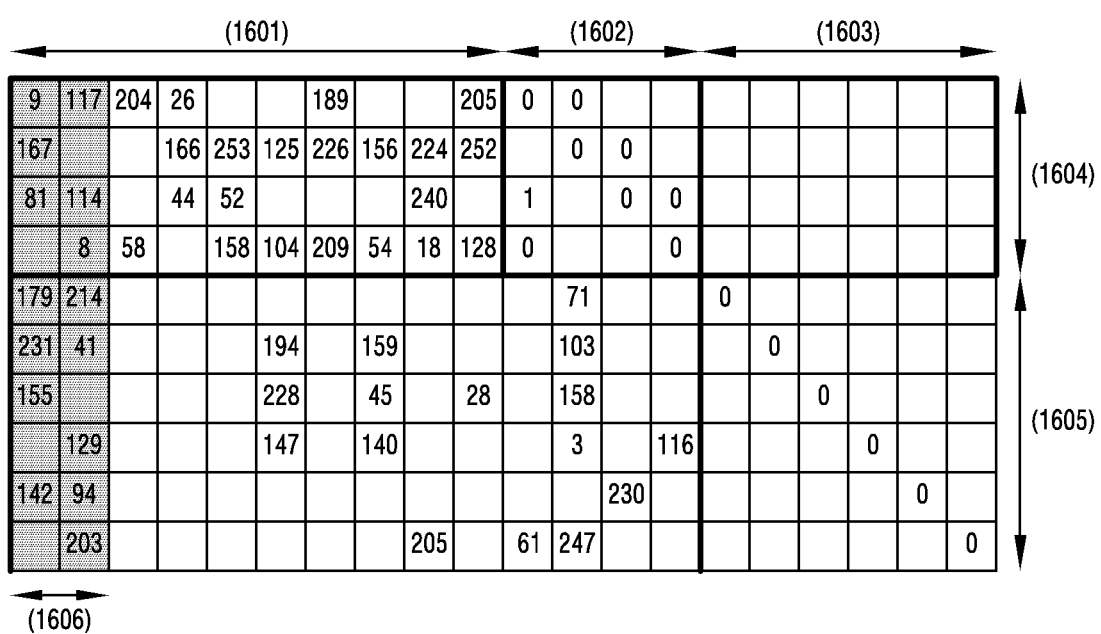
FIG. 16 is a diagram of a parity check matrix for an LDPC code according to an embodiment of the disclosure.

FIGS. 15 and 16 show specific embodiments having the structure of the parity check matrix of FIG. 14.

FIG. 15 is a diagram of a parity check matrix for an LDPC code according to an embodiment of the disclosure. FIG. 16 is another diagram of a parity check matrix for an LDPC code according to an embodiment of the disclosure.

Referring to FIG. 15, the matrix shown in FIG. 15 (including submatrix 1501, 1502, 1503, 1504, 1505, and 1506) is an example of a case where K=22*Z, $M_1$=4*Z, and $M_2$=7*Z in FIG. 14. Referring to FIG. 16, the matrix shown in FIG. 16 (including submatrix 1601, 1602, 1603, 1604, 1605, and 1606) is an example of a case where K=10*Z, $M_1$=4*Z, and $M_2$=6*Z in FIG. 14.

Here, Z refers to a block size defined in Equations 9 to 14, and the parity check matrices of FIGS. 15 and 16 represent exponent matrices of quasi-cyclic parity check matrices. When expressed as an exponent matrix like Equation 4, based on circulant permutation matrices of Equation 2, entries of respective check matrices correspond to the sizes of the circulant permutation matrices. In FIG. 14, a submatrix including $M_2$ degree-1 columns, which corresponds to E 1460, may be regarded as a submatrix corresponding to parity of a single parity-check code, and the submatrix corresponding to E 1460 can be easily extended. For example, parts corresponding to C 1440, D 1450, and E 1460 of FIG. 14 can be configured in the form of extending the parity check matrix of the single parity check code, and since N=K+$M_1$+$M_2$, codeword length N may also increase as $M_2$ increases.

Since the code rate of the LDPC codes corresponding to the parity check matrices of FIGS. 14 to 16 is K/N, a codeword with a lower code rate may be generated as $M_2$ increases. In other words, LDPC encoding and decoding may be performed based on a parity check matrix capable of supporting a lower code rate by further extending degree-1 columns while including FIGS. 15 and 16.

The exponent matrices shown in FIGS. 15 and 16 can be expressed in various forms. According to an embodiment, the exponent matrices shown in FIGS. 15 and 16 may be expressed using a sequence as shown in Equations 22 and 23.

Equation 22 shows, for each row, each entry of the exponent matrix having a size of 11×33 in FIG. 15. Equation 23 shows, for each row, each entry of the exponent matrix having a size of 10×20 in FIG. 16. In the exponent matrix, a specific entry value (e.g., −1) corresponding to a 0 matrix having a size of Z×Z may be excluded. For example, in Equation 22, a fourth value of 63 in a second sequence (referring to a third column which is #2 starting from a first column which is #0) indicates that the exponent value (or a cyclic shift value of bit) of a fourth circulant permutation matrix, which does not correspond to the 0 matrix having a size of Z×Z, is 63 in a second row (zeroth row, first row, and then second row) of the exponent matrix in FIG. 15. (In the example, it has been assumed that a starting order of entries in sequences and matrices starts from 0.)

250 69 226 159 100 10 59 229 110 191 9 195 23 190 35   Equation 22

239 31 1 0 2 239 117 124 71 222 104 173 220 102 109 132 142 155

255 28 0 0 0 106 111 185 63 117 93 229 177 95 39 142 225 225 245

205 251 117 0 0 121 89 84 20 150 131 243 136 86 246 219 211 240

76 244 144 12 1 0 157 102 0 250 236 194 231 28 123 115 0 183 22

28 67 244 11 157 211 0 220 44 159 31 167 104 0 112 4 7 211 102

164 109 241 90 0 103 182 109 21 142 14 61 216 0 98 149 167 160

49 58 0

9 117 204 26 189 205 0 0 167 166 253 125 226 156 224   Equation 23

252 0 0 81 114 44 52 240 1 0 0 8 58 158 104 209 54 18 128 0 0 179

0 214 71 0 231 41 194 159 103 0 155 228 45 28 158 0 129 147 140

3 116 0 142 94 230 0 203 205 61 247 0

Base matrices for the exponent matrices as shown in FIGS. 15 and 16, i.e., the exponent matrices shown in Equations 22 and 23, can also be expressed in various forms, wherein, for example, the base matrices may be expressed using a sequence, such as Equations 24 and 25 below. Equation 24 shows a position of entry 1 in each row in the base matrices corresponding to the exponent matrices of FIG. 15 and Equation 22. Equation 25 shows a position of a column having entry 1 in each row in the base matrices corresponding to the exponent matrices of FIG. 16 and Equation 23. For example, in Equation 24, "4" which is a fourth value (refers to #3 when starting from #00) of a second sequence indicates that entry 1 is present in a fifth column which is column "4" of a second row in the base matrix. (In the example, it has been assumed that a starting order of entries in sequences and matrices starts from 0.)

0: 0 1 2 3 5 6 9 10 11 12 13 15 16 18 19 20 21 22 23   Equation 24

1: 0 2 3 4 5 7 8 9 11 12 14 15 16 17 19 21 22 23 24

2: 0 1 2 4 5 6 7 8 9 10 13 14 15 17 18 19 20 24 25

3: 0 1 3 4 6 7 8 10 11 12 13 14 16 17 18 20 21 22 25

-continued

4: 0 1 26

5: 0 1 3 12 16 21 22 27

6: 0 6 10 11 13 17 18 20 28

7: 0 1 4 7 8 14 29

8: 0 1 3 12 16 19 21 22 24 30

9: 0 1 10 11 13 17 18 20 31

10: 1 2 4 7 8 14 32

0: 0 1 2 3 6 9 10 11    Equation 25

1: 0 3 4 5 6 7 8 9 11 12

2: 0 1 3 4 8 10 12 13

3: 1 2 4 5 6 7 8 9 10 13

4: 0 1 11 14

5: 0 1 5 7 11 15

6: 0 5 7 9 11 16

7: 1 5 7 11 13 17

8: 0 1 12 18

9: 1 8 10 11 19

Shortening and puncturing may be applied during LDPC encoding/decoding using the parity check matrices shown in FIGS. 15, 16, and Equations 22 to 25. Accordingly, various code block lengths and code rates may be supported. In addition, for LDPC codes, error correction and error floor performance can be improved when some of information word bits (i.e., some of code blocks) are appropriately punctured. For this reason, LDPC encoding/decoding performance can be improved by always puncturing, modulating, and transmitting some of information bits or some of code blocks regardless of a code rate.

For example, a method may be considered, in which, as in a punctured part 1506 of FIG. 15 or a punctured part 1606 of FIG. 16, by always puncturing some of code blocks or information bits having a size of 2*Z corresponding to two column blocks in the parity check matrix of the LDPC code regardless of a code rate or a size of allocated resources, some of the code blocks or information word bits are not transmitted to a receiver. Hereinafter, in the disclosure, at least one column block(s) to be punctured may be replaced with terms having the same technical meaning, such as a punctured area, a shortened part, and a shortened area, in addition to a punctured part, so as to be used.

A transmitter does not transmit the punctured bits, but the receiver may regard the punctured bits as bits which have been transmitted through a channel but have lost information, i.e., erased (erasure) bits. The receiver cannot substantially distinguish likelihoods that erased bits are 0 and 1, and thus determines that a likelihood of being 0 is ½ and a likelihood of being 1 is ½. Accordingly, the receiver may determine the erased bit (or punctured bit) to be 1 when expressing the same as an LR value, and may determine the erased bit (or punctured bit) to be 0 when expressing the same as an LLR value. In this disclosure, for convenience of description, only a case of using an LLR value by an LDPC decoder (receiver) is described, but likelihood values for representing bits may be expressed with different values according to requirements of the LDPC decoder.

In this way, the punctured bits correspond to 0 as message values of the LDPC decoder, and may be processed differently by the LDPC decoder (receiver) depending on degrees of the punctured LDPC codeword bits. For example, when LDPC encoding or decoding is performed using parity check matrices corresponding to FIGS. 15 and 16 or Equations 22 to 25, the LDCP decoding device may perform decoding by configuring the LLR values to be 0 when degree-1 parity bits are punctured. However, in general, when degree-1 parity bits are punctured, there is no effect of performance improvement even if iterative decoding is performed, so that the LDCP decoding device may not use LLR values corresponding to the punctured bits during decoding. However, in some cases, the LDCP decoding device may configure LLR values of some punctured degree-1 parity bits to be 0 for efficient parallel processing so as to use the same for decoding. For example, if a parallel processing unit of the LDPC decoder is Z, some of degree-1 parity bits may be used, wherein the degree-1 parity bits are punctured so that the number of LLR values corresponding to bits used for LDPC decoding is a multiple of Z.

Figure 17A:
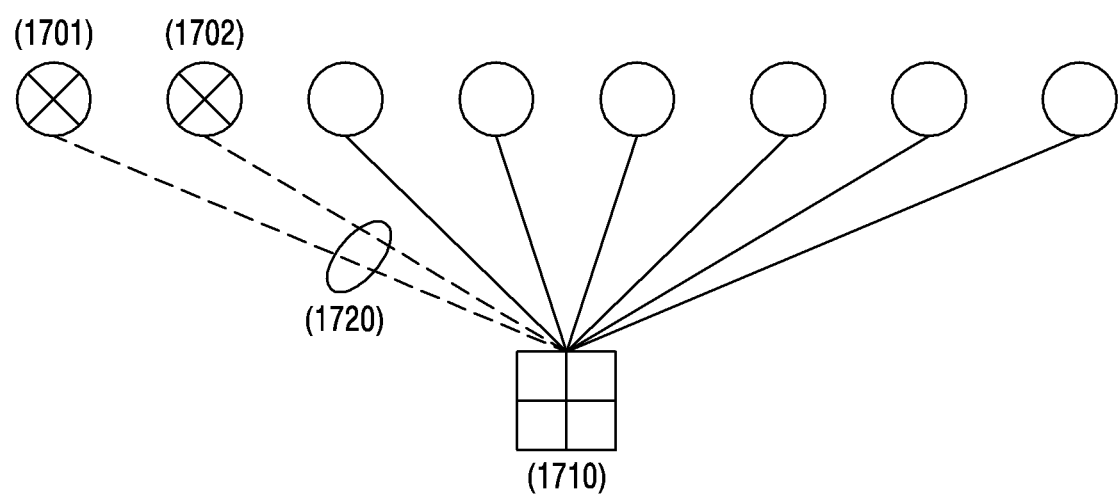
FIGS. 17A and 17B are diagrams respectively illustrating a case in which one punctured bit is connected to one check node and a case in which two punctured bits are connected to one check node, according to various embodiments of the disclosure.
Figure 17B:
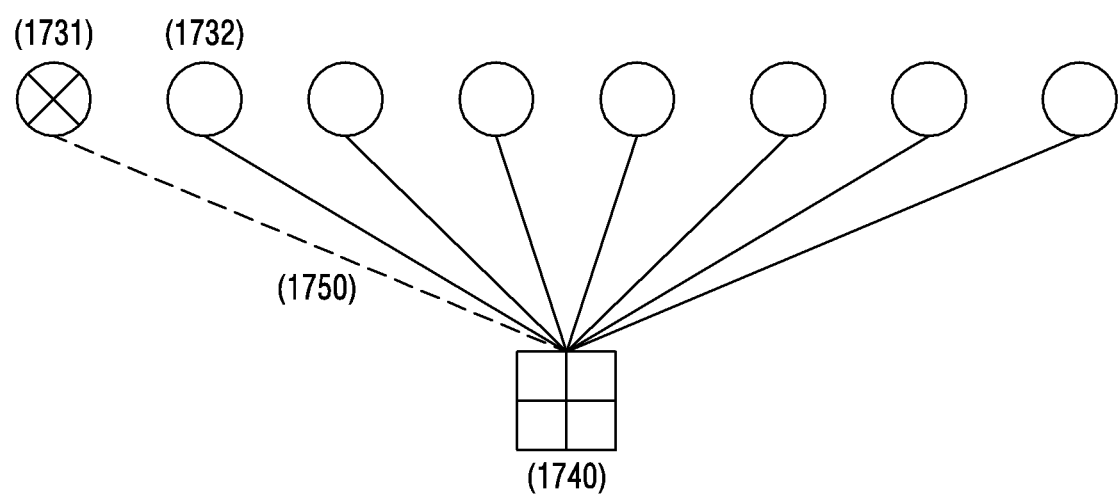

FIGS. 17A and 17B illustrate characteristics of decoding in a case where, when performing LDPC encoding and decoding using parity check matrices corresponding to FIGS. 15 and 16 or Equations 22 to 25, puncturing some of code blocks or information bits corresponding to two columns blocks, as shown in the part 1506 or part 1606.

FIGS. 17A and 17B are diagrams respectively illustrating a case in which one punctured bit is connected to one check node and a case in which two punctured bits are connected to one check node according to various embodiments of the disclosure.

FIG. 17A is a diagram showing a Tanner graph corresponding to a first row block in the parity check matrices of FIGS. 15 and 16. Referring to FIG. 17A, 8 variable nodes and 1 check node are illustrated. FIG. 17A illustrates 8 variable nodes and 1 check node 1710 for convenience of description, but since the parity check matrices of FIGS. 15 and 16 represent quasi-cyclic LDPC codes having a block size of Z, the parity check matrices may be easily extended to a case of actually including 8*Z variable nodes and Z check nodes.

If two or more punctured variable nodes are connected to one check node, like a variable node 1701 and a variable node 1702 of FIG. 17A, LLR values corresponding to the variable nodes are configured to be 0, and these values are transferred to the check node 1710 along respective lines 1720 connected to the variable nodes. In other words, if a check node processor applies an update equation based on the methods described in Equations 15 and 16, one or more cases in which a value thereof diverges to infinity inevitably occur during decoding operation, so that the operation of the check node becomes meaningless. Similarly, when referring to the reference document r Frank R. Kschischang, Brendan J. Frey, and Hans-Andrea Loeliger, "Factor Graphs and the Sum-Product Algorithm", IEEE TRANSACTIONS ON INFORMATION THEORY, VOL. 47, NO. 2, February 2001, pp 498-519)], since tanh(0)=0 when a decoding update equation based on a multiplication rule using the tanh(•) function is applied, one or more cases in which tanh(0)=0 in the update equation must occur. Accordingly, a multiplication equation is always 0, so that the LLR value is not updated no matter which variable node is decoded. For example, referring to Equations 15 to 18, even if check node updating and variable node updating are performed for bit value determination in each of the variable node 1701 and the variable node 1702, an LLR value of the variable node

1701 may not be updated due to an LLR value configured to be "0" for the variable node 1702. Similarly, an LLR value of the variable node 1702 may not be updated due to an LLR value configure to be "0" for the minimum variable node 1701.

FIG. 17B is a diagram showing a Tanner graph corresponding to a second row block in the parity check matrices of FIGS. 15 and 16. Referring to FIG. 17A, 10 variable nodes and 1 check node are illustrated. FIG. 17B illustrates 10 variable nodes and 1 check node 1740 for convenience of description, but since the parity check matrices of FIGS. 15 and 16 represent quasi-cyclic LDPC codes having a block size of Z, the parity check matrices may be easily extended to a case of actually including 10*Z variable nodes and Z check nodes.

If only one punctured variable node is connected to one check node, like a variable node 1731 of FIG. 17B, an LLR value corresponding to the variable node is configured to be 0, and this value is transferred to the check node 1740 along a line 1750. In other words, during calculation of updated LLR values corresponding to the lines remaining after excluding the line 1750, if the check node processor applies an update method based on Equations 15 and 16, the calculated values diverge to infinity by the LLR value (LLR=0) corresponding to the line 1750, or if the check node processor applies a decoding update equation based on the multiplication rule using the tanh(•) function, then tanh (0)=0 which makes the multiplication equation 0, so that LLR values are not updated for bits corresponding to variable nodes other than the variable node 1731. However, in order to calculate the updated LLR corresponding to the line 1750, since updating is performed based on values corresponding to the lines other than the line 1750, the LLR value for a bit corresponding to the variable node 1731 may be updated to be a value other than 0. For example, referring to Equations 15 to 18, check node updating and variable node updating may be performed to determine bit values of the respective variable node 1731 and variable node 1732. In this case, the LLR value of the variable node 1732 may not be updated due to the LLR value configured to be "0" for the minimum variable node 1731. However, the LLR value of the variable node 1731 is updated due to the LLR value configured for the variable node 1732, and may thus be updated to a value other than 0.

Accordingly, for punctured information word bits, the LLR value may or may not be restored immediately after performing layered decoding on a specific layer or a specific row block according to a structure of the parity check matrix.

Figure 17C:
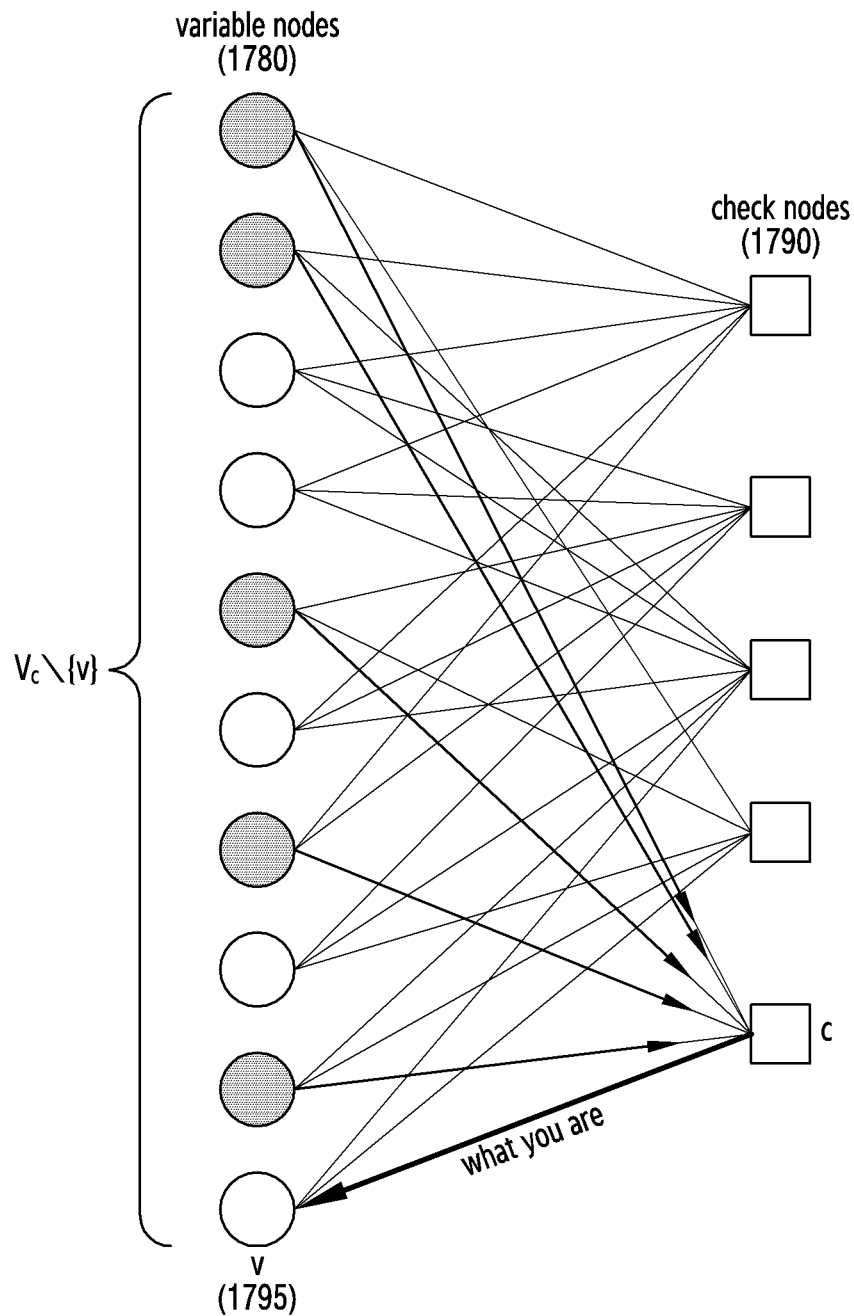
FIG. 17C is a diagram for illustrating an example in which LLR values are restored or not restored during updating between check nodes and variable nodes according to an embodiment of the disclosure.

FIG. 17C a diagram for illustrating an example in which LLR values are restored or not restored during updating between check nodes and variable nodes according to an embodiment of the disclosure.

Referring to FIG. 17C, left side nodes 1780 (e.g., 10 variable nodes) represent variable nodes. Right side nodes 1790 represent check nodes (e.g., 5 inspection nodes). A variable node 1795 is updated by receiving, from a check node connected to the variable node, LLR values of other variable nodes connected to the check node, which are other than the variable node.

According to an embodiment, variable node updating may be performed according to the sum-product algorithm. For example, Equation A below may be used.

$$L_{c \to v} = 2\tanh^{-1}\left(\prod_{u \in V_c \setminus \{v\}} \tanh\left(\frac{L_{u \to c}}{2}\right)\right) \quad \text{Equation A}$$

$L_{c \to v}$ refers to an LLR value from check node c to variable node v, and $L_{u \to c}$ refers to an LLR value from variable node v to check node u.

In this case, if one value of $$"\tanh\left(\frac{L_{u \to c}}{2}\right)"$$

of variable node u (i.e., a variable node connected to check node c, the variable node being other than variable node v) is 0, variable node v is not updated. In other words, if at least two LLR values connected to the check node from among the variable nodes are 0, each variable node is not updated during updating of a corresponding check node (or corresponding layer) of layer decoding. This is because although an LLR value of one variable node is 0, LLR values of other variable nodes are 0. On the other hand, if only one variable node has an LLR value of 0, updating may be performed. This is because LLR values of other variable nodes are not 0, and the corresponding variable node receives an update of the LLR value of a corresponding check node from each of the other variable nodes (i.e., variable nodes u).

According to an embodiment, variable node updating may be performed according to a minimum-sum algorithm. For example, Equation B below may be used.

$$\hat{L}_{c \to v} = \min\left(\alpha \times \left(\prod_{u \in V_c \setminus \{v\}} \text{sgn}(L_{u \to c})\right) \times \min_{u \in V_c \setminus \{v\}} |L_{u \to c}| - \beta, 0\right) \quad \text{Equation B}$$

$L_{c \to v}$ refers to an LLR value from check node c to variable node v, and $L_{u \to c}$ refers to an LLR value from variable node v to check node u. α refers to a normalization factor (e.g., smaller than 1.0), and β refers to an offset factor (0 to 0.50).

In this case, if the LLR value of variable node u (a variable node connected to check node c, the variable node being other than variable node v) is 0, variable node v is not updated. In other words, if at least two LLR values connected to the check node from among the variable nodes are 0, each variable node is not updated during updating of a corresponding check node (or corresponding layer) of layer decoding. This is because although an LLR value of one variable node is 0, LLR values of other variable nodes are 0. On the other hand, if only one variable node has an LLR value of 0, updating may be performed. This is because LLR values of other variable nodes are not 0, and the corresponding variable node receives an update of the LLR value of a corresponding check node from each of the other variable nodes (i.e., variable nodes u).

The disclosure may be applied to layered decoding performed based on a layered belief propagation (LBP) algorithm. In the disclosure, a layer may include at least one row block. The row block of a parity matrix indicates at least one check node. For example, decoding on a layer-by-layer basis may refer to LLR updating (e.g., check node updating or variable node updating of Equations 15 to 18) for at least one check node corresponding to a layer. In addition, layered decoding refers to performing decoding sequentially for respective layers. According to an embodiment, decoding may be performed sequentially in one row block unit. In addition, according to an embodiment, decoding may be performed by configuring multiple row blocks as one layer. In addition, according to an embodiment, depending on a structure of one parity check matrix, some layers may include one row block and some other layers may include multiple row blocks.

In general, row blocks having an orthogonal or quasi-orthogonal property may be regarded as one layer. Here, if circulant permutation matrices included in two or more row blocks are located in different column blocks, the corresponding row blocks are considered to have the orthogonal property. In other words, a case in which one row block is generated by adding row blocks having the orthogonal property in units of blocks indicates that a circulant permutation matrix is not overlapped in each column block of the generated row block, and one circulant permutation matrix or 0-matrix is configured. In addition, when defining in terms of a base matrix, the case indicates that, when rows corresponding to the row blocks having the orthogonal property are added, there is no case in which weight 1 is added redundantly. For example, in FIG. 15, row block 6 and row block 10 at the end are orthogonal to each other (the first row block is regarded as row block 0).

In addition, the row blocks that satisfy the quasi-orthogonal property indicate a case in which the orthogonal property is satisfied only for column blocks remaining after excluding some column blocks at the same position in each row block. For example, in FIG. 15, a fifth row block and a sixth row block have the orthogonal property for all column blocks except for a zeroth column block, and thus have the quasi-orthogonal property. In FIG. 16, a seventh row block and an eighth row block also satisfy the orthogonal property for column blocks remaining after excluding column block 1 ("129" and "94" in a second column block in each row) and thus have the quasi-orthogonal property.

In general, for convenience of implementation, layered decoding is performed by configuring, as one layer, one row block or consecutive or preconfigured multiple row blocks having the orthogonal property or the quasi-orthogonal property. However, the LDPC decoding device according to embodiments of the disclosure may also configure, as one layer, non-consecutive row blocks having the orthogonal property or the quasi-orthogonal property. When the row blocks satisfying the quasi-orthogonal property are configured as one layer, implementation complexity increases as the number of column blocks that do not satisfy the quasi-orthogonal property increases, so that a layer may be configured based on complexity allowed in the system. For this reason, row blocks satisfying the orthogonal property for column blocks remaining after excluding one column block or two or less column blocks may be configured as one layer. However, this is only exemplary, and embodiments of the disclosure are not necessarily limited thereto. In addition, the LDPC decoding device may concurrently process multiple row blocks satisfying the orthogonal or quasi-orthogonal property in order to reduce a wait time, but may also process the multiple row blocks sequentially or successively according to a predetermined order.

Sequentially performing decoding for each layer indicates that decoding is performed on a first selected layer followed by decoding on other layers, and the order of layers for decoding may be changed. For example, a method in which the LDPC decoding device decodes a first layer, subsequently decodes a fourth layer, and then decodes a second layer, or the like is possible. In the following embodiment, for convenience of description, it is assumed that one row block constitutes one layer.

It is assumed that, in the communication system in which some of code blocks or information word bits corresponding to a zeroth column block and a first column block of a parity check matrix corresponding to the exponent matrix in FIG. 15 are punctured, the receiver selects one among the zeroth, second, third, fourth, fifth, seventh, eighth, and ninth row blocks so as to perform first layered decoding for LDPC decoding, or successively performs layered decoding on the row blocks. In this case, since updating of respective bits is not performed, the first layered decoding or the successive layered decoding is not effective.

On the other hand, if one of the first, sixth, and tenth row blocks is selected, and the first layered decoding is performed, LLR values corresponding to punctured information word bits or code blocks corresponding to the zeroth or first column block may be updated. Thereafter, no matter which row block is layered-decoded, LLR values are updated for at least some of the information word bits. More particularly, if layered decoding is first performed sequentially on the first row block and the tenth row block or the sixth row block and the tenth row block, all LLR values for the transmitted information word bits and parity bits have significant values, so that, during subsequent layered decoding, the decoding is performed as if all codeword bits are not punctured.

In this way, applying decoding scheduling capable of restoring the LLR values from the time of performing the first layered decoding based on the punctured information word bits or code blocks is an important problem when a code rate is very high and an information throughput per hour to be supported by the system is high. In general, when data corresponding to hundreds of Mbps or several Gbps is to be transmitted in the system, not only a good channel environment is required, but also a high LDPC coding rate is applied, and the number of iterations of decoding performed by the receiver is not large. This is because, since the number of iterations of decoding is generally inverse proportion to the decoding information throughput per time of the receiver, so that a greater information throughput may be supported as the number of iterations of decoding becomes less. More particularly, when a very high throughput of decoding information per time is required, the number of iterations of decoding often decreases, in which case, first several times of ineffective layered decoding may greatly affect reduction of information throughput per hour. Therefore, the LDPC decoding device may increase decoding efficiency by configuring scheduling for layered decoding based on the punctured information word bits or code blocks, a structure of the parity check matrix, and the like.

In order to configure scheduling for the layered decoding, the LDPC decoding device is required to optimize decoding performance by considering an appropriate degree distribution as well as quickly restoring LLR values corresponding to the punctured information word bits or code blocks. In general, since LDPC codes have an irregular degree distribution, performance may vary depending on a degree distribution of a row block that is to be layered decoded. In other words, layered decoding performance may vary according to a degree distribution.

In order to optimize performance of layered decoding, the disclosure proposes a method for determining the order of layers (or a row block if a layer includes one row block) to be decoded, and a specific embodiment thereof. To this end, various factors to be considered for determining the order of layers to be decoded are reviewed, and a specific method of configuring appropriate decoding scheduling by combining these factors is proposed. It is noted that the disclosure illustrates, for convenience of description, a specific embodiment only for a case of using quasi-cyclic LDPC codes, but the disclosure can be easily expanded to general LDPC codes.

<Conditions for Determining Layered Decoding Scheduling>

Hereinafter, prioritization refers to determining the order of row blocks (or layers) to be layered decoded. Prioritization may include increasing a priority of decoding for a corresponding block. Prioritization of decoding indicates that a specific row block is decoded preferentially over other row blocks, unlike performing sequential decoding according to numbers of row blocks of a check node. For example, prioritization and performing decoding according thereto may include adjusting a decoding order so that an index of a specific row block is arranged to have a higher priority.

Condition 1) When some of information word bits (or code blocks) are punctured and transmitted, initial decoding of a row block corresponding to a row having a degree (i.e., referring to a degree of a check node) or weight of 0 or 1 is prioritized within a submatrix including only row or column blocks corresponding to the punctured information word bits in a base matrix. If there is no information word puncturing, condition 1) is disregarded.

Conditions 2) Decoding of a row block, which maximizes theoretical decoding performance based on a degree or weight distribution, a modulation order, or modulation schemes, is prioritized. In many cases, during initial decoding, the lower a degree of a check node, i.e., a row weight, is, the more significant improvement of decoding performance may be achieved. In addition, since reliability degrees or bit error rates of respective bits constituting a modulation symbol are different according to a modulation scheme, an optimized scheduling scheme may vary depending on a modulation scheme. For theoretical performance, various methods, such as density evolution analysis or exit information transfer chart analysis, may be applied.

Conditions 3) A row block to be decoded is prioritized based on a part of a parity check matrix or a base matrix of an LDPC code that is practically used in decoding or affecting performance according to a code rate or rate matching. For example, the order of layers to be decoded may be changed according to a code rate or rate matching.

Conditions 4) A row block to be decoded is prioritized based on a part of a parity check matrix or a base matrix of an LDPC code that is practically used or affects performance according to a TBS or a CBS. For example, the order of layers to be decoded may be changed according to a TBS.

Condition 1) is a condition for rapid LLR restoration based on the actually limited number of repetitions of decoding. In the disclosure, for convenience of description, encoding/decoding based on LDPC codes having the base matrix or the exponent matrix of Equations 22 to 25 or the parity check matrix having the structures of FIGS. 14 to 16 is assumed, so that puncturing of information word bits is described in condition 1). This is because, generally for LDPC codes having the base matrix or the exponent matrix of Equations 22 to 25 or the structures of FIGS. 14 to 16, not only puncturing of a parity part is variable, but also, if a degree-1 parity is punctured, there is no problem with decoding even if a parity check matrix part corresponding thereto is excluded from the decoding. However, in general, condition 1) may be applied based on both puncturing of parity bits as well as information word bits.

As a specific example of determining the order of layers to be decoded for layered decoding based on condition 1), in FIG. 15, the LDPC decoding device may determine a row block to be decoded first to be one of row block 1, row block 6, or row block 10, and the remaining row blocks may also be used for initial decoding (it is noted that a first row block is considered to be row block 0). In addition, for example, in FIG. 16, the LDPC decoding device may first decode one of row block 1, row block 3, row block 6, row block 7, or row block 9, and the remaining row blocks may also be used for initial decoding.

For conditions 2), it is assumed that sufficient iterative decoding has been performed, and maximization of theoretical performance is considered. Generally, significant improvement of performance is achieved when a degree of a variable node becomes high and a degree of a check node becomes low. However, in general, since a variable node degree and a check node degree increase or decrease concurrently on average, performance of LDPC codes varies greatly depending on how a degree distribution of the LDPC codes is configured. In the disclosure, a layered decoding method has been assumed so that improvement of performance may be highly likely achieved by decoding a row block having a low degree first during initial decoding.

As a specific embodiment, for a parity check matrix corresponding to FIGS. 15 and 16, degrees or weights of zeroth, first, second, and third rows are significantly large compared to degrees or weights of rows subsequent to a fourth row in terms of the base matrix. Therefore, for initial decoding, decoding a row block corresponding to the fourth row of the base matrix and row blocks corresponding to rows subsequent to the fourth row may result higher performance of the initial decoding. If considered with condition 1), using the sixth row block or the tenth row block for initial decoding may result great improvement of performance in FIG. 15, and using the sixth, seventh, or ninth row block for initial decoding may result great improvement of performance in FIG. 16.

If a high-degree modulation scheme, such as 16-QAM, 64-QAM, 256-QAM, 1024-QAM, or the like, is applied, each bit constituting a modulation symbol results a different reliability degree. For example, in each modulation symbol, most significant bits (MSBs) usually have a low bit error rate, i.e., high reliability, and least significant bits (LSBs) usually have a high bit error rate, i.e., low reliability. Therefore, there may be a large difference in LDPC decoding performance depending on how LDPC codeword bits to be transmitted are mapped to the modulation symbol. If a rule for mapping to the modulation symbol is configured in advance, the order of layers for initial decoding may be changed to maximize performance according to the modulation scheme (or degree) and the mapping rule.

In the communication system in which appropriate rate matching is applied to support a variable code rate, since a submatrix of a parity check matrix corresponding to the rate matching actually affects performance, so that condition 3) has been added to reflect this property. For example, if the LDPC encoding/decoding system supports a very high code rate that is close to 1 by using parity check matrices corresponding to the base matrix and the exponent matrices of Equations 22 to 25 or the exponent matrices of FIGS. 15 and 16, there may occur a case in which some of parity bits corresponding to last two column blocks in the submatrix 1502 and the submatrix 1602 in FIGS. 15 and 16 are punctured via rate matching. If a situation, in which parity bits corresponding to first two column blocks in the submatrix 1502 and the submatrix 1602 are punctured, the situation indicates that a code rate is larger than 1, so that, unless the situation is a special situation occurred in the system, the parity bits corresponding to first two column blocks in the submatrix 1502 and the submatrix 1602 are not punctured. In this case, it is obvious that ineffective decoding may be minimized only by performing initial decoding for a first row.

On the other hand, parity bits corresponding to the sixth row block may be transmitted if a code rate 22/27 is supported for FIG. 15 or a code rate 10/15 is supported for FIG. 16, and best encoding/decoding performance may be provided if initial decoding is applied preferentially to the sixth row block in accordance with condition 1) and condition 2).

If a code rate supported by the system is not greatly variable and is determined to be a code rate different from code rates in the other embodiments, an optimal decoding scheduling order is determined for a given parity check matrix, so that performance may be optimized only by performing initial decoding on the first row block, the sixth row block, and another row block as in the above.

Accordingly, since the size and range of a submatrix affecting performance in the parity check matrix vary depending on a code rate, if one fixed layered decoding scheduling method is applied, implementation thereof may be easy but there may be some loss of performance. Therefore, if implementation is possible, encoding/decoding performance is improved when variable decoding scheduling is applied based on all or some of a supportable maximum code rate, a minimum code rate, or an actually supported code rate.

For reference, for the code rate used in condition 3), an effective code rate, which is obtained by dividing the number of information word bits or a code block size by the number of transmitted bits, may be used, or a code rate defined from MCS or channel quality indicator (CQI)-related system information (e.g., MCS index, CQI index, or the like), or the like, may be used. Using the effective code rate is advantageous in that a scheduling order or pattern enabling accurate performance prediction can be defined, but calculating the effective code rate is additionally required. If the code rate defined in MCS or CQI is used, additional calculation may not be required, but the code rate may be different from a code rate optimized for a predetermined scheduling order or pattern, so that some performance degradation may possibly occur.

Condition 4) may be applied when a part of a parity check matrix or a base matrix of an LDPC code that is practically used for decoding or affects performance according to a TBS or a CBS shows a difference. In fact, according to the TS 38.212 document that is a 3GPP 5G standard specification, when a code block (or information word bit) is mapped to a submatrix corresponding to an information word in a parity check matrix, the range thereof is configured differently according to a CBS. For example, when encoding is performed based on second base matrix BG2 (in TS 38.212, a base matrix is expressed using a base graph) defined in TS 38.212, $K_b=10$ column blocks are selected if a CBS or TBS length is greater than 640, $K_b=9$ column blocks are selected if a CBS or TBS length is from 560 to 640 where 560 is not inclusive, $K_b=8$ column blocks are selected if a CBS or TBS length is from 192 to 560 where 192 is not inclusive, $K_b=6$ column blocks are selected if a CBS or TBS length is equal to or less than 192, and then encoding is performed based on $K_b$ column blocks. Therefore, in the submatrix of the parity check matrix corresponding to the information word bit and the code block, column blocks remaining after excluding the $K_b$ column blocks may not be used during encoding. Accordingly, not using a part of a given parity check matrix during encoding is the same as "shortening" and refers to a change of a degree distribution that affects actual performance. Therefore, as mentioned in condition 2), due to a large effect on theoretical performance of the LDPC code, an optimal scheduling order or pattern may vary depending on the TBS or CBS length.

Hereinafter, the disclosure proposes a specific embodiment of an efficient decoding scheduling method applicable to a receiver by considering each of the four conditions or concurrently considering multiple conditions thereof proposed in <Conditions for determining layered decoding scheduling>. For convenience of description, in the system using a parity check matrix corresponding to a base matrix as in Equations 26 and 27 below, it is assumed that some of code blocks or information word bits corresponding to a first zeroth column block and a first column block are punctured. However, the content of the disclosure may be also applied to an embodiment in which some of code blocks or information word bits corresponding to a column block subsequent to a second column block are punctured. In addition, a block size is expressed as Z, and the base matrices of Equations 26 and 27 are expressed as BM1 and BM2, respectively. According to an embodiment, as BG1 instead of BM1, a designated table of TABLE 5.3.2-2 of 3GPP TS 38.213 may be used. Similarly, according to an embodiment, as BG2 instead of BM2, a designated table of TABLE 5.3.2-3 of 3GPP TS 38.213 may be used.

0: 0 1 2 3 5 6 9 10 11 12 13 15 16 18 19 20 21 22 23
1: 0 2 3 4 5 7 8 9 11 12 14 15 16 17 19 21 22 23 24
2: 0 1 2 4 5 6 7 8 9 10 13 14 15 17 18 19 20 24 25
3: 0 1 3 4 6 7 8 10 11 12 13 14 16 17 18 20 21 22 25
4: 0 1 26
5: 0 13 12 16 21 22 27
6: 0 6 10 11 13 17 18 20 28
7: 0 1 4 7 8 14 29
8: 0 13 12 16 19 21 22 24 30
9: 0 1 10 11 13 17 18 20 31
10: 1 2 4 7 8 14 32
11: 0 1 12 16 21 22 23 33
12: 0 1 10 11 13 18 34
13: 0 3 7 20 23 35
14: 0 12 15 16 17 21 36
15: 0 1 10 13 18 25 37
16: 13 11 20 22 38
17: 0 14 16 17 21 39
18: 1 12 13 18 19 40
19: 0 1 7 8 10 41
20: 0 3 9 11 22 42
21: 1 5 16 20 21 43
22: 0 12 13 17 44
23: 1 2 10 18 45
24: 0 3 4 11 22 46
25: 16 7 14 47
26: 0 2 4 15 48
27: 1 6 8 49
28: 0 4 19 21 50
29: 1 14 18 25 51
30: 0 10 13 24 52
31: 1 7 22 25 53
32: 0 12 14 24 54
33: 12 11 21 55
34: 0 7 15 17 56
35: 1 6 12 22 57
36: 0 14 15 18 58
37: 1 13 23 59
38: 0 9 10 12 60
39: 1 3 7 19 61
40: 0 8 17 62
41: 1 3 9 1863
42: 0 4 24 64

43: 1 16 18 25 65
44: 0 7 9 22 66
45: 16 10 67 . . . Equation 26
0: 0 1 2 3 6 9 10 11
1: 0 3 4 5 6 7 8 9 11 12
2: 0 1 3 4 8 10 12 13
3: 1 2 4 5 6 7 8 9 10 13
4: 0 1 11 14
5: 0 1 5 7 11 15
6: 0 5 7 9 11 16
7: 1 5 7 11 13 17
8: 0 1 12 18
9: 1 8 10 11 19
10: 0 1 6 7 20
11: 0 7 9 13 21
12: 13 11 22
13: 0 1 8 13 23
14: 16 11 13 24
15: 0 10 11 25
16: 19 11 12 26
17: 15 11 12 27
18: 0 6 7 28
19: 0 1 10 29
20: 1 4 11 30
21: 0 8 13 31
22: 1 2 32
23: 0 3 5 33
24: 1 2 9 34
25: 0 5 35
26: 2 7 12 13 36
27: 0 6 37
28: 1 2 5 38
29: 0 4 39
30: 2 5 7 9 40
31: 1 13 41
32: 0 5 12 42
33: 2 7 10 43
34: 0 12 13 44
35: 15 11 45
36: 0 27 46
37: 10 13 47
38: 1 5 11 48
39: 0 7 12 49
40: 2 10 13 50
41: 15 11 51 . . . Equation 27

For reference, the receiver may determine a block size shown in Equations 11 or 12, and may determine the parity check matrix of the LDPC code, which is required for performing decoding, based on the block size, base matrix BM1 of Equation 26, and the sequence (or exponent matrix) as in Equation 28 below. Equation 28 illustrates a case where the index is 0. Similarly, the receiver may determine a block size shown in Equations 11 or 12, and may determine the parity check matrix of the LDPC code, which is required for performing decoding by the receiver, based on the block size, base matrix BM2 of Equation 27, and the sequence (or exponent matrix) as in Equation 29 below. Equation 29 illustrates a case where the index is 0. In this case, the methods of Equations 8 to 10 may be applied to determining of the parity check matrix.

0: 250, 69, 226, 159, 100, 10, 59, 229, 110, 191, 9, 195, 23, 190, 35, 239, 31, 1, 0,
    1: 2, 239, 117, 124, 71, 222, 104, 173, 220, 102, 109, 132, 142, 155, 255, 28, 0, 0, 0,
    2: 106, 111, 185, 63, 117, 93, 229, 177, 95, 39, 142, 225, 225, 245, 205, 251, 117, 0, 0,
    3: 121, 89, 84, 20, 150, 131, 243, 136, 86, 246, 219, 211, 240, 76, 244, 144, 12, 1, 0,
    4: 157, 102, 0,
    5: 205, 236, 194, 231, 28, 123, 115, 0,
    6: 183, 22, 28, 67, 244, 11, 157, 211, 0,
    7: 220, 44, 159, 31, 167, 104, 0,
    8: 112, 4, 7, 211, 102, 164, 109, 241, 90, 0,
    9: 103, 182, 109, 21, 142, 14, 61, 216, 0,
    10: 98, 149, 167, 160, 49, 58, 0,
    11: 77, 41, 83, 182, 78, 252, 22, 0,
    12: 160, 42, 21, 32, 234, 7, 0,
    13: 177, 248, 151, 185, 62, 0,
    14: 206, 55, 206, 127, 16, 229, 0,
    15: 40, 96, 65, 63, 75, 179, 0,
    16: 64, 49, 49, 51, 154, 0,
    17: 7, 164, 59, 1, 144, 0,
    18: 42, 233, 8, 155, 147, 0,
    19: 60, 73, 72, 127, 224, 0,
    20: 151, 186, 217, 47, 160, 0,
    21: 249, 121, 109, 131, 171, 0,
    22: 64, 142, 188, 158, 0,
    23: 156, 147, 170, 152, 0,
    24: 112, 86, 236, 116, 222, 0,
    25: 23, 136, 116, 182, 0,
    26: 195, 243, 215, 61, 0,
    27: 25, 104, 194, 0,
    28: 128, 165, 181, 63, 0,
    29: 86, 236, 84, 6, 0,
    30: 216, 73, 120, 9, 0,
    31: 95, 177, 172, 61, 0,
    32: 221, 112, 199, 121, 0,
    33: 2, 187, 41, 211, 0,
    34: 127, 167, 164, 159, 0,
    35: 161, 197, 207, 103, 0,
    36: 37, 105, 51, 120, 0,
    37: 198, 220, 122, 0,
    38: 167, 151, 157, 163, 0,
    39: 173, 139, 149, 0, 0,
    40: 157, 137, 149, 0,
    41: 167, 173, 139, 151, 0,
    42: 149, 157, 137, 0,
    43: 151, 163, 173, 139, 0,
    44: 139, 157, 163, 173, 0,
    45: 149, 151, 167, 0 . . . Equation 28
    0: 9, 117, 204, 26, 189, 205, 0, 0,
    1: 167, 166, 253, 125, 226, 156, 224, 252, 0, 0,
    2: 81, 114, 44, 52, 240, 1, 0, 0,
    3: 8, 58, 158, 104, 209, 54, 18, 128, 0, 0,
    4: 179, 214, 71, 0,
    5: 231, 41, 194, 159, 103, 0,
    6: 155, 228, 45, 28, 158, 0,
    7: 129, 147, 140, 3, 116, 0,
    8: 142, 94, 230, 0,
    9: 203, 205, 61, 247, 0,
    10: 11, 185, 0, 117, 0,
    11: 11, 236, 210, 56, 0,
    12: 63, 111, 14, 0,
    13: 83, 2, 38, 222, 0,
    14: 115, 145, 3, 232, 0,
    15: 51, 175, 213, 0,
    16: 203, 142, 8, 242, 0,
    17: 254, 124, 114, 64, 0,
    18: 220, 194, 50, 0,
    19: 87, 20, 185, 0,
    20: 26, 105, 29, 0,
    21: 76, 42, 210, 0,
    22: 222, 63, 0, 23: 23, 235, 238, 0,
24: 46, 139, 8, 0,
25: 228, 156, 0,
26: 29, 143, 160, 122, 0,
27: 8, 151, 0,
28: 98, 101, 135, 0,
29: 18, 28, 0,
30: 71, 240, 9, 84, 0,
31: 106, 1, 0,
32: 242, 44, 166, 0,
33: 132, 164, 235, 0,
34: 147, 85, 36, 0,
35: 57, 40, 63, 0,
36: 140, 38, 154, 0,
37: 219, 151, 0,
38: 31, 66, 38, 0,
39: 239, 172, 34, 0,
40: 0, 75, 120, 0,
41: 129, 229, 118, 0 . . . Equation 29

Embodiment 1

According to embodiment 1, the receiver may determine a row block that is always used for decoding in the parity check matrix regardless of a code rate based on substantially supportable maximum code rate Rmax in the system. Supportable maximum code rate Rmax is a structural characteristic of the parity check matrix of the LDPC code when it is assumed that codeword bits transmitted after all rate matching are normally received under an assumption that there is no retransmission, and may refer to a maximum code rate enabling independent decoding. In addition, supportable maximum code rate Rmax may refer to a simple maximum code rate, such as code rate 1, which is theoretically possible regardless of the parity check matrix of the LDPC code.

The receiver may select, from among row blocks always used for decoding, a row block in which an LLR value is restorable from when first layered decoding is applied while satisfying condition 1) of <Conditions for determining layered decoding scheduling> even when parity puncturing has occurred, based on supportable maximum code rate Rmax. In this case, the row block in which an LLR value is restorable may refer to a degree-1 row block (i.e., having only one circulant permutation matrix) within a submatrix corresponding a column block to be punctured as described above.

For example, when Rmax is assumed to be a value close to 1, since LLR updating is always possible for row block 1 (referring to a second row block) in BM1 or BM2, the receiver may select row block 1 as a first row block of a layered decoding order or pattern. For example, if the decoding order or pattern is configured by indexes of row blocks according to the order of row blocks for decoding, a first number of the decoding order or pattern may be 1. If layered decoding is performed sequentially on other row blocks after layered decoding of the first row block, the layered decoding order or pattern may be expressed in the form of [1, 0, 2, 3, 4, . . . 45] for BM1 and in the form of [1, 0, 2, 3, 4, . . . , 41] for BM2.

If the layered decoding order or pattern is fixed as in the above, the receiver may modify and store the order of row blocks of the base matrices of Equations 26 and 27 or corresponding exponent matrices or parity check matrices, and then may perform layered decoding. For example, the receiver may swap first two row blocks, i.e., a zeroth row block and a first row block, of BM1 in Equation 26 as shown below, store the same, and then sequentially perform layered decoding.

0: 0 2 3 4 5 7 8 9 11 12 14 15 16 17 19 21 22 23 24
1: 0 1 2 3 5 6 9 10 11 12 13 15 16 18 19 20 21 22 23

Similarly, the receiver may swap a zeroth row block and a first row block also for BM2 as shown below, so as to sequentially perform layered decoding.

0: 0 1 2 3 6 9 10 11
1: 0 3 4 5 6 7 8 9 11 12

Without additional implementation costs, when the first embodiment is applied, performance improvement is identified. More particularly, when a code rate is high (e.g., 0.9 or higher for BG #1, and 0.8 or higher for BG #2), corresponding performance is identified, and adaptive application of the first embodiment based on the code rate may also be understood as a part of the embodiment of the disclosure. This is because performance gain is rather low at a low code rate.

Embodiment 1 describes an example of preferentially decoding row block 1, but the embodiment of the disclosure is not limited thereto. For example, layers or row blocks may be rearranged so that row blocks other than row block 1 are preferentially decoded. According to an embodiment, among degree-1 row blocks within a submatrix corresponding to a column block to be punctured, a random row block or a row block satisfying a predetermined criterion may be preferentially decoded. Hereinafter, a row block to be rearranged or relocated may be referred to as a priority row block, a higher priority row block, a priority layer, or a higher priority layer so as to be described. The layered decoding may be performed based on a layer (i.e., a higher priority layer) corresponding to the row block (i.e., a higher priority row block) to be preferentially decoded. In this case, the layer may include a row block having orthogonality or quasi-orthogonality from among row blocks adjacent to the row block to be preferentially decoded.

Embodiment 2

Similar to embodiment 1, row block 1 is configured as a row block to be decoded first.

In order to improve performance by reflecting characteristics of condition 2) of <Conditions for determining layered decoding scheduling>, the receiver may perform layered decoding on the first row block and then may perform decoding on the remaining row blocks in a reverse order.

To this end, the receiver may determine a TBS or CBS value, determine which base matrix among base matrices BM1 and BM2 is used, determine block size Z, and perform desegmentation. Thereafter, the receiver may determine codeword bits Er transmitted after rate matching with respect to an $r^{th}$ code block, based on the determined value, an allocated resource, a modulation scheme, and the like. However, in the 3GPP 5G communication system, when transmission is required for a case where a bit number of ACK or NACK, which is an acknowledgment signal, is 1 or 2, an effect such that a part of CSI-part2 and/or uplink-shared channel (UL-SCH) (data) is punctured may occur. Therefore, some of bits Er may not actually be transmitted, but the receiver may consider that corresponding transmitted codeword bits have also been transmitted, wherein codeword bits at corresponding positions are configured so that LLR=0, and the codeword bits are processed like punctured bits. In other words, the transmitted codeword bit Er value may refer to an actually physically transmitted bit from the transmitter, but may also indicate, in some cases, a codeword bit size for which the receiver may determine that bits have been transmitted.

If the transmitted codeword bit number Er is identified, the receiver may obtain the number of effective (or actually affecting performance) row blocks of the parity check matrix or the number $N_{RowBlk}$ of rows of the base matrix during encoding/decoding as in Equation 30.

$$N_{RowBlk} = \left\lceil \frac{E_r - (K_b - K_{punc}) \times Z}{Z} \right\rceil = \left\lceil \frac{E_r}{Z} \right\rceil - (K_b - K_{punc}) \qquad \text{Equation 30}$$

Here, $K_b$ denotes the number of column blocks which are actually used while corresponding to information word bits in the parity check matrix, for LDPC encoding of a code block given in the base matrix, $K_{punc}$ denotes the number of column blocks corresponding to bits, to which puncturing is applied, from among the information word bits or code blocks, and $N_{RowBlk\_Total}$ denotes a total number of row blocks defined in the parity check matrix given in the system. In general, if transmission is performed via sufficient resources, when rate matching is applied, some bits can be repetitively transmitted, and a value of $$\left\lceil \frac{E_r}{Z} \right\rceil - (K_b - K_{punc})$$

can be thus greater than an $N_{RowBlk\_Total}$ value, so that a maximum value for the maximum number of row blocks required for LDPC decoding may be configured to be $N_{RowBlk\_Total}$ as shown in Equation 30.

Equation 30 is an example of a method of obtaining a total number of row blocks or layers required for LDPC decoding for initial transmission. For retransmission, an Er value may be changed due to rate matching corresponding to different RV values or different allocated resource amounts, and thus a value different from the $N_{RowBlk}$ of Equation 30 (determined during initial transmission) may be determined. As a specific example, when it is assumed that rate matching is performed based on RV0 and coded bits are transmitted for initial transmission, and rate matching is performed based on RV2 and coded bits are transmitted for retransmission, bits between the last bit of the initial transmission and a bit corresponding to a starting point of RV2 may be neither transmitted nor received even once depending on the transmission code rate. Therefore, information on the number or positions of layers or row blocks necessarily required for LDPC decoding can be accurately determined based on the maximum number $N_{RowBlk\_Total}$ of row blocks, an RV value (e.g., RV(i)) corresponding to rate matching, a resource amount Er(i) determined according to each i-th transmission, and the like.

However, since the values of Er(i), RV(i), or the like, are variable depending on initial transmission and retransmission situations, it may be somewhat complicated to accurately identify the number or positions of required row blocks or layers, and to adjust decoding scheduling optimized according to the variable row blocks or layers. Therefore, if both initial transmission and retransmission are considered, the number of row blocks or layers necessary for LDPC decoding may be roughly determined based on an index of the last column among columns of the parity check matrix of the LDPC code corresponding to transmitted coded bits, rather than accurately determining the numbers and positions of necessary (i.e., substantially affecting performance of LDPC decoding) row blocks or layers, based on the number of the transmitted coded bits.

For example, even if some rows in the middle of the parity check matrix do not substantially affect the LDPC decoding performance and, therefore, are not needed according to the number of initially transmitted or retransmitted coded bits and an RV value corresponding thereto, when a position or index of the last communication among columns of the parity check matrix corresponding to all the transmitted coded bits is referred to as (D−1), LDPC decoding may be decoded based on a submatrix of the parity check matrix, for which it has been assumed that all columns subsequent to a D-th column and rows corresponding thereto do not exist. In some cases, this scheme has a problem that unnecessary decoding operations may be added due to rows that do not substantially affect LDPC decoding performance, but in all cases of implementation based on HW and SW, layer scheduling for layered decoding can be simply implemented.

As a specific example, the initially transmitted LDPC coded bits are mapped 1:1 to columns of the parity check matrix, wherein an index corresponding to the last column among the columns is referred to as D(0). This may refer to the last index for a value (e.g., LLR) obtained by performing demodulation on a received signal corresponding to the transmitted LDPC code bits by the rate dematching unit of the receiver, and may refer to, when a circular buffer is assumed, the last index storing a message (e.g., LLR) value or the value obtained via demodulation.

When the last index of the columns of the parity check matrix corresponding to the received message values (e.g., LLR values) corresponding to the coded bits transmitted during the initial transmission is referred to as D(0), and the last index of the columns of the parity check matrix corresponding to the message values corresponding to coded bits transmitted according to i-th retransmission is referred to as D(i), a largest value thereof is referred to as D*=max(D(0), D(1), . . . ). (For convenience of description, each index D(i) may be referred to as a last index of the coded bit, an index of a received message, or an LLR index.) D* may be used to determine an actual layer and may be implemented based on Equation 31 below. On the other hand, when LDPC encoding/decoding based on the parity check matrix corresponding to the base matrix of Equation 26 is performed, a maximum value of the number of columns in the parity check matrix is 68*Z, so that each D(i) value has a value smaller than 68*Z, and when LDPC encoding/decoding based on the parity check matrix corresponding to the base matrix of Equation 27 is performed, a maximum value of the number of columns in the parity check matrix is 52*Z, so that the value of index D(i) has a value smaller than 52*Z.

As a result, for LDPC decoding, $N_{ColBlk} = \lceil D^*/Z \rceil$ column blocks may be required in the parity check matrix. In addition, in general, if the structure of the parity check matrix of FIGS. 14 to 16 is satisfied like the parity check matrices corresponding to the base matrices of Equations 26 and 27, $K_b^* + M_1$ column blocks and at least $M_1$ row block may be required for LDPC decoding. Here, $K_b^*$ denotes the total number of column blocks that may correspond to information word bits in the parity check matrix, and $M_1$ denotes the number of row blocks corresponding to submatrix $\lceil A\ B \rceil$ having a degree of 2 or greater in the parity check matrix. For example, $K_b^*=22$ and $M_1=4$ for the base matrix of Equation 26 or the parity check matrix corresponding thereto, and $K_b^*=10$ and $M_1=4$ for the base matrix of Equation 27 or the parity check matrix corresponding thereto. Therefore, the number of column blocks required for LDPC decoding may be expressed as $N_{ColBlk}=\min(\lceil D^*/Z \rceil, K_b^*+M_1)$, and the number of substantially required columns of the parity check matrix is equal to or less than $N_{Col}=\min(\lceil D^*/Z \rceil, K_b^*+M_1) \times Z$.

For reference, if LLR messages or respective received messages corresponding to the last index D(i) or lower of the received message or LLR values are received redundantly, the messages may be properly combined and stored in a memory (e.g., an LLR memory and a buffer memory) for decoding. For example, if LDPC decoding is performed based on LLR values, combination may be performed by adding LLR values corresponding to the same coded bit.

The number of row blocks or layers required for LDPC decoding may be determined, as in Equation 31 below, from the number of column blocks required for LDPC decoding.

$$N_{RowBlk}=\min(\lceil D^*/Z \rceil, K_b^*+M_1)-K_b^* \quad\quad \text{Equation 31}$$

If $M_1=4$ is fixed as in the base matrices of Equations 26 and 27, $M_1=4$ may be replaced in Equation 31. In addition, a value of $N_{RowBlk\_Total}$ corresponding to the base matrix of Equation 26 is 46, and a value of $N_{RowBlk\_Total}$ corresponding to the base matrix of Equation 27 is 42, so that a value of $N_{RowBlk}$ may have a value of 46 or a value of 42 or smaller depending on the base matrix.

In addition, the number of rows which are actually required for LDPC decoding and substantially affects LDPC decoding may $$N_{RowBlk} \times Z = (\min(\lceil \tfrac{D^*}{Z} \rceil, K_b^* + M_1) - K_b^*) \times Z$$

or fewer.

If successive shortening by specific bits (hereinafter, referred to as F bits) among LDPC information word bits is applied, the number of column blocks substantially affecting LDPC decoding may be represented as $$N_{ColBlk} = \min(\lceil D^*/Z \rceil, K_b^* + M_1) - \lceil \tfrac{F}{Z} \rceil.$$

This value also refers to the number of column blocks actually required for LDPC decoding, and the number of columns actually required for LDPC decoding is $$N_{Col} = (\min(\lceil \tfrac{D^*}{Z} \rceil, K_b^* + M_1) - \lceil \tfrac{F}{Z} \rceil) \times Z$$

or fewer. As such, even if the number of column blocks substantially required for LDPC decoding is changed due to shortening of information word bits, the number of required row blocks may not change.

In this way, the number of column blocks or row blocks required for LDPC decoding may be determined based on lifting size Z and last index D* corresponding to the received message value, the number $K_b^*$ of column blocks that may correspond to information word bits, the number $M_1$ of row blocks corresponding to submatrix [A B] in which all columns have a degree of 2 or greater in FIG. 14, and all or at least some of parameters, such as the number of shortened bits, F value.

As a specific example, with reference to 3GPP standard specification document TS 38.212, it is assumed that TBS=5632 bits (including CRC 16 bits), a code rate according to an MCS index is greater than ⅔, and Er=7632. Under these conditions, BM1 is determined as a base matrix for LDPC encoding, and a block size is also determined so that Z=5632/22=256. For 3GPP standard TS 38.212, $K_{punc}=2$ is fixed, and when BM1 is used, $K_b$ is always 22 so that $$N_{RowBlk} = \lceil \tfrac{11072}{256} \rceil - 20 = 10.$$

For example, a total of 10 row blocks in the parity check matrix substantially affect LDPC encoding/decoding performance.

As another specific example, with reference to 3GPP standard specification document TS 38.212, it is assumed that TBS=3840 bits (including CRC 16 bits), a code rate according to an MCS index is less than ⅔, and Er=11072. Under these conditions, BM2 is determined as a base matrix for LDPC encoding, and a block size is also determined so that Z=384. For 3GPP standard TS 38.212, $K_{punc}=2$ is fixed, and $K_b=10$ when TBS=3840, so that $$N_{RowBlk} = \lceil \tfrac{11072}{384} \rceil - 8 = 21.$$

For example, a total of 21 row blocks in the parity check matrix substantially affect LDPC encoding/decoding performance.

As a result, when layered decoding is first performed on row block 1, and decoding is performed on the remaining row blocks in reverse order, the order or pattern of layered scheduling may be expressed as [1, ($N_{Rowblk}$−1), ($N_{Rowblk}$−2), . . . , 3, 2, 0].

In some cases, if the last Er value is not a multiple of the block size Z value so that parity bits corresponding to some of last ($N_{Rowblk}$−1)th row blocks are punctured, information word bits connected to the punctured parity bits on the Tanner graph are not immediately decoded when layered decoding is first applied. Therefore, in some cases, the order or pattern may be applied in a slightly modified form, such as [1, ($N_{Rowblk}$−2), ($N_{Rowblk}$−1), ($N_{Rowblk}$−3), . . . 3, 2, 0].

In the disclosure, a general definition of reverse-order layered decoding is applying layered decoding first by prioritizing at least one of "row blocks or layers corresponding to degree-1 parity bits", and decoding the remaining row blocks or layers in reverse order. If there is no degree-1 parity bit, this indicates that decoding is performed in reverse order from the last row block or layer of the parity check matrix. For an LDPC system using base matrices, such as BM1 in Equation 26 and BM2 in Equation 27, condition 1) in <Conditions for determining layered decoding scheduling> is additionally considered so that a modified order or pattern may be applied as follows.

[1, [($N_{Rowblk}$−4) row blocks corresponding to degree-1 parity bits], . . . , 3, 2, 0]

When reverse-order layered decoding is applied, a decoding order or pattern may be predetermined for some specific row blocks. For example, in the communication system based on the base matrices of Equations 26 or 27, if a decoding order of parity bits corresponding to column blocks having a degree other than 1 is separately defined in advance according to requirements, the reverse order pattern can be variously modified. More specifically, if the order of first four row blocks in the base matrices of Equations 26 and 27 is configured to always satisfy the order of [1, 0, 2, 3], the reverse order pattern can be modified as follows: [1, [$N_{Rowblk}$−4 row blocks corresponding to degree-1 parity bits], 0, 2, 3], [1, 0, [$N_{Rowblk}$−4 row blocks corresponding to degree-1 parity bits], 2, 3], [1, 0, 2, [$N_{Rowblk}$−4 row blocks corresponding to degree-1 parity bits], 3], or [1, 0, 2, 3, [$N_{Rowblk}$−4 row blocks corresponding to degree-1 parity bits]].

When the second embodiment is applied, performance improvement (about 0.15 dB) can be achieved even in a wide range of code rates and lengths. Accordingly, the embodiment may be applied when performance improvement is required even based on additional implementation costs for rate matching of a base graph.

Embodiment 2 describes an example of preferentially decoding a first row block, but the embodiment of the disclosure is not limited thereto. For example, layers or row blocks may be rearranged so that row blocks other than row block 1 are preferentially decoded. According to an embodiment, among degree-1 row blocks within a submatrix corresponding to a column block to be punctured, a random row block or a row block satisfying a predetermined criterion may be preferentially decoded. Hereinafter, a row block to be rearranged or relocated may be referred to as a priority row block, a higher priority row block, a priority layer, or a higher priority layer so as to be described. The layered decoding may be performed based on a layer (i.e., a higher priority layer) corresponding to the row block (i.e., a higher priority row block) to be preferentially decoded. In this case, the layer may include a row block having orthogonality or quasi-orthogonality from among row blocks adjacent to the row block to be preferentially decoded.

Embodiment 3

The receiver may determine a TBS or CBS value, determine which base matrix among base matrices BM1 and BM2 is used, determine block size Z, and perform desegmentation. When BM1 is determined as a base matrix for LDPC encoding/decoding, if code rate R is greater (or equal to or greater than) than reference code rate $R_{BM(1)}$, the receiver may configure an $X_{BM(1)}$th row block as a row block to be first decoded. When BM2 is determined, if code rate R is greater (or equal to or greater than) than reference code rate $R_{BM(2)}$, an $X_{BM(2)}$th row block may be configured as a row block to be first decoded. Here, $R_{BM(1)}$ and $R_{BM(2)}$ may have the same value or may have different values. (For convenience of description, the base matrices BM1 and BM2 are also expressed as BM(i), i=1, 2.)

If BM1 is used for LDPC encoding/decoding, and code rate R is smaller than or equal to (or smaller than) reference code rate $R_{BM(1)}$, the receiver may configure a $Y_{BM(1)}$-th row block as a row block to be first decoded by simultaneously considering condition 1) and condition 2) of <Conditions for determining layered decoding scheduling>. Similarly, if BM2 is used for LDPC encoding/decoding, and code rate R is less than or equal to (or less than) reference code rate $R_{BM(2)}$, the receiver may configure a $Y_{BM(2)}$-th row block as a row block to be first decoded.

In this way, a position of the row block, at which layered decoding first starts, may be variably determined according to a code rate. In summary, the order or pattern of layered decoding may be defined as follows:

i) in case R>$R_{BM(i)}$ (or R≥$R_{BM(i)}$); [$X_{BM(i)}$, . . . ],
ii) in case R≤$R_{BM(i)}$ (or R<$R_{BM(i)}$); [$Y_{BM(i)}$, . . . ].

In this case, values of $X_{BM(1)}$, $X_{BM(2)}$, $Y_{BM(1)}$, and $Y_{BM(2)}$ may be determined to be one of row blocks having a degree or weight of 1 within zeroth and first column blocks to which puncturing is applied. For example, $Y_{BM(1)}$ which is selected if code rate R is less than the reference code rate may be determined as an index of a row block having the lower degree or less weight of the entire row block compared to $X_{BM(1)}$ from among degree-1 row blocks in a corresponding column block. However, the embodiment of the disclosure is not limited thereto, and $Y_{BM(1)}$ which is selected if code rate R is less than the reference code rate may be determined as an index of a row block having the higher degree or greater weight of the entire row block compared to $X_{BM(1)}$ from among degree-1 row blocks in a corresponding column block. A method of determining $Y_{BM(1)}$ and $X_{BM(1)}$ may be predetermined or configured in the receiver. In this case, the method may be determined based on decoding stability, efficiency, and the like.

As a specific embodiment, referring to the exponent matrix of FIG. 15, the base matrix of Equation 24 corresponding thereto, or the base matrix of Equation 26 including Equation 24, weight-1 row blocks within zeroth and first column blocks to which information word bit (or code block) puncturing is always applied are row block 1 and row block 6. Therefore, an Er value where all 7 row blocks are not used or code rate $$\frac{K_b}{K_b - 2 + 7} = \frac{22}{27}$$

corresponding to the Er value is defined as reference code rate $R_{BM(1)}$, and if R>22/27 is satisfied, the order or pattern of layered decoding is defined as [1, . . . ], otherwise, the order or pattern, such as [6, . . . ] may be applied. (For the order or pattern of [1, . . . ], [6, . . . ], or the like, another pattern, such as a reverse order pattern may be applied with respect to a pattern subsequent to the first row block.)

As a specific embodiment, referring to the exponent matrix of FIG. 16, the base matrix of Equation 25 corresponding thereto, or the base matrix of Equation 27 including Equation 25, weight-1 row blocks within zeroth and first column blocks to which information word bit (or code block) puncturing is always applied are row block 1 and row block 6 (e.g., or row blocks 1, 3, and 6). Therefore, an Er value where all 7 row blocks are not used or a maximum value $$\frac{K_b}{K_b - 2 + 7} = \frac{10}{15}$$

of code rate corresponding to the Er value is defined as reference code rate $R_{BM(2)}$, and if R>10/15 is satisfied, the order or pattern of layered decoding is defined as [1, . . . ], otherwise, the order or pattern, such as [6, . . . ] may be applied.

For the orders or patterns subsequent to the first row block in the orders or patterns of the specific embodiments, various patterns, such as the reverse order pattern described in embodiment 2 may be applied as follows.

in case $R > R_{BM(i)}$ (or $R \geq R_{BM(i)}$);
 [$X_{BM(i)}$, ($N_{RowBlk}$-1), ($N_{RowBlk}$-2), . . . , ($X_{BM(i)}$+1), ($X_{BM(i)}$-1), . . . ],
 in case $R \leq R_{BM(i)}$ (or $R < R_{BM(i)}$);
 [$Y_{BM(i)}$, ($N_{RowBlk}$-1), ($N_{RowBlk}$-2), . . . , ($Y_{BM(i)}$+1), ($Y_{BM(i)}$-1) . . . ], When a specific example of BM1 in Equation 26 is described, if R>22/27 and the $N_{RowBlk}$ value is 7, a decoding order or pattern, such as [1, 6, 5, 4, 3, 2, 0] may be applied, and if R≤22/27, a decoding order or pattern, such as [6, 5, 4, 3, 2, 1, 0] may be applied. In general, if $N_{RowBlk}$ is 8, the decoding order or pattern may be [6, 7, 5, 4, 3, 2, 1, 0], and if $N_{RowBlk}$ is greater than 8, a decoding order or pattern, such as [6, ($N_{RowBlk}$-1), ($N_{RowBlk}$-2), . . . , 7, 5, 4, 3, 2, 1, 0] may be applied.

In the embodiment, for convenience of description, a case where a reference code rate is one has been described, but multiple reference code rates can be configured, and the order or pattern of layered decoding may also be configured differently accordingly. (Not all orders or patterns need to be different, but at least two different orders or patterns may be defined.)

In the embodiment, a case where a code rate is configured as a criterion for varying the order or pattern of layered decoding has been described, but embodiments of the disclosure are not limited thereto. For example, as in embodiment 2, a variable criterion may be configured to be an Er value, the number $N_{RoWBlk}$ of row blocks actually used in a base matrix or a parity check matrix, or the like. The receiver may determine a reference value, such as a reference $N_{RoWBlk}$, BM(i) for the number of row blocks for $BM_{(i)}$, compare the same with a value of $N_{RoWBlk}$, and apply an order or a pattern variably.

As in a case of using BM2 for LDPC encoding in the 3GPP 5G standard, if the number $K_b$ of actually used column blocks in a submatrix corresponding to an information word part in a parity check matrix according to a TBS or a CBS is variable, the submatrix actually used in the parity check matrix for LDPC encoding and decoding varies. Therefore, the order or pattern of layered decoding, for which performance is optimized, may also vary according to $K_b$, and a different layered decoding order or pattern may be applied according to a TBS or a CBS. According to an embodiment, if a $K_b$ value is defined differently according to a TBS, a reference code rate presented in the embodiment may be changed according to the TBS. In this case, a pre-defined specific value may be defined as a reference code rate.

When the third embodiment is applied, performance improvement can be achieved even in a wide range of code rates and lengths. Accordingly, the embodiment may be applied when performance improvement is required even based on additional implementation costs for rate matching of a base graph.

In addition, the layered decoding may be performed based on a layer (i.e., a priority layer) corresponding to the row block (i.e., a higher priority row block) to be preferentially decoded. In this case, the layer may include a row block having orthogonality or quasi-orthogonality from among row blocks adjacent to the row block to be preferentially decoded.

Embodiment 4

According to a base matrix, there may be a weight-0 row block in a column block corresponding to information word bits (or code blocks) to which puncturing is to be applied. These row blocks can be LLR-updated even when layered decoding is first performed. Accordingly, when determining the order or pattern of layered decoding scheduling, the receiver may prioritize these row blocks to perform decoding. In other words, the receiver may first decode a row block having a degree of 0 with respect to a column block to be punctured in a parity row of a code block. The corresponding row block may be referred to as a highest priority row block, a highest priority layer, a highest priority order row block, or a highest priority order layer.

In this case, the receiver may determine an $N_{Rowblk}$ value from Equation 30 and then may perform layered decoding for all weight-0 row blocks (hereinafter, puncturing row blocks) within the column block corresponding to the information word bits to which puncturing is to be applied from among $N_{Rowblk}$ row blocks (For the row blocks, reverse order layered decoding may be performed or forward layered decoding may be performed). Thereafter, the receiver may perform layered decoding on the remaining row blocks by combining at least one of the methods presented in embodiment 1), embodiment 2), and embodiment 3) together. In addition, the layered decoding may be performed based on a layer (i.e., a priority layer) corresponding to the row block (i.e., a higher priority row block) to be preferentially decoded. In this case, the layer may include a row block having orthogonality or quasi-orthogonality from among row blocks adjacent to the row block to be preferentially decoded.

Embodiment 5

Depending on the number of row blocks actually used for decoding in a parity check matrix, the optimal order or pattern of layered decoding may be different. However, in general, if a code rate is low, a performance difference decreases, and if a code rate is high, the performance difference is relatively large, so that, if the order or pattern of layered decoding is optimized for a high code rate by using a greedy algorithm and then the order or pattern for a low code rate is optimized based on a result thereof, a sub-optimized sequence or pattern may be derived as a simple form of sequence. In the disclosure, a method for maximizing performance according to transmitted codeword length Er is proposed even though complexity increases to some extent. Hereinafter, a proposed is a nested-sequence approach (NSA) layered decoding method of storing the order or pattern of layered decoding, by using a sequence having a nested structure (or overlapping structure), and then performing subsequent decoding.

If the greedy algorithm is appropriately used while considering conditions 1), 2), 3), and 4) of <Conditions for determining layered decoding scheduling>, the decoding order or pattern of the nested structure showing stable performance may be determined according to a TBS or a code rate.

As a specific example, the following sequence is defined as the order or pattern of layered decoding based on base matrix BM1 corresponding to Equation 26 (respective entries correspond to a total of 46 columns of the matrix):
Pattern 5-1:
 [42, 40, 26, 34, 37, 45, 30, 32, 22, 28, 38, 44, 41, 20, 27, 25, 31, 36, 39, 13, 33, 35, 24, 29, 43, 17, 23, 18, 21, 14, 6, 10, 16, 1, 4, 19, 7, 12, 15, 9, 5, 11, 8, 0, 2, 3]

In this case, it is identified that a degree between a check node of a 42nd row block and a column block corresponding to a puncturing part is 1. The receiver identifies one (e.g., 42nd row block) of at least one degree-1 row block from the parity check matrix, that is, embodiment 1) is applied, thereby identifying that pattern 5-1 is derived.

Similarly, the following sequence is defined as the order or pattern of layered decoding based on base matrix BM2 corresponding to Equation 27 (respective entries correspond to a total of 42 columns of the matrix):
Pattern 5-2:

[22, 37, 40, 31, 24, 29, 20, 12, 27, 25, 28, 35, 38, 41, 32, 23, 34, 39, 17, 16, 36, 21, 33, 18, 15, 9, 14, 30, 11, 19, 6, 7, 8, 26, 10, 13, 1, 4, 5, 0, 2, 3]

In this case, it is identified that a degree between row block 22 and a column block corresponding to a puncturing part is 1. The receiver identifies one (e.g., 22nd row block) of at least one degree-1 row block from the parity check matrix, that is, embodiment 1) is applied, thereby identifying that pattern 5-2 is derived.

However, the decoding order or pattern of the nested structure of the disclosure is not limited to the described order or pattern. For example, it is obvious that embodiments of the disclosure are applicable to the decoding order or pattern of the nested structure generated using the greedy algorithm.

In addition, numbers included in the order or pattern may correspond to row block indexes of the parity check matrix or row block indexes of the base matrix.

Hereinafter, a method of using pattern-1 and pattern-2 will be described below.

First, the receiver determines, based on Equation 30, the number $N_{RowBlk}$ of row blocks which affect performance or are actually used in a given base matrix or a parity check matrix corresponding thereto (in the disclosure, it is described that the determination is made based on Equation 30, but the determination may be made in other ways). Subsequently, the receiver selects only a sequence having values smaller than $N_{RowBlk}$ from the sequences of pattern-1 or pattern-2, and then applies the selected sequence as the order or pattern of layered decoding used for actual decoding. For convenience of description, the method may be referred to as an NSA layered decoding method.

As a specific embodiment, when LDPC decoding based on the base matrix of Equation 27 is performed, it is assumed that TBS=3840 bits (including CRC 16 bits), a code rate according to an MCS index is less than 2/3, and Er=11072. For the 3GPP standard TS 38.212, under these conditions, BM2 is determined as a base matrix for LDPC encoding, a block size is also determined to be Z=384, and $K_{punc}$=2 is fixed. If TBS=3840, $K_b$=10, and thus $$N_{RowBlk} = \left\lceil \frac{11072}{384} \right\rceil - 8 = 21.$$

For example, a total of 21 row blocks in the parity check matrix substantially affect LDPC encoding/decoding performance. In this case, a sequence including only numbers smaller than an $N_{RowBlk}$ value of 21 is selected from the sequence of pattern-2. For example, a sequence (or pattern) including only indexes of effective row blocks in the sequence of pattern-2 may be determined.

The indexes of effective row blocks in the sequence of pattern-2 are shown below.

[22, 37, 40, 31, 24, 29, <u>20</u>, <u>12</u>, 27, 25, 28, 35, 38, 41, 32, 23, 34, 39, <u>17</u>, <u>16</u>, 36, 21, <u>33</u>, <u>18</u>, <u>15</u>, <u>9</u>, <u>14</u>, 30, <u>11</u>, <u>19</u>, <u>6</u>, <u>7</u>, <u>8</u>, 26, <u>10</u>, <u>13</u>, <u>1</u>, <u>4</u>, <u>5</u>, <u>0</u>, <u>2</u>, <u>3</u>]

Accordingly, the order or pattern determined based on the indexes of effective row blocks in the sequence of pattern-2 is as follows.

[20, 12, 17, 16, 18, 15, 9, 14, 11, 19, 6, 7, 8, 10, 13, 1, 4, 5, 0, 2, 3]

The selected sequence [20, 12, 17, 16, 18, 15, 9, 14, 11, 19, 6, 7, 8, 10, 13, 1, 4, 5, 0, 2, 3] refers to a layered decoding pattern to be applied in an LDPC decoder, and LPDC decoding according to the decoding pattern indicates that one cycle of iterative decoding is performed by sequentially performing layered decoding starting from layered decoding of a 20th row block to layered decoding of a 3rd row block.

The NSA layered decoding scheme can be modified in various forms as well as according to the embodiment described above. For example, if the Er value is not a multiple of Z in Equation 30, some of parity bits corresponding to last ($N_{RowBlk}$−1) row blocks correspond to a value of LLR=0, so that, for the NSA layered decoding scheme, a sequence including only numbers smaller than ($N_{RowBlk}$−1) is selected to perform corresponding layered decoding, wherein layered decoding may be performed for an ($N_{RowBlk}$−1)th row block in a predefined order. For example, when it is assumed that layered decoding is applied to the ($N_{RowBlk}$−1)th row block always an i-th time, a value of ($N_{RowBlk}$−1) may be applied between an (i−1)th number and an i-th number in the order or pattern configured by the sequence including only numbers smaller than ($N_{RowBlk}$−1).

As a specific embodiment, an assumption is made to a case where it is appointed in the system that the last ($N_{RowBlk}$−1)th row block is always applied first after zeroth layered decoding. If it is assumed, as in the described embodiment, that TBS=3840 bits (including 16 bits of CRC), a code rate according to an MCS index is less than 2/3, and Er=11072, in order to apply row block 20 which is the ($N_{RowBlk}$−1)th row block to a first row block instead of applying [20, 12, 17, 16, 18, 15, 9, 14, 11, 19, 6, 7, 8, 10, 13, 1, 4, 5, 0, 2, 3] as the order of pattern of layered decoding, positions of "12" and "20" may be switched as shown in [12, 20, 17, 16, 18, 15, 9, 14, 11, 19, 6, 7, 8, 10, 13, 1, 4, 5, 0, 2, 3].

The method described above is merely an example, and an NSA layered decoding scheme properly combined with other techniques may exist based on various sequences of the nested structure.

Embodiment 6

In the embodiments, descriptions are provided basically on an assumption that some of information word bits (or code blocks) are always punctured. However, in a case where information word bit puncturing may not be applied depending on a situation in the system, the proposed method of configuring the order or pattern for layered decoding scheduling may not provide optimal performance.

For example, if puncturing is not applied, an LLR value is updated no matter which layer is decoded first, so that reverse-order layered decoding may be performed based on condition 2) of <Conditions for determining layered decoding scheduling>, and of puncturing is applied, various methods proposed in the embodiments, or the like, may be applied.

In conclusion, the receiver may perform layered decoding according to whether some of information word bits or code blocks are punctured, wherein the layered decoding is performed based on a first pattern if puncturing is performed, and the layered decoding is performed based on a second pattern if puncturing is not performed. Performance improvement can be achieved by adaptively configuring a pattern according to whether some of information word bits or code blocks are punctured.

Embodiment 7

If implementation complexity is not a significant problem, the receiver may perform layered decoding using multiple sequences or patterns optimized based on a base matrix, a code rate, or a modulation order of each LDPC code.

For example, in a case of a system using some of modulation schemes, such as QPSK, 16QAM, 64QAM, 256QAM, and 1024QAM, by using an LDPC base matrix corresponding to base matrix BM1 corresponding to Equation 26, the receiver may perform LDPC decoding by applying the following sub-optimal orders or patterns (or sequences) of layered decoding according to respective modulation schemes to be used.

Pattern 7-1: Sequence or Pattern for QPSK or 4QAM
[42, 27, 40, 37, 45, 25, 29, 31, 39, 23, 33, 26, 28, 36, 34, 30, 32, 35, 44, 38, 41, 43, 22, 13, 21, 17, 24, 14, 10, 16, 20, 18, 6, 1, 4, 19, 7, 15, 12, 11, 5, 9, 8, 0, 2, 3]

Pattern 7-2: Sequence or Pattern for 16-QAM
[42, 27, 40, 37, 45, 25, 29, 41, 23, 31, 39, 33, 26, 28, 34, 32, 44, 35, 38, 30, 36, 43, 22, 24, 10, 18, 21, 16, 13, 17, 20, 14, 6, 1, 4, 19, 7, 12, 15, 5, 9, 11, 8, 0, 2, 3]

Pattern 7-3: Sequence or Pattern for 64-QAM
[27, 45, 26, 40, 42, 44, 25, 34, 39, 38, 36, 41, 22, 37, 32, 30, 20, 10, 24, 28, 23, 29, 18, 33, 35, 31, 16, 13, 21, 17, 43, 14, 19, 6, 1, 4, 7, 12, 15, 9, 5, 11, 8, 0, 2, 3]

Pattern 7-4: Sequence or Pattern for 256-QAM
[27, 45, 26, 42, 38, 25, 37, 41, 39, 32, 40, 23, 30, 34, 44, 36, 20, 22, 28, 24, 10, 35, 33, 29, 43, 31, 18, 13, 17, 16, 21, 14, 6, 19, 1, 4, 7, 12, 15, 5, 9, 11, 8, 0, 2, 3]

Pattern 7-5: Sequence or Pattern for 1024-QAM
[45, 44, 42, 40, 39, 38, 37, 34, 27, 33, 26, 28, 25, 41, 23, 35, 22, 20, 32, 24, 36, 10, 43, 29, 21, 31, 13, 30, 17, 16, 18, 14, 6, 19, 1, 4, 7, 12, 9, 5, 15, 11, 8, 0, 2, 3]

An LLR for each received bit may vary depending on a modulation symbol via which transmission is performed. In an n-PSK modulation scheme, such as BPSK or QPSK, a reception end has the same demodulation environment for each symbol. This is because Euclidean distances between respective constellation points from the center of a constellation are the same. Therefore, the same reliability between constellation points may be formed. However, for 16 QAM, 64 QAM, and 256 QAM to be described later, since the Euclidean distances between the center point of the constellation and respective constellation points are different, channel reliability may be formed differently for each symbol. Therefore, if the transmitter transmits data bits according to each modulation scheme or degree, the receiver appropriately demodulates a received signal according to each modulation method or degree to determine an LLR value for each received data bit, and then performs layered decoding based on the LLR value and the patterns.

As described above, the embodiment of the disclosure may be applied when decoding is performed based on a layer including one or more row blocks. For example, if a row block (i.e., a higher priority row block) to be decoded preferentially among degree-1 row blocks in embodiment 1 or 2 is determined, decoding may be performed on a layer (i.e., a higher priority layer) corresponding to the row block to be preferentially decoded. Specifically, if a row block adjacent to the determined row block has a characteristic of being orthogonal or quasi-orthogonal to the row block, the receiver may perform decoding based on a layer including the corresponding row blocks. In addition, it is obvious that, even when sequential decoding is performed or reverse-order decoding is performed later, orthogonal or quasi-orthogonal row blocks constitute one layer so that layered decoding may be performed.

In addition, it is obvious that layered decoding including the at least two row blocks may be performed also in embodiments 3 to 6 described above. In addition, when at least one layer includes two or more row blocks, the orders or patterns of layered decoding may be defined to be sequences shorter than a total number of row blocks, and additional information on a row block, which is combined with a layer combined with multiple row blocks, may be requested.

The aforementioned layered decoding may be implemented in various ways, such as block parallel decoding and row-block parallel decoding (or row parallel decoding).

Here, block parallel decoding is a layered decoding scheme that is typically performed based on one block in a parity check matrix, that is, a circulant permutation matrix having a size of Z×Z. In addition, row block parallel decoding (or row parallel decoding) is a layered decoding scheme that is typically performed based on one row block. In the row block parallel decoding scheme, decoding is performed on all blocks (circulant permutation matrix) included in a layer including multiple row blocks or a given row block, so that the row block parallel decoding scheme may be viewed as an extension of the block parallel decoding scheme in a broad sense. In the row block parallel decoding scheme, implementation complexity may increase compared to the block parallel decoding scheme based on one block (circulant permutation matrix), but higher decoding information throughput may be supported.

Block parallel decoding may be performed based on one block (circulant permutation matrix) but, in general, may be performed based on multiple blocks. In addition, block parallel decoding may be performed base on a unit smaller than one block, in which case block parallel decoding may be performed generally based on a divisor of block size Z. In performing block parallel decoding, if a layered decoder is implemented based on multiple blocks, implementation complexity increases, but decoding information throughput also increases.

Operations of the receiver according to the embodiment of the disclosure are summarized as follows. A decoding method of a receiver in a communication system includes receiving a signal corresponding to an input bit transmitted from a transmitter, identifying the number of input bits, based on the signal, identifying a size of a code block, based on the number of the input bits, and performing layered decoding based on a parity check matrix corresponding to the size of the code block, wherein the layered decoding includes preferentially decoding a layer corresponding to at least one of degree-1 row blocks within a submatrix corresponding to a column block to be punctured. In addition, the layered decoding may be performed by combining various aforementioned embodiments of the disclosure.

In addition, a method of a receiver according to an embodiment of the disclosure also includes receiving a signal corresponding to an input bit transmitted from a receiver, identifying the number of input bits, based on the signal, identifying a size of a code block, based on the number of the input bits, and performing layered decoding based on a parity check matrix corresponding to the size of the code block, wherein the layered decoding is performed based on the following decoding orders or patterns.

Pattern 5-1:
 [42, 40, 26, 34, 37, 45, 30, 32, 22, 28, 38, 44, 41, 20, 27, 25, 31, 36, 39, 13, 33, 35, 24, 29, 43, 17, 23, 18, 21, 14, 6, 10, 16, 1, 4, 19, 7, 12, 15, 9, 5, 11, 8, 0, 2, 3]

Pattern 5-2:
 [22, 37, 40, 31, 24, 29, 20, 12, 27, 25, 28, 35, 38, 41, 32, 23, 34, 39, 17, 16, 36, 21, 33, 18, 15, 9, 14, 30, 11, 19, 6, 7, 8, 26, 10, 13, 1, 4, 5, 0, 2, 3].

A method of a receiver according to an embodiment of the disclosure includes receiving a signal corresponding to an input bit transmitted from a receiver, identifying the number of input bits, based on the signal, identifying a size of a code block, based on the number of the input bits, and performing layered decoding based on a base matrix of an LDPC code corresponding to a code rate and the number of input bits or a parity check matrix corresponding to the size of the code block, wherein the layered decoding is performed based on the following decoding orders or patterns based on a modulation order, a code rate, or the like.

Pattern 7-1: Sequence or Pattern for QPSK or 4QAM
 [37, 40, 29, 27, 25, 22, 31, 28, 36, 33, 32, 34, 24, 41, 38, 21, 20, 35, 18, 12, 23, 39, 17, 30, 16, 15, 9, 14, 7, 11, 19, 6, 8, 26, 13, 10, 1, 4, 5, 0, 2, 3]

Pattern 7-2: Sequence or Pattern for 16-QAM
 [37, 40, 29, 27, 25, 22, 31, 34, 28, 33, 36, 24, 21, 32, 39, 20, 41, 38, 35, 18, 12, 23, 17, 16, 30, 15, 9, 14, 6, 11, 7, 19, 10, 8, 26, 1, 4, 5, 13, 0, 2, 3]

Pattern 7-3: Sequence or Pattern for 64-QAM
 [37, 40, 33, 29, 25, 27, 32, 23, 22, 36, 31, 28, 24, 26, 34, 20, 18, 21, 39, 12, 41, 38, 35, 17, 30, 16, 14, 11, 15, 6, 7, 9, 19, 10, 8, 13, 1, 4, 5, 0, 2, 3]

Pattern 7-4: Sequence or Pattern for 256-QAM
 [40, 37, 33, 32, 30, 29, 28, 41, 27, 26, 25, 39, 23, 22, 24, 38, 36, 21, 20, 18, 12, 35, 31, 17, 15, 9, 14, 34, 16, 6, 11, 7, 19, 10, 8, 1, 4, 5, 13, 0, 2, 3]

Pattern 7-5: Sequence or Pattern for 1024-QAM
 [41, 40, 39, 38, 37, 36, 35, 34, 33, 32, 31, 30, 29, 28, 27, 26, 25, 24, 23, 22, 21, 20, 18, 15, 12, 17, 11, 9, 16, 14, 6, 7, 1, 19, 10, 13, 4, 8, 5, 0, 2, 3]

The modulation order may be determined by an MCS index, and the code rate may be determined by the MCS index or may be determined based on the number Er of bits actually transmitted via allocated resources. An effective code rate determined according to Er value may be used.

In the disclosure, the order or pattern for determining a layered decoding order may be determined and used based on each of the modulation order, the code rate (or the number of row blocks of the parity check matrix in use or the number of rows of the base matrix), or the base matrix (or parity check matrix) of the LDPC code, but the order or pattern may be determined based on two or more conditions. Embodiments of the disclosure may be applied independently of each other or in combination with each other in a hybrid manner, and when different decoding orders or patterns are applied according to each base matrix, modulation order, and code rate (or the number of row blocks in use), performance may be optimized but complexity may increase, so that the same pattern may be applied in some cases (i.e., if performance obtained from optimization is less than a loss caused by an increase in implementation complexity).

Various embodiments of the disclosure propose a device and a method for optimizing a relationship between the performance and delay of LPDC decoding in order to support a variable length and a variable code rate during layered decoding. Based on this, various embodiments of the disclosure may support performance optimization of LDPC encoding/decoding supporting various lengths and code rates.

In the drawings in which methods of the disclosure are described, the order of the description does not always correspond to the order in which steps of each method are performed, and the order relationship between the steps may be changed or the steps may be performed in parallel.

Alternatively, in the drawings in which methods of the disclosure are described, some elements may be omitted and only some elements may be included therein without departing from the essential spirit and scope of the disclosure.

Further, in the methods of the disclosure, some or all of the contents of each embodiment may be combined without departing from the essential spirit and scope of the disclosure.

Although various embodiments of the disclosure have been described, various changes and modifications may be presented to those skilled in the art. These changes and modifications are intended to fall within the appended claims. In addition, operations that are represented by different blocks for the convenience of description in the operation flowcharts of the disclosure may be implemented by a plurality of separate processors in an actual system, but it will be obvious that they may also be implemented by a single integrated processor.

The methods according to embodiments described in the claims or the specification of the disclosure may be implemented by hardware, software, or a combination of hardware and software.

When the methods are implemented by software, a computer-readable storage medium for storing one or more programs (software modules) may be provided. The one or more programs stored in the computer-readable storage medium may be configured for execution by one or more processors within the electronic device. The at least one program may include instructions that cause the electronic device to perform the methods according to various embodiments of the disclosure as defined by the appended claims and/or disclosed herein.

The programs (software modules or software) may be stored in nonvolatile memories including a random access memory and a flash memory, a read only memory (ROM), an electrically erasable programmable read only memory (EEPROM), a magnetic disc storage device, a compact disc-ROM (CD-ROM), digital versatile discs (DVDs), or other type optical storage devices, or a magnetic cassette. Alternatively, any combination of some or all of them may form a memory in which the program is stored. Further, a plurality of such memories may be included in the electronic device.

In addition, the programs may be stored in an attachable storage device which may access the electronic device through communication networks, such as the Internet, Intranet, local area network (LAN), wide LAN (WLAN), and storage area network (SAN) or a combination thereof. Such a storage device may access the electronic device via an external port. Further, a separate storage device on the communication network may access a portable electronic device.

In the above-described detailed embodiments of the disclosure, an element included in the disclosure is expressed in the singular or the plural according to presented detailed embodiments. However, the singular form or plural form is selected appropriately to the presented situation for the convenience of description, and the disclosure is not limited by elements expressed in the singular or the plural. Therefore, either an element expressed in the plural may also include a single element or an element expressed in the singular may also include multiple elements.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A decoding method in a wireless communication system, the method comprising:
- receiving a signal;
- identifying a size of a code block, based on a number of input bits of the signal;
- identifying a parity check matrix corresponding to the size of the code block;
- identifying a higher priority layer of the parity check matrix based on a degree of a layer within column blocks corresponding to punctured information word bits; and
- performing layered decoding based on the parity check matrix corresponding to the size of the code block,
- wherein the layered decoding is configured so that the higher priority layer is decoded preferentially over a layer other than the higher priority layer.

2. The method of claim 1,
- wherein the degree of the layer within column blocks corresponding to punctured information word bits is one of 1 or 0,
- wherein the identifying of the higher priority layer of the parity check matrix is further based on a degree of a check node, and
- wherein the performing of the layered decoding comprises:
  - decoding the higher priority layer; and
  - sequentially decoding layers corresponding to the remaining row blocks.

3. The method of claim 1, wherein the performing of the layered decoding comprises:
- identifying a number of effective row blocks in the parity check matrix;
- decoding the higher priority layer; and
- decoding layers corresponding to the remaining row blocks in a reverse order, based on the number of the effective row blocks.

4. The method of claim 3, wherein the number of the effective row blocks is identified based on the number of input bits of the signal, a number of column blocks used for information word transmission, a number of punctured column blocks of the parity check matrix, and the size of the code block.

5. The method of claim 1, wherein the identifying of the higher priority layer is further based on a code rate for the decoding and a reference code rate.

6. The method of claim 1,
- wherein the layered decoding is further based on a decoding order predetermined based on a base matrix of the parity check matrix, and
- wherein the decoding order is determined based on a transport block size, a number of higher priority layers, and a code rate.

7. The method of claim 6,
- wherein the decoding order is configured to be:
  - in case that the parity check matrix is based on a first base graph (base graph #1), [42, 40, 26, 34, 37, 45, 30, 32, 22, 28, 38, 44, 41, 20, 27, 25, 31, 36, 39, 13, 33, 35, 24, 29, 43, 17, 23, 18, 21, 14, 6, 10, 16, 1, 4, 19, 7, 12, 15, 9, 5, 11, 8, 0, 2, 3]; or
  - in case that the parity check matrix is based on a second base graph (base graph #2), [22, 37, 40, 31, 24, 29, 20, 12, 27, 25, 28, 35, 38, 41, 32, 23, 34, 39, 17, 16, 36, 21, 33, 18, 15, 9, 14, 30, 11, 19, 6, 7, 8, 26, 10, 13, 1, 4, 5, 0, 2, 3], and
- wherein respective entries refer to numbers of row blocks of the parity check matrix.

8. The method of claim 6, wherein the layered decoding is further based on the decoding order based on an index of an effective row block from among indexes of row blocks included in the decoding order.

9. The method of claim 6,
- wherein the decoding order varies depending on a modulation scheme applied to the signal, and
- wherein the modulation scheme is one of quadrature phase shift keying (QPSK), 16 quadrature amplitude modulation (QAM), 64 QAM, 256 QAM, and 1024 QAM.

10. A device in a wireless communication system, the device comprising:
- a transceiver;
- a controller coupled with the transceiver; and
- memory storing instructions that, when executed by the controller, cause the device to:
  - receive a signal,
  - identify a size of a code block, based on a number of input bits of the signal,
  - identify a parity check matrix corresponding to the size of the code block,
  - identify a higher priority layer of the parity check matrix based on a degree of a layer within column blocks corresponding to punctured information word bits, and
  - perform layered decoding based on the parity check matrix corresponding to the size of the code block,
- wherein the layered decoding is configured so that the higher priority layer is decoded preferentially over a layer other than the higher priority layer.

11. The device of claim 10,
- wherein the degree of the layer within column blocks corresponding to punctured information word bits is one of 1 or 0,
- wherein the identifying of the higher priority layer of the parity check matrix is further based on a degree of a check node, and
- wherein the memory further comprises the instructions that, when executed by the controller, cause the device to:
  - decode the higher priority layer, and
  - sequentially decode layers corresponding to the remaining row blocks.

* * * * *